United States Patent

Tsukamoto et al.

Patent Number: 5,943,280
Date of Patent: Aug. 24, 1999

[54] SEMICONDUCTOR MEMORY DEVICE WHICH CAN BE TESTED WHILE SELECTING WORD LINES SUCCESSIVELY AT HIGH SPEED

[75] Inventors: Yukihiro Tsukamoto; Koji Kimura; Masaki Nishimoto; Masayuki Kasamoto; Naotaka Okada; Kazuhisa Uetsuki; Masakatsu Murakami; Shigekazu Aoki; Zengcheng Tian; Shin Sekiya; Akihiro Shirai, all of Hyogo, Japan

[73] Assignee: Mitsubishi Denki Kabushiki Kaisha, Tokyo, Japan

[21] Appl. No.: 09/010,827

[22] Filed: Jan. 22, 1998

[30] Foreign Application Priority Data

Jul. 16, 1997 [JP] Japan ............... 9-191457 (P)

[51] Int. Cl.$^6$ ....................................... G11C 7/00
[52] U.S. Cl. ......................... 365/222; 365/233
[58] Field of Search ............... 365/222, 230.09, 365/193, 233, 201

[56] References Cited

U.S. PATENT DOCUMENTS 4,985,868  1/1991  Nakano et al. ................. 365/222
5,717,652  2/1998  Ooishi ............................. 365/233
5,751,655  5/1998  Yamazaki et al. .............. 365/233
5,805,508  9/1998  Tobita ........................... 365/189.09

FOREIGN PATENT DOCUMENTS 4-114400  4/1992  Japan.
5-342862  12/1993  Japan.

Primary Examiner—David Nelms
Assistant Examiner—Anh Phung
Attorney, Agent, or Firm—McDermott, Will & Emery

[57] ABSTRACT

When a special operation mode is instructed, a test oscillation circuit operating at a cycle shorter than a refresh oscillation circuit specifying the cycle of self refresh is activated according to an external row address strobe signal. The internal row address strobe signal is provided to row related control circuitry via a selector. An internal row address strobe signal can be rendered active at a cycle shorter than the cycle of the external row address strobe signal, to carry out row selection. A row is selected at a cycle shorter than the transition cycle of an external signal.

15 Claims, 39 Drawing Sheets

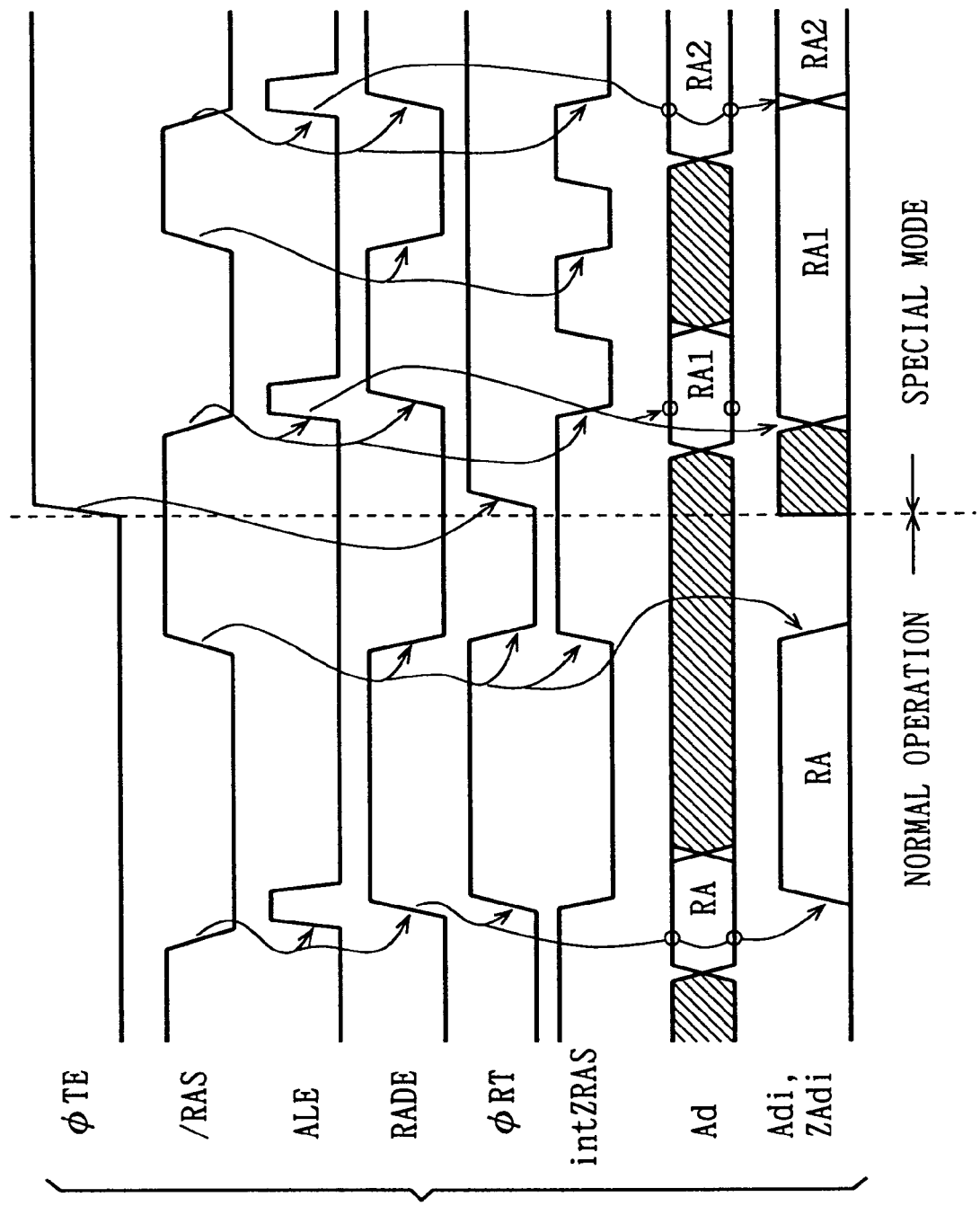
F I G. 2 7

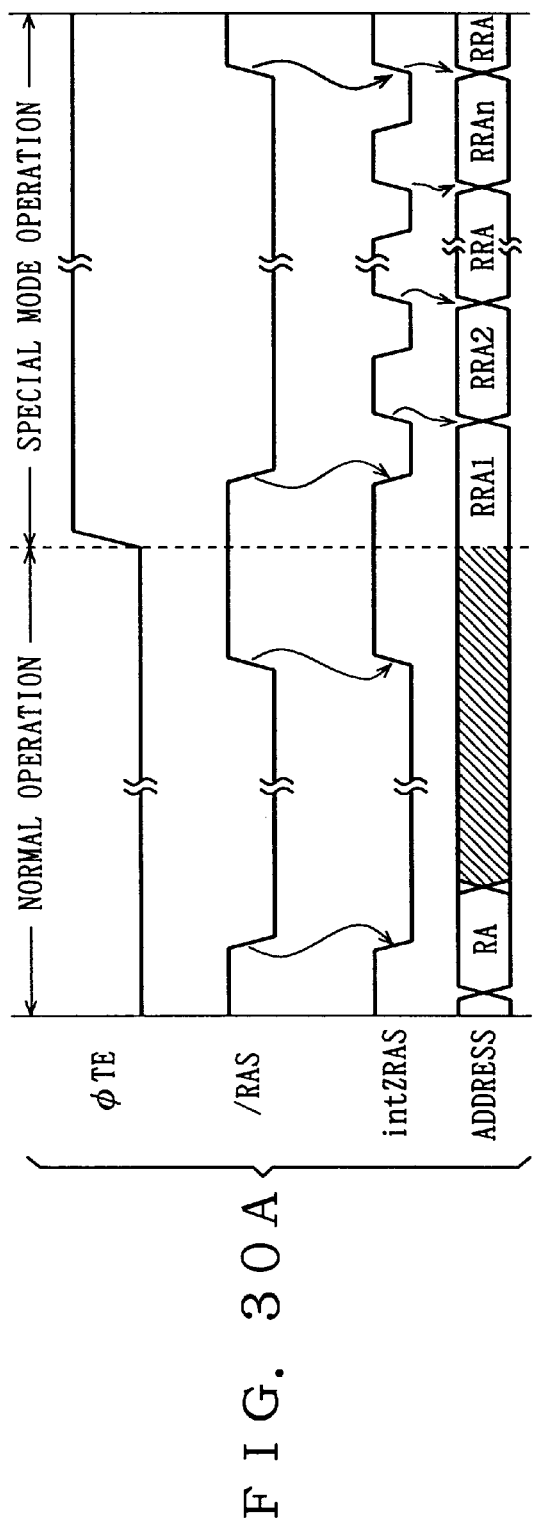
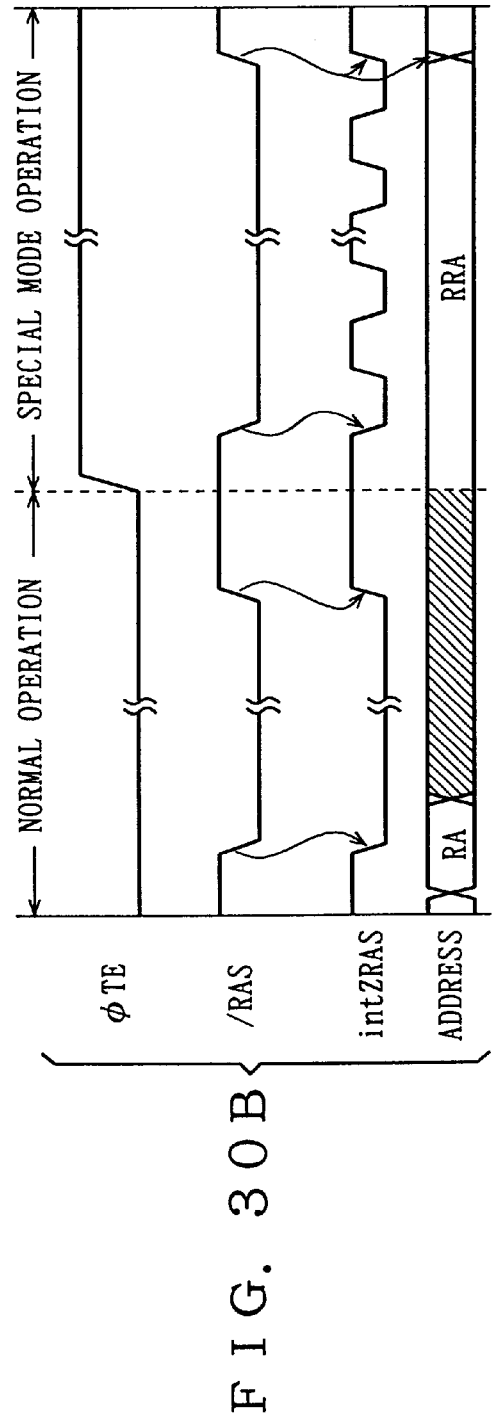
F I G. 30A
F I G. 30B

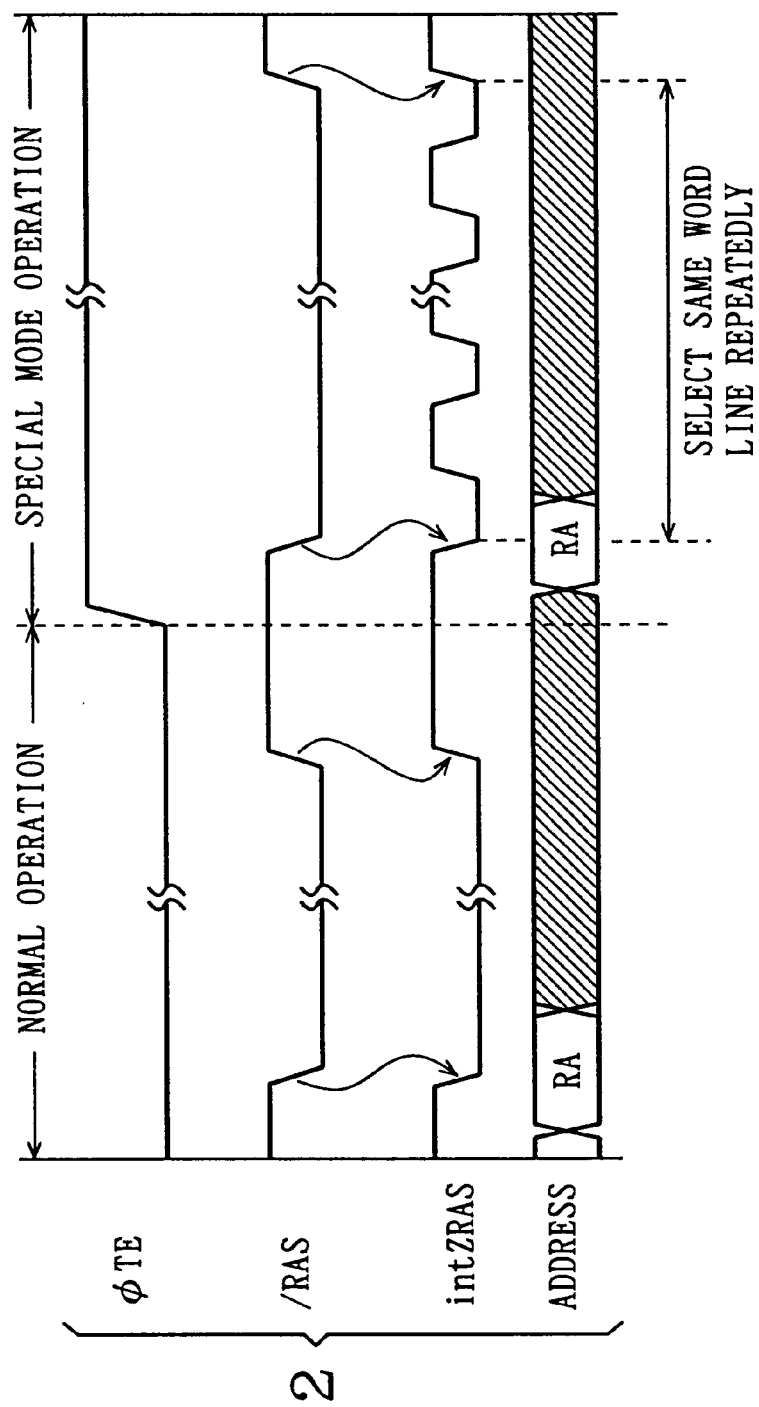
F I G. 3 2

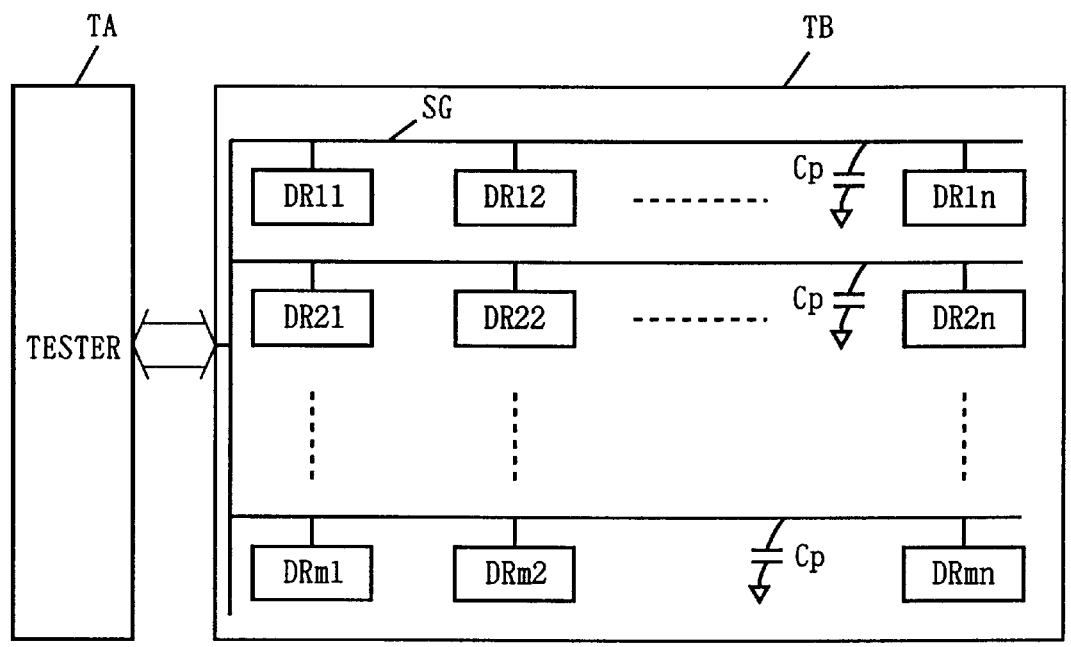
F I G. 4 4  PRIOR ART 5,943,280

SEMICONDUCTOR MEMORY DEVICE WHICH CAN BE TESTED WHILE SELECTING WORD LINES SUCCESSIVELY AT HIGH SPEED

BACKGROUND OF THE INVENTION

1. Field of the Invention

The present invention relates to semiconductor memory devices, and particularly to circuitry for carrying out row selection internally at high speed in a special operation mode. More particularly, the present invention relates to a configuration for testing data retentionability of a memory cell in a dynamic semiconductor memory device.

2. Description of the Background Art

FIG. 37 schematically shows an entire structure of a conventional dynamic semiconductor memory device. This dynamic semiconductor memory device is a memory device in which the data in a memory cell is refreshed periodically. The dynamic semiconductor memory device can be any of a virtual static random access memory (VSRAM), a pseudo static random access memory (PSRAM), and a dynamic random access memory (DRAM). In FIG. 37, a structure of a dynamic random access memory is shown by way of example.

Referring to FIG. 37, the dynamic semiconductor memory device 1 includes a control circuit 6 receiving external control signals provided via external control signal input terminals (nodes) 2–5, i.e., a write enable signal /W, an output enable signal /OE, a row address strobe signal /RAS, and a column address strobe signal /CAS for generating an internal control signal, a memory array 7 with a plurality of dynamic type memory cells arranged in a matrix, an address buffer 9 receiving external address signal (bits) A0-Ai applied via address signal input terminals (nodes) 8 for generating an internal row address signal and an internal column address signal under control of control circuit 6, an internal address generation circuit 10 for generating a refresh row address signal that specifies a row to be refreshed in a refresh operation under control of control circuit 6, a multiplexer 11 for selectively and alternatively passing the address signals from address buffer 9 and internal address generation circuit 10 under control of control circuit 6, and a row decoder 12 activated under control of control circuit 6 for decoding an internal row address signal provided from multiplexer 11 to select an addressed row (word line) of memory array 7.

Signal /W instructs data writing when active (L level). Signal /OE instructs data output when active, to render an output buffer that will be described later operable. Row address strobe signal /RAS designates that an access to the semiconductor memory device is to be effected. Row address strobe signal /RAS initiates an internal operation of the DRAM and determines the active period of the internal operation. When row address strobe signal /RAS is active, circuitry related to the operation of selecting a row in memory array 7 (row related circuitry) such as row decoder 12 and the like is rendered active. Column address strobe signal /CAS renders circuitry related to selecting a column in memory array 7 active.

Semiconductor memory device 1 further includes a column decoder 13 activated, under control of control circuit 6, for decoding an internal column address signal from address buffer 9 to generate a column select signal to select a column in memory array 7, a sense amplifier for sensing and amplifying data of memory cells connected to a selected row in memory array 7, an IO gate responsive to the column select signal from column decoder 13 for connecting the selected column in memory array 7 to an internal data bus a1, an input buffer 15 for generating and transmitting to internal data bus a1 the internal write data from external write data DQ0-DQj provided to a data input/output terminal 17 in data writing, under control of control circuit 6, and an output buffer 16 for generating and providing to data input/output terminal 17 external read data DQ0-DQj from internal read data read out to internal data bus a1 in data reading, under control of control circuit 6. In FIG. 37, the sense amplifier and the IO gate are indicated as one block 14.

Input buffer 15 is activated when signals /W and /CAS both attain an active state of an L level to generate internal write data. Output buffer 16 is rendered active according to activation of output enable signal /OE.

FIG. 38 schematically shows an internal structure of memory array 7 shown in FIG. 37.

Referring to FIG. 38, memory array 7 includes a plurality of word lines WL arranged corresponding to respective rows of memory cells and having the memory cells of corresponding rows connected thereto, and a plurality of bit line pairs BL, /BL arranged corresponding to respective columns of memory cells and having the memory cells of corresponding columns connected thereto. In FIG. 38, word lines WL0, WL(l−1), word lines WL1 and WL(l+1), and a pair of bit lines BL, /BL are representatively shown.

A memory cell is provided corresponding to a crossing of a pair of bit lines and a word line. In FIG. 38, a memory cell MCa arranged corresponding to the crossing of word line WL(l−1) and bit line /BL, a memory cell MCb arranged corresponding to the crossing between word line WL1 and bit line BL, and a memory cell MCc arranged corresponding to the crossing of word line WL(l+1) and bit line /BL are representatively shown. Each of memory cells MCa–MCc includes a capacitor 23 storing information in the form of charges, and an access transistor 22 rendered conductive in response to a signal potential on a corresponding word line, for electrically connecting a corresponding bit line (BL or /BL) and capacitor 23. Access transistor 22 is formed of an n channel MOS (insulation gate field effect) transistor.

A row select signal from row decoder 12 is transmitted to word line WL (generically referring to WL0-WL(l+1)). The sense amplifier in block 14 includes a sense amplifier circuit arranged corresponding to a bit line pair BL, /BL for differentially amplifying the potential of the corresponding bit line pair BL and /BL. Row decoder 12 and the sense amplifier are sequentially rendered active according to activation of row address strobe signal /RAS. The operation of the semiconductor memory device of FIGS. 37 and 38 will be described with reference to the waveform diagram of FIG. 39. The operational waveform for data reading is shown by way of example in FIG. 39.

When row address strobe signal /RAS attains an inactive state of a high (H) level, semiconductor memory device 1 attains a standby state. Under this state, all the row select signals from row decoder 12 are in an inactive state, and the potential of word line WL is at a nonselected state of a low level. Bit lines BL and /BL are precharged to a predetermined potential (for example, Vcc/2:Vcc is an operating power supply voltage) by a precharge/equalize circuit not shown.

When row address strobe signal /RAS attains an active state of a low level, the memory cycle begins and a row select operation is initiated. Prior to initiation of this row select operation, the precharge operation of bit lines BL and /BL is ceased, whereby bit lines BL and /BL attain a floating state at the precharge potential.

Address buffer 9 responds to a control signal applied via a control signal bus a3 from control circuit 6 to take in external address signals A0-Ai provided via an address signal input terminals (node) 8 for providing an internal row address signal on an internal address bus a4. In FIG. 37, internal address bus a4 is shown having a width of (i+1) bits. However, address buffer 9 normally provides a pair of complementary address signals, so that the bit width of internal address bus a4 is 2·(i+1).

Multiplexer 11 selects and provides to row decoder 12 an internal row address signal provided from address buffer 9 under control of control circuit 6 in a normal operation mode in which data writing/reading is carried out. Row decoder 12 decodes the applied internal row address signal and provides a row select signal of an active state to the addressed word line in memory array 7. As a result, the potential of the selected word line WL is driven to a high level.

It is now assumed that word line WL1 is selected. Access transistor 22 of memory cell MC*b* is turned on, whereby capacitor 23 is connected to bit line BL. When memory cell MC*b* stores data of a high level, the potential of bit line BL slightly increases as shown in FIG. 39. In contrast, bit line /BL maintains the precharge potential since no memory cell is connected thereto. Then, the sense amplifier circuit in block 14 is activated to amplify the potential of bit lines BL and /BL differentially. The potential of bit line BL to which data of high level is read out increases to the level of the operating power supply voltage Vcc, whereas the potential of bit line /BL is discharged to the low (L) level of a ground potential.

When column address strobe signal /CAS attains an active state of a low level, address buffer 9 takes in internal address signals A0-Ai applied to address signal input terminals (node) 8 as a column address signal to generate an internal column address signal onto internal address bus a4 under control of control circuit 6. After the sense amplifier circuit is activated and the potential of bit lines BL and /BL is ascertained, column decoder 13 is rendered active under control of control circuit 6 to decode the internal column address signal from address buffer 9 to generate and output a column select signal.

In response to this column select signal, the IO gate (provided corresponding to each bit line pair) in block 14 is turned on, whereby the bit line pair provided corresponding to the column specified by the column select signal is connected to internal data bus a1 via the IO gate circuit rendered active. In reading out data, output enable signal /OE attains an active state of a low level. In response, output buffer 16 is rendered active under control of control circuit 6. External read data is generated from the internal read data on internal data bus a1. The generated external read data is transmitted to data input/output terminals 17. In data reading, write enable signal /W is maintained at an inactive state of a high level (indicated by the broken line in FIG. 39). In data writing, the timing of transmitting internal write data on internal data bus a1 is determined by the timing of signals /W and /CAS both being active.

Word lines WL are formed parallel to each other at the same interconnection layer, and are electrically isolated by an insulation film from each other. Therefore, parasitic capacitance is present between word lines as shown in FIG. 38. In FIG. 38, parasitic capacitance 25*a* between word lines WL(l−1) and WLl, and parasitic capacitance 25*b* between word lines WLl and WL(l+1) are representatively shown. This parasitic capacitance is present, not only between adjacent word lines, but also between remote word lines.

Bit lines BL and /BL and word line WL are formed in a direction crossing each other in different interconnection layers. Therefore, parasitic capacitance is present between a word line and a bit line at the crossing portion thereof via an interlayer insulation film. In FIG. 38, parasitic capacitance 26 between bit line BL and word line WL(l−1) is typically shown. The function of parasitic capacitances 25*a* and 25*b*, and 26 will now be described.

FIG. 40 shows in detail the distribution of the parasitic capacitances between word lines and between a word line and a bit line. Two word lines WL*a* and WL*b*, and a pair of bit lines BL and /BL are shown in FIG. 40. A memory cell MC*d* is provided corresponding to the crossing between bit line BL and word line WL*a*. A memory cell MC*e* is provided corresponding to the crossing between bit line /Bl and word line WL*b*. A constant reference voltage Vcp (generally, the voltage level of Vcc/2) is applied to one electrode of capacitor 23 in each of memory cells MC*d* and MC*e*.

There is parasitic capacitance 25*c* between word line WL*a* and word line WL*b*. There is parasitic capacitance 25*d* between word line WL*a* and a word line not shown. There is parasitic capacitance 25*e* between word line WL*b* and a word line not shown. There is parasitic capacitance 26*a* between word line WL*a* and bit line BL. There is parasitic capacitance 26*b* between bit line BL and word line WL*b*. Also, there are parasitic capacitances 26*c* and 26*d* between bit line /BL and word line WL*a*, and between bit line /BL and word line WL*b*, respectively.

The sense amplifier circuit provided corresponding to each respective bit line pair includes a P sense amplifier 27 activated in response to a sense amplifier activation signal φSP to charge one of bit lines BL and /BL at the higher potential to the level of operating power supply voltage, and an N sense amplifier 28 activated in response to activation of a sense amplifier activation signal φSN to discharge one of bit lines BL and /BL at the lower potential to the level of the ground potential.

The function of the parasitic capacitance of FIG. 4 will be described with reference to the operation waveform diagram of FIG. 41. FIG. 41 illustrates an operation when word line WL*a* is selected and memory cell MC*d* stores data of a high level (Vcc level).

When word line WL*a* is selected, the potential thereof increases. This potential increase of selected word line WL*a* is transmitted to word line WL*b* by the capacitive coupling through parasitic capacitance 25*c*. As a result, the potential of word line WL*b* slightly increases. FIG. 41 shows that the potential increase in nonselected word line WL*b* through the capacitive coupling causes ringing. This ringing is generated by the word driver provided corresponding to each word line in row decoder 12, maintaining the potential level of the nonselected word line at the low level of the ground voltage.

When the potential of selected word line WL*a* increases, access transistor 22 in memory cell MC*d* is turned on. The charge stored in capacitor 23 is transmitted to bit line BL. The potential of bit line BL is increased by ΔR. When the read out voltage ΔR on bit line BL attains a sufficient level, sense amplifier activation signals φSN and φSP are activated. In general, sense amplifier activation signal φSN is first activated to enable N sense amplifier 28, whereby the potential of bit line /BL in a floating state at the level of precharge potential is discharged to the level of the ground potential. Then, sense amplifier activation signal φSP is activated to enable P sense amplifier 27, whereby the potential of bit line BL is charged to the level of operating power supply voltage Vcc. The potential of nonselected word line WL*b* is raised by the capacitive coupling of parasitic capacitance 26*b* upon the potential increase of bit line BL. In operation of N sense amplifier 28, nonselected word line WL*b* is already at the level of the ground potential when the potential of bit line /BL is discharged to the level of the ground potential. In the case of the capacitive coupling between bit line /BL and nonselected word line WL*b*, the access transistor of nonselected memory cell MC*e* enters deeper off-state, and the waveform of the resultant undershooting is not illustrated since such a deep off-state is not particularly related to "disturb" that will be described later.

When one memory cycle is completed and the potential of selected word line WL*a* is driven from a high level to a low level, the potential of word line WL*b* is reduced via the capacitive coupling of parasitic capacitance 25*c*. Also, the potential of bit line /BL that has been discharged to the level of ground potential by N sense amplifier 28 is reduced via parasitic capacitance 26*c*.

The aforementioned potential floating-up of nonselected word line WL*b* will change the amount of charges stored in capacitor 23 of nonselected memory cell MC*e* as will be described in detail to alter the stored data in the memory cell. This problem of "disturb" will now be described with reference to FIGS. 42A–42C.

Referring to FIG. 42A, when the potential of nonselected word line WL*b* increases at the rise of the potential of selected word line WL*a* (point A in FIG. 41), access transistor 22 is slightly turned on to cause charge Q to flow from capacitor 23 to bit line /BL if data of a high level (Vcc) is stored in capacitor 23 of the memory cell connected to nonselected word line WL*b*. This rise ΔV1 of nonselected word line WL*b* does not have to be greater than the threshold voltage of access transistor 22. Even when the potential of nonselected word line WL*b* increases approximately to the level of the threshold voltage of access transistor 22, charge Q flows from capacitor 23 to bit line /BL since the sub-threshold current increases.

Referring to FIG. 42B, when P sense amplifier 27 operates and the potential of bit line BL is increased to cause the potential of nonselected word line WL*b* to rise by parasitic capacitance 26*b*, the potential of bit line /BL attains the level of ground potential Vss. Charge Q of a high level (Vcc level) stored in capacitor 23 of the memory cell flows towards bit line /BL.

Referring to FIG. 42C, when the potential of bit line /BL is reduced to the level of a negative potential −ΔVb by parasitic capacitance 26*c* of FIG. 40 (the parasitic capacitance between word line WL*a* and bit line /BL) at the transition of selected word line WL*a* to a nonselected state, charge Q of the high level data stored in capacitor 23 is discharged towards bit line /BL when the potential of nonselected word line WL*b* attains the level of ground potential Vss or negative potential −ΔVa.

This flow of the stored charge occurs not only in data reading, but also in data writing. In other words, the charge flows out when the word line is selected or when the sense amplifier operates.

When data of a low level is stored in memory capacitor 23, the node connected to capacitor 23 functions as the source of the access transistor. The capacitance of memory capacitor 23 is sufficiently smaller than the capacitances of bit lines BL and /BL. Thus, the potential of memory capacitor 23 rises in response to only a small amount of charge flowing in, to make the potentials of the gate and source of access transistor 22 substantially equal to each other. As a result, the charge flow via the access transistor is ceased. Therefore, the increase of the amount of charge in memory capacitor 23 storing data of a low level will have its upper limit restricted.

When data of a high level is stored, charge flows out from a memory cell capacitor to a corresponding bit line to lower the potential of the memory cell capacitor every word line select operation, as shown in FIG. 43. In FIG. 43, the change in potential of word line WL(l) when word lines WL(l−1), WL(l+1), WL(l+2), . . . are sequentially selected is shown. In general, the memory cell capacitor has its capacitance value so set as to include a margin for charge leakage during operation. However, when the capacitance of the memory cell capacitor is reduced due to variation in the manufacturing parameters (film thickness of the capacitor insulation film, the facing area of capacitor electrodes, and the like), the potential of the storage node of the capacitor (the electrode node coupled to the bit line) is reduced in response to a slight flow out of charge. This causes the problem that the stored data is inverted.

Assuming that the capacitance value of memory cell 23 is C, and the stored charge amount is Q, the following equation can be obtained, provided that cell plate potential Vcp is Vcc/2.

$$Q = C \cdot Vcc/2$$

Assuming that the leakage charge amount per charge leakage is ΔQ, the change ΔV of the electrode potential of the capacitor is obtained by the following equation.

$$\Delta Q = C \cdot \Delta V$$

Therefore, when the capacitance C of capacitor 23 becomes smaller, the potential change ΔV becomes greater even when the flowing-out amount of charge ΔQ is identical. Thus, the potential of the capacitor electrode of a defective cell that has a small capacitance is reduced more than the change in the capacitor electrode potential of a normal memory cell (indicated by broken line). The test to detect the presence of such a defective cell is called "disturb" test.

In this disturb test, a word line other than the word line that is connected to the memory cell of interest is selected for a predetermined number of times (number of disturbance times) to identify whether the data of the memory cell of interest is correctly retained or not. In such a disturb test, disturb testing is carried out simultaneously for a great number of semiconductor memory devices.

FIG. 44 schematically shows a structure for carrying out disturb testing. In FIG. 44, a plurality of semiconductor memory devices DR11–DRmn are mounted on a test board TB. FIG. 44 illustrates the case where semiconductor memory devices DR11–DRmn are arranged in m rows and n columns on test board TB. Semiconductor memory devices DR11–DRmn are connected to each other via a signal bus SG. Test board TB is connected to a tester TA. A signal necessary for the testing operation is applied from tester TA to signal bus SG. In the testing operation, semiconductor memory devices DR11–DRmn are simultaneously subjected to the disturb testing. First, data of a high level is written into semiconductor memory devices DR11–DRmn. Then, a row address strobe signal /RAS and an address signal are provided to signal bus SG from tester TA. A word line select operation and a sense amplifier circuit operation are carried out in semiconductor memory devices DR11–DRmn. By repeating this word line select operation for a predetermined number of times, word line WL connected to memory cells is affected by the noise, and charge leaks out from the memory cell capacitor. After selecting each word line and activating the sense amplifier circuit for a predetermined number of times, determination is made whether the data stored in semiconductor memory devices DR11–DRmn maintains the high level or not. This data determination operation is carried out by tester TA.

The number of word lines in a semiconductor memory device increases as the memory capacity becomes greater. Therefore, there is a problem that the disturb test of driving respective word lines sequentially into a selected state is time consuming. In order to reduce the testing time, an approach of altering row address strobe signal /RAS transmitted from tester TA to signal bus SG shown in FIG. 44 at high speed to reduce the selected time period of a word line can be conceived. However, a great number of semiconductor memory devices DR11–DRmn are connected to signal line SG, and there is a great parasitic capacitance Cp as shown in FIG. 44 at signal bus SG. Therefore, signal propagation is delayed due to the interconnection resistance and the great parasitic capacitance CP at signal bus SG. The required signal cannot be altered at high speed.

FIGS. 45A–45B show examples of the transition of row address strobe signal /RAS and an address signal on signal bus SG. FIG. 45 shows the ideal signal waveform on signal bus SG. FIG. 45B shows the signal waveform on signal bus SG in a conventional disturb test. As shown in FIG. 45A, row address strobe signal /RAS is altered at the predetermined rising time and falling time without the effect of the signal propagation delay. An address signal is required of a set up time Ts and a hold time Th with respect to signal /RAS. Set up time Ts is required to properly take in an address signal by holding the address signal at a definite state before the fall of signal /RAS. Hold time Th is required to reliably take in an address signal by maintaining the address signal at an definite state after signal /RAS falls.

When parasitic capacitance Cp of signal bus SG is great, the rising and falling times of row address strobe signal /RAS become longer due to the signal propagation delay on signal bus SG as shown in FIG. 45B. Therefore, the signal transition cannot be effected speedily. The transition speed of an address signal is similarly slowed down (address bus is similarly connected to semiconductor memory devices DR11–DRmn from tester TA). In order to ensure an address set up time Ts, the address signal must be altered at a timing faster than the address signal transition timing of the ideal waveform (FIG. 45A). Since the address signal is also altered when row address strobe signal /RAS attains a high level of an inactive state, the time period of the inactive state of row address strobe signal /RAS becomes longer than that of the ideal waveform. As a result, the time of one cycle (word line select cycle) of the disturb test becomes longer, and the word lines cannot sequentially be driven to a selected state at high speed, so that the disturb test time cannot be reduced.

The problem of not being able to drive word lines sequentially into a selected state speedily in the test operation is also encountered in an acceleration test such as the "burn-in" test. In this burn-in test, the semiconductor memory device is operated under the condition of a high temperature and a high voltage. Any potential initial defect such as gate insulation film defect or an interlayer insulation film defect between interconnections of an MOS transistor which is a constituent element, interconnection line fault, and defects caused by particles mixed during the fabrication process is made revealing to eliminate any faulty products before shipment. In the above acceleration test such as a burn-in test, only the operational conditions are modified in the semiconductor memory device. An operation similar to a normal mode operation is carried out according to a control signal provided from an external tester. Since the word lines are sequentially selected even in such an acceleration test, the problem of not being able to reduce the testing time is encountered. This problem is also encountered in life time testing and the like.

The specification values for the operating conditions and the like differ for each type (family) of the semiconductor memory device. A different design rule provides a different pitch of the word lines and a different capacitance value of the memory capacitor. Also, the degree of the rise of the word line potential and the amount of potential change of the memory capacitor differ in a different design rule. Therefore, the word line select cycle period (the period in which a word line is in a selected state) and the number of times where a word line is selected must be changed according to the type (family member) of the semiconductor memory device. This modification in the test condition requires that the program for operating the tester be modified, and the test condition cannot be modified flexibly and easily depending on the type of the semiconductor memory device to be tested.

A dynamic random access memory directed to carrying out word line selection speedily in a test operation is disclosed, for example, in Japanese Patent Laying-Open No. 5-342862. In this dynamic random access memory, an oscillator that oscillates at a cycle shorter than the self refresh cycle is activated in the test mode to drive a refresh address counter by an output signal from the oscillator. Word line selection/memory cell data refresh is carried out at a cycle shorter than the self refresh cycle to reduce the time required for the testing of whether the refresh counter operates properly or not. According to this prior art, only the oscillation cycle of the oscillator defining the self refresh cycle in the self refresh control circuit is modified. The refresh address is generated internally, and external designation of a select word line cannot be effected. The period of time in which the word line is maintained at a selected state is identical to that in a self refresh operation. This period of time cannot be modified. The degree of the potential rise of the nonselected word line is proportional to the period of time where the selected word line is placed in a selected state. This is because the amount of charge migration upon the capacitive coupling is proportional to the period of time where the selected word line is placed in a selected state. Therefore, although it is possible to determine whether the refresh counter operates properly in a short time, it is not possible to select a word line under various conditions to carry out disturb testing in the prior art. In this disturb testing, a word line select period cannot be controlled by an external signal.

An integrated circuit that can automatically carry out a test operation using an incorporated test circuit is disclosed in Japanese Patent Laying-Open No. 4-114400. In this prior art, a built-in oscillator is activated in a test mode. The incorporated test circuit is activated with the output signal of the oscillator as an internal row address strobe signal, to carry out testing. The oscillating cycle of this oscillator is constant, and the cycle cannot be modified from an external source. Also, the internal test is carried out autonomously inside the incorporated test circuit. It is not possible to externally identify which word line is driven to a selected state. Also, the time period of selecting a word line cannot be controlled by an external control signal.

SUMMARY OF THE INVENTION

An object of the present invention is to provide a semiconductor memory device that can sequentially select word lines at high speed under control of an external signal.

Another object of the present invention is to provide a semiconductor memory device that can have a word line select period controlled according to an external signal.

A further object of the present invention is to provide a semiconductor memory device that can have is internal test progressing status easily identified externally.

A semiconductor memory device of the present invention includes a circuit for generating an internal row select designating signal according to at least one externally applied control signal when a special operation mode designating signal is activated, and row related circuitry activated in response to activation of the row select designating signal for carrying out an operation related at least to row selection of a plurality of memory cells.

When a special operation mode is specified, an internal row select designating signal of a desired time width can be generated according to an external signal to carry out a row select operation. Therefore, row selection can be carried out without being fixed to the cycle of self refresh. The number of times of word line select operations and the word line select time period can be easily modified under external control. For example, a disturb test can be executed with the condition modified easily.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 27 is a signal waveform diagram representing an operation of the address buffer of FIG. 26.

FIGS. 30A and 30B are signal waveform diagrams of an operation of the semiconductor memory device of FIG. 28.

FIG. 32 is a signal waveform diagram representing an operation of a semiconductor memory device according to a ninth embodiment of the present invention.

FIG. 44 shows an example of a conventional arrangement for carrying out the disturb test.

DESCRIPTION OF THE PREFERRED EMBODIMENTS

First Embodiment

Figure 1:
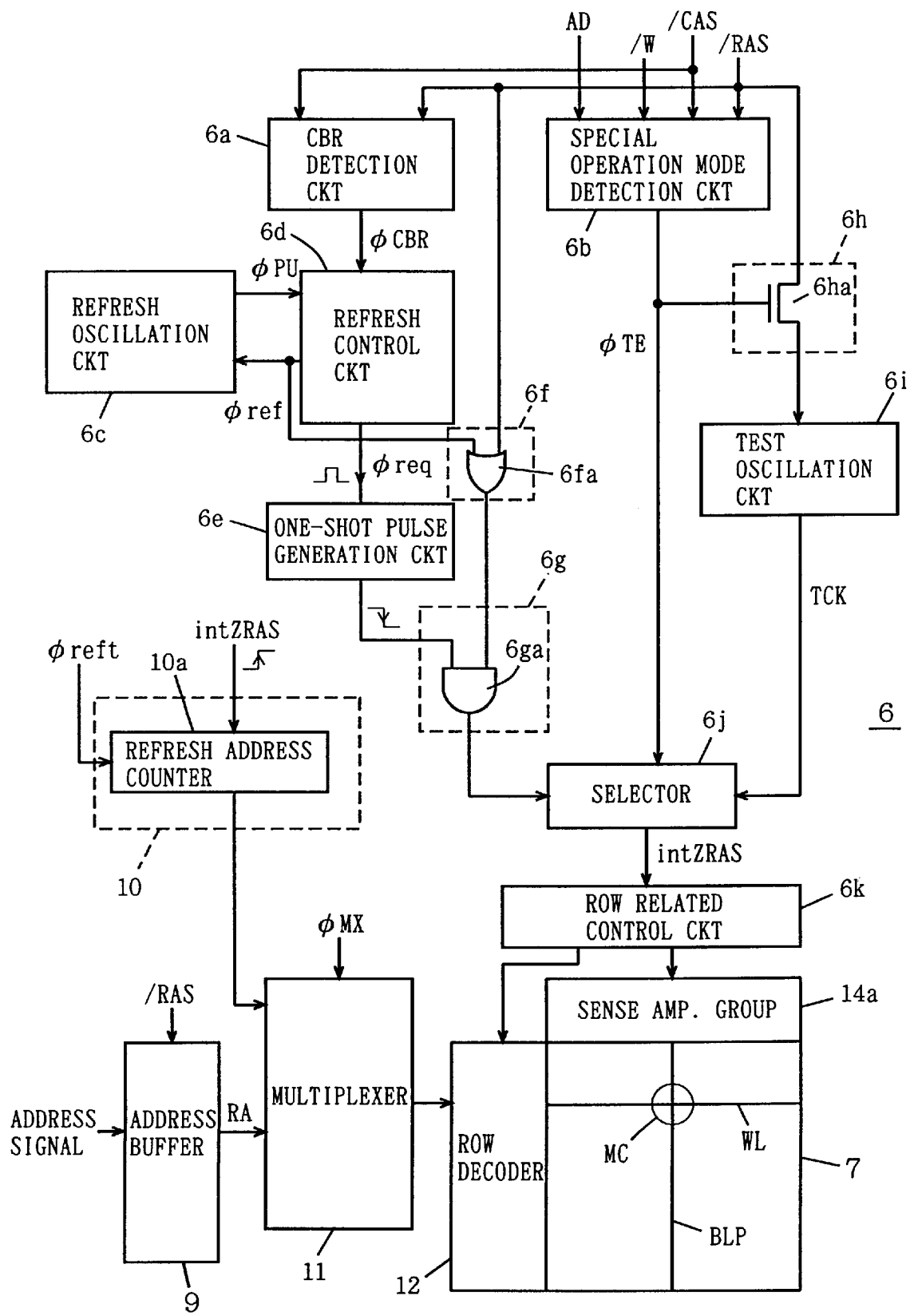
FIG. 1 schematically shows an entire structure of a semiconductor memory device according to a first embodiment of the present invention.
Figure 37:
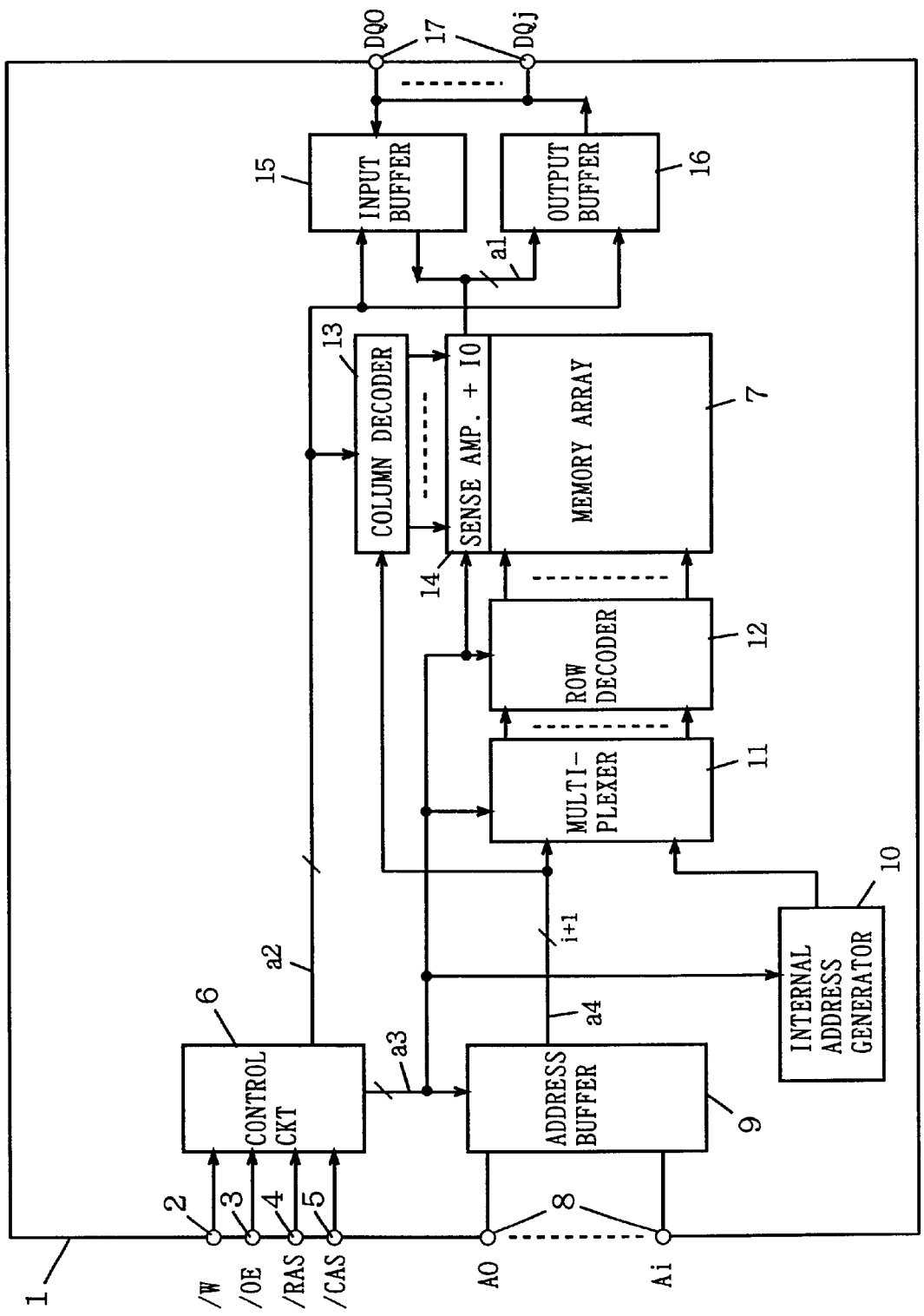
FIG. 37 schematically shows an entire structure of a conventional semiconductor memory device.
Figure 38:
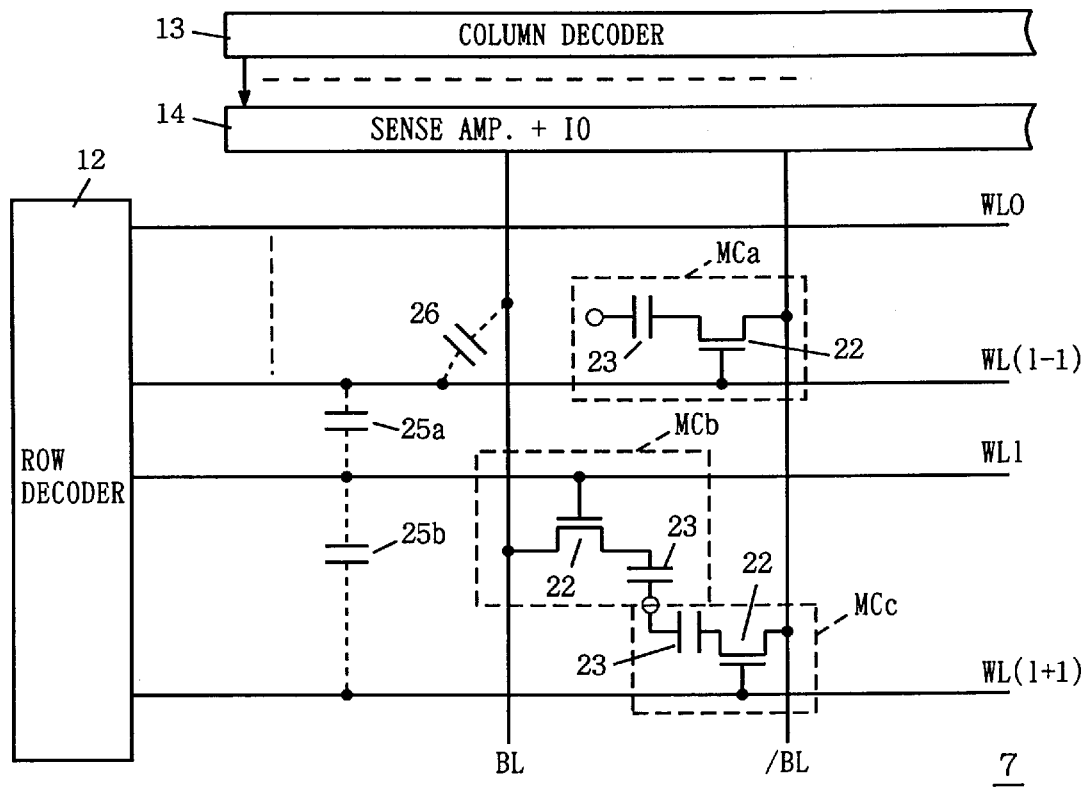
FIG. 38 shows a structure of the memory array unit of FIG. 37.
Figure 39:
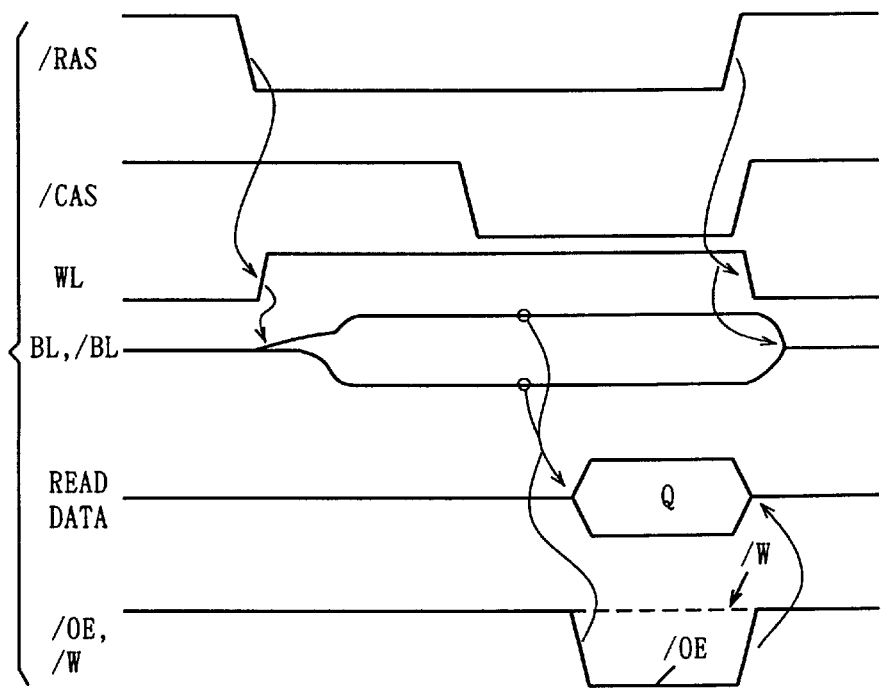
FIG. 39 is a signal waveform diagram representing an operation of a conventional semiconductor memory device.
Figure 40:
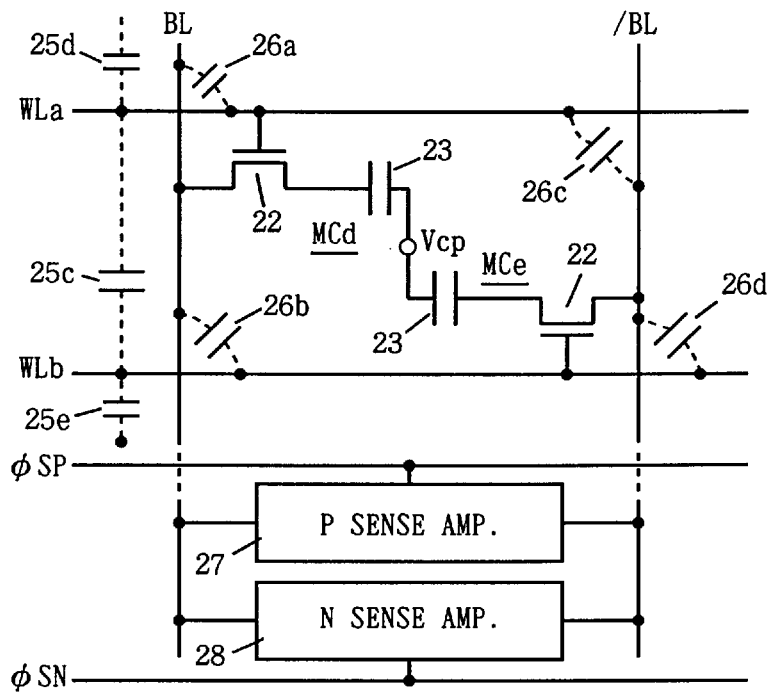
FIG. 40 shows in detail the distribution of parasitic capacitances in the memory array unit of the semiconductor memory device of FIG. 38.
Figure 41:
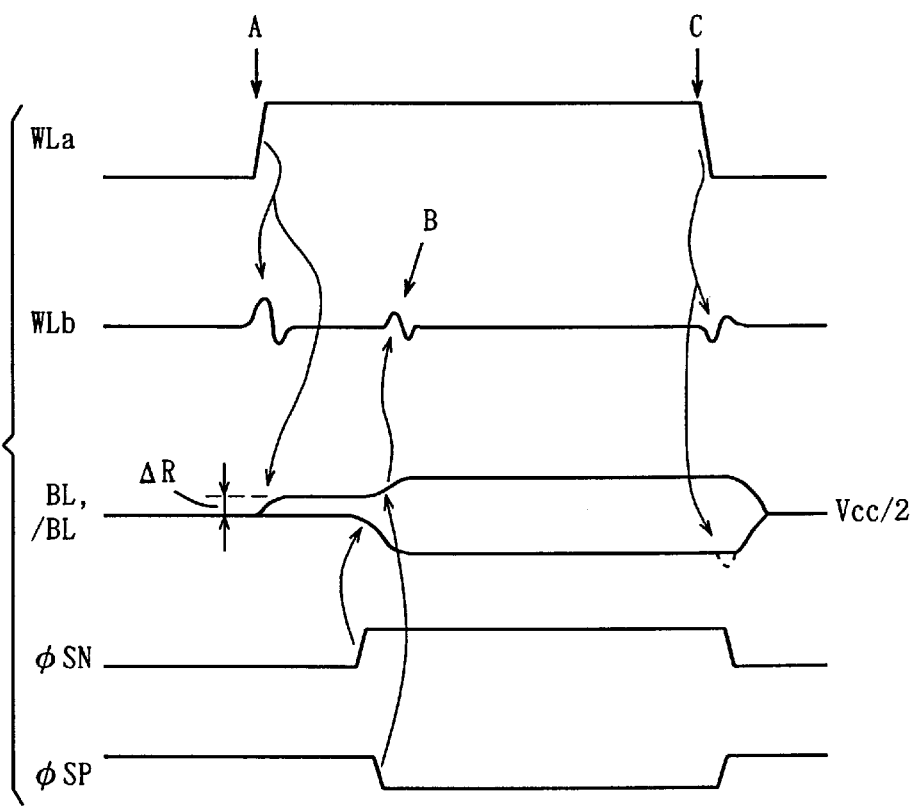
FIG. 41 is a diagram used for describing the effect of the parasitic capacitance of FIG. 40.
Figure 42A:
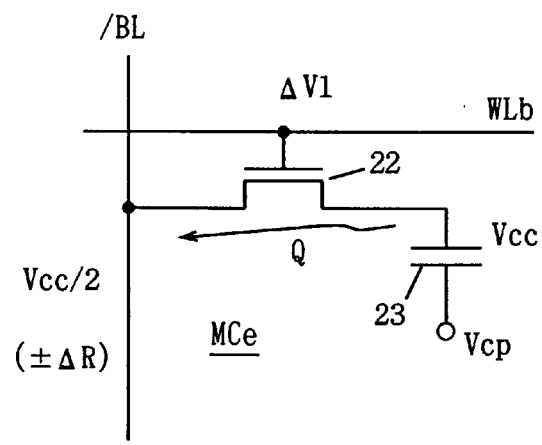
FIGS. 42A–42C are diagrams used for describing the effect of the parasitic capacitance of FIG. 40 on memory cell data.
Figure 42B:
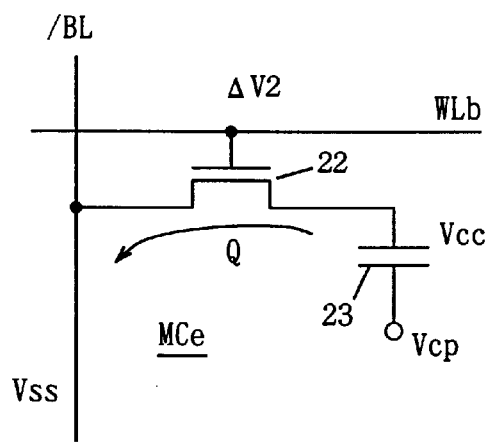
Figure 42C:
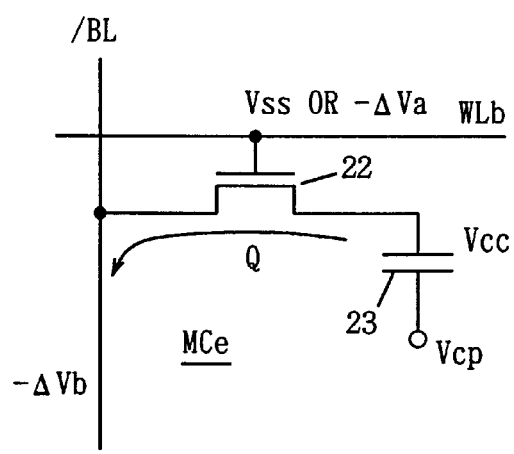
Figure 43:
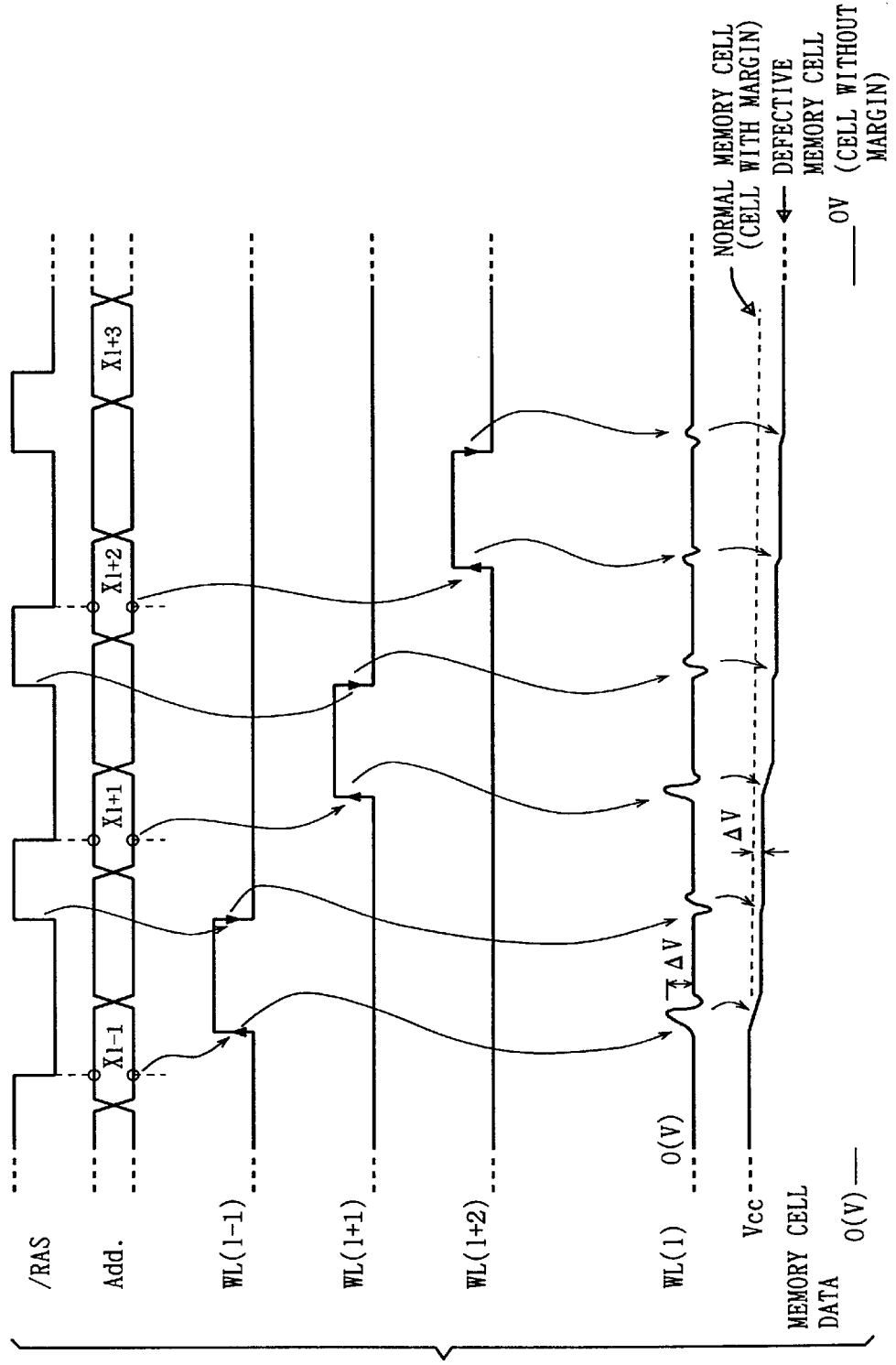
FIG. 43 is a signal waveform diagram used for describing a conventional disturb test.
Figures 45A, 45B:
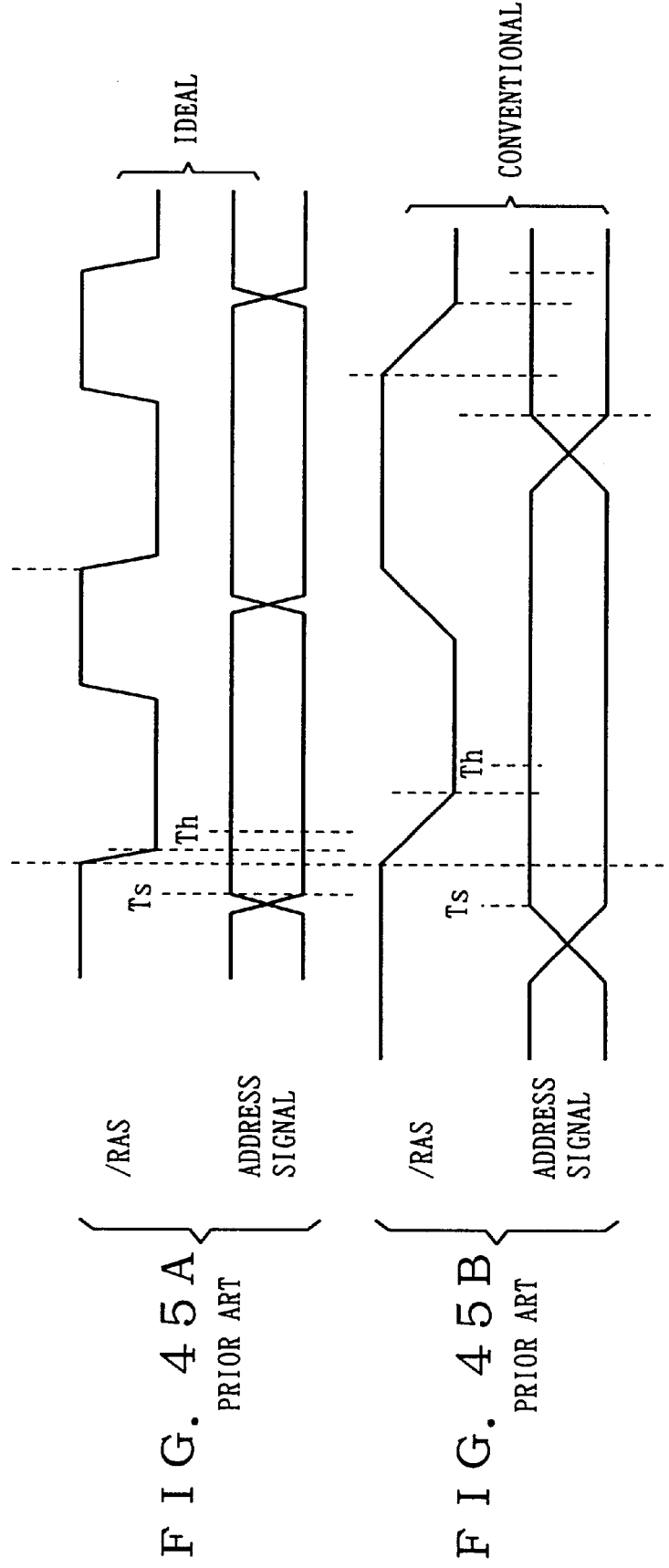
FIGS. 45A and 45B are diagrams used for describing problems of a conventional semiconductor memory device.

FIG. 1 schematically shows an entire structure of a semiconductor memory device according to the first embodiment of the present invention. In FIG. 1, only the structure of the portion related to row selection is shown. In FIG. 1, components corresponding to those of the conventional semiconductor memory device shown in FIG. 37 have the same reference characters allotted.

Referring to FIG. 1, a semiconductor memory device includes a memory cell array 7 having memory cells MC arranged in a matrix, an address buffer 9 for receiving an externally applied address signal, a multiplexer 11 for selecting either an internal row address signal RA from address buffer 9 or a refresh address from an internal address generation circuit 10 according to a select signal φMX, and a row decoder 12 for decoding an address signal applied from multiplexer 11 to drive a word line WL corresponding to the addressed row in memory cell array 7 to a selected state.

In memory cell array 7, a word line WL is arranged corresponding to each row. Each word line WL has memory cells of a corresponding row connected thereto. Also, a bit line pair BLP is arranged corresponding to each column of memory cells in memory cell array 7. A sense amplifier is arranged corresponding to each respective bit line pair BLP to sense, amplify and latch the data of the memory cell on bit line pair BLP. Only a sense amplifier group 14a of this sense amplifiers +IO block 14 are shown in FIG. 1.

Referring to FIG. 1, a control circuit 6 of the semiconductor memory device includes a CBR detection circuit 6a receiving an externally applied row address strobe signal /RAS and a column address strobe signal /CAS for detecting whether the CBR condition is satisfied or not, and a special operation mode detection circuit 6b receiving externally applied signals /RAS, /CAS and /W and a predetermined address bit AD for determining whether these signals meet a predetermined condition. CBR condition is the CAS-before-RAS condition that column address strobe signal /CAS is pulled down to an L level before row address strobe signal /RAS is pulled down to an active state of an L level. Special operation mode detection circuit 6b detects that a special operation mode is specified when, for example, the WCBR condition is met and a particular address signal bit AD is set to a predetermined logic state. WCBR condition corresponds to the state where write enable signal /W and column address strobe signal /CAS are both pulled down to an L level before row address strobe signal /RAS is driven to an L level. Special operation mode detection circuit 6b may be adapted so as to detect that a particular external signal is set to a voltage level sufficiently higher than the H level voltage applied in a normal operation mode, i.e., the so-called "super Vcc" condition.

Control circuit 6 further includes a refresh oscillation circuit 6c for oscillating at a predetermined cycle when active, a refresh control circuit 6d activated, in response to activation of a CBR detection signal φCBR from CBR detection circuit 6a, to activate refresh oscillation circuit 6c and output a refresh request signal φreq at a predetermined timing according to an oscillation signal φPU from refresh oscillation circuit 6c, a one shot pulse generation circuit 6e for generating a one shot pulse having a predetermined time width according to refresh request signal φreq from refresh control circuit 6d, an inhibit circuit 6f for invalidating an externally applied row address strobe signal /RAS when refresh request signal φref from refresh control circuit 6d is active, and an internal RES generation circuit 6g for providing an internal row address strobe signal /RAS as a row select operation designating signal according to the one shot pulse from one shot pulse generation circuit 6e and the output circuit from inhibit circuit 6f.

Inhibit circuit 6f includes an OR circuit 6f a receiving refresh request signal φref and external row address strobe signal /RAS. When refresh request signal φref is active, control of a row select operation according to an externally applied row address strobe signal /RAS is inhibited.

Internal RAS generation circuit 6g includes an AND circuit 6ga receiving the output signal of one shot pulse generation circuit 6e and the output signal of inhibit circuit 6f. One shot pulse generation circuit 6e generates a one shot pulse that is pulled down to an L level for a predetermined time, when active. In a refresh operation mode, AND circuit 6ga outputs an internal row address strobe signal according to the pulse signal from one shot pulse generation circuit 6e. In a normal operation mode, an internal row address strobe signal is output according to externally applied row address strobe signal /RAS.

Control circuit 6 further includes a select gate 6h rendered conductive to pass external row address strobe signal /RAS when special operation mode detection signal φTE from special operation mode detection circuit 6b is active, a test oscillation circuit 6i activated according to an output signal of select gate 6h for carrying out an oscillation operation, a selector 6j for selecting an output signal of either internal RAS generation circuit 6g or test oscillation circuit 6i according to special operation mode detection signal φTE, and row related control circuitry 6k for generating a signal that controls the operation of the circuitry related to the row select operation according to internal row address strobe signal intZRAS from selector 6j.

The oscillation period of test oscillation circuit 6i is set sufficiently shorter than the output cycle (refresh cycle) of refresh request signal φreq. Selector 6j selects the output signal of test oscillation circuit 6i when special operation mode detection signal φTE attains an active state indicating that the special operation mode is instructed, and selects the output signal of internal RAS generation circuit 6g when special operation mode detection signal φTE attains an inactive state.

Row related control circuitry 6k controls the operation of the circuitry related to a row select operation, i.e., the operation of row decoder 12 and sense amplifier group 14a. The circuitry related to the row select operation (row related circuitry) further includes a bit line precharge/equalize circuitry for precharging bit line pair BLP to a predetermined potential.

In FIG. 1, address buffer 9 is illustrated taking in an external address signal according to an external row address strobe signal /RAS. Since the address taking in timing of address buffer 9 is earlier than the activation timing of row decoder 12, address buffer 9 is shown responding to external row address strobe signal /RAS. However, address buffer 9 may be implemented to take in an external address signal in accordance with a signal from row related circuitry 6k.

Internal address generation circuit 10 includes a refresh address counter 10a enabled when activation signal φreft is active, and responsive to inactivation of internal row address strobe signal intZRAS to increment or decrement the count value. Refresh address counter 10a may be adapted to have the count value updated in response to the fall of internal row address strobe signal intZRAS. Multiplexer 11 selects and provides to row decoder 12 the count value output from refresh address counter 10a in accordance with switching signal φMX which is rendered active in a refresh mode and in a special operation mode. In a normal operation mode where switching signal φMX is inactive, multiplexer 11 selects and provides to row decoder 12 an internal address signal RA from address buffer 9.

Activation signal φreft is rendered active in a refresh mode and in a special operation mode. The operation of the semiconductor memory device of FIG. 1 will now be described.

Figure 2:
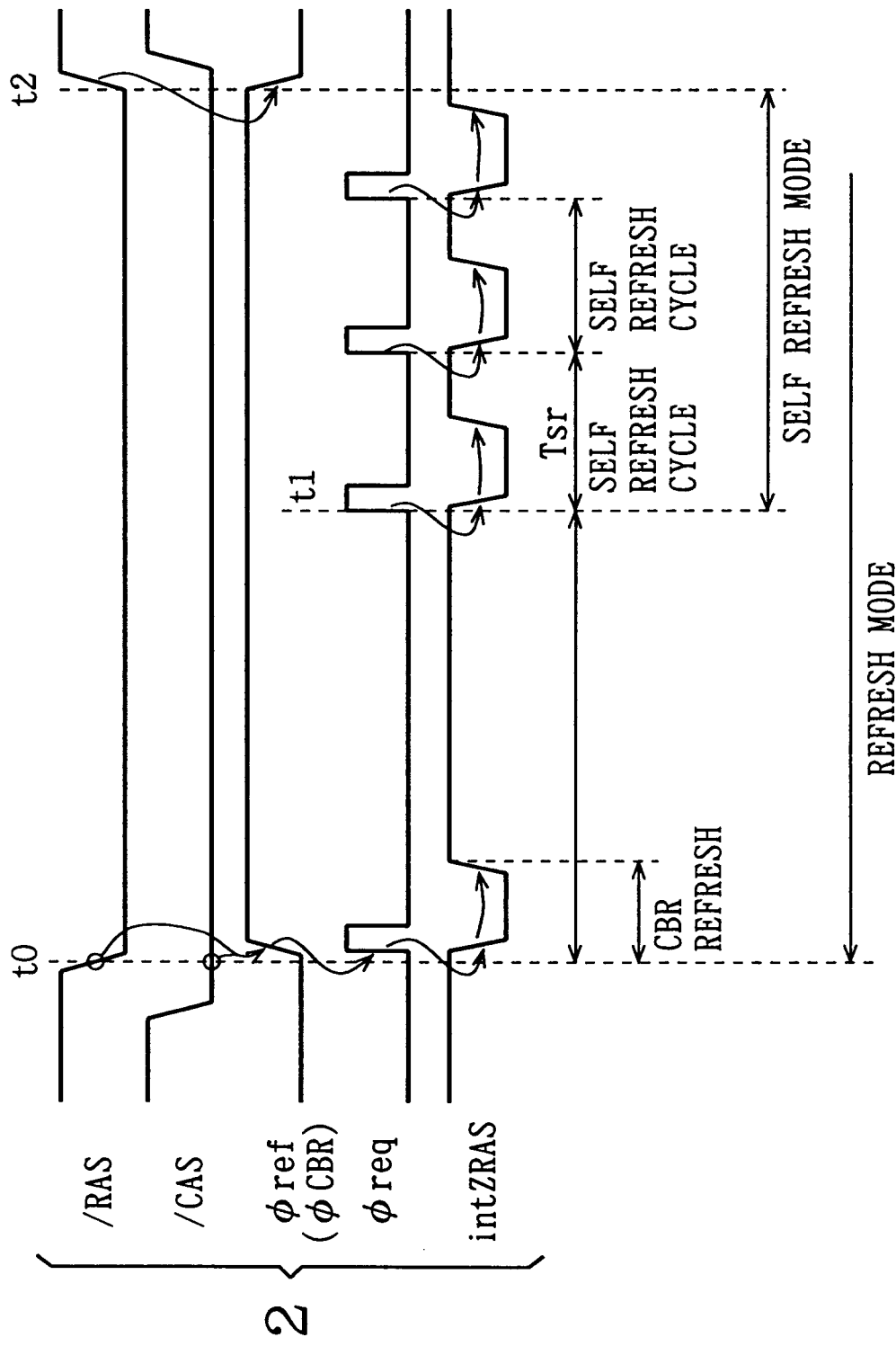
FIG. 2 is a signal waveform diagram representing an operation in a refresh mode of the semiconductor memory device of FIG. 1.

First, a self refresh operation will be described with reference to FIG. 2. At time t0 after column address strobe signal /CAS is pulled down to an L level, row address strobe signal /RAS is pulled down to an L level. This condition is the CBR condition, and CBR detection signal φCBR from CBR detection circuit 6a attains an active state, and responsively refresh control circuit 6d sets refresh request signal φref to an active state (H level) to render refresh oscillation circuit 6c active. Refresh control circuit 6d also enables refresh address counter 10a. The output signal of refresh address counter 10a is provided to multiplexer 11 to cause multiplexer 11 to select the address signal from refresh address counter 10a.

Furthermore, refresh control circuit 6d provides refresh request signal φreq rendered active according to the CBR condition at time t0 to one shot pulse generation circuit 6e. One shot pulse generation circuit 6e provides a pulse signal holding an L level for a predetermined time according to refresh request signal φreq.

Since the special operation mode is not specified, special operation mode detection signal φTE is at an L level. Selector 6j selects the signal from internal RAS generation circuit 6g. Therefore, internal address strobe signal intZRAS from selector 6j is rendered active at an L level according to the one shot pulse provided via internal RAS generation circuit 6g. In response, row related control circuitry 6k is activated. Row decoder 12 and sense amplifier group 14a are rendered active in a predetermined sequence. A row select operation according to the address signal from refresh address counter 10a and a refresh operation of the data of the memory cells connected to the selected row are carried out.

The activation period of the one shot pulse generated from one shot circuit 6e has only to be the time width of a period from a word line selection to sensing, amplifying, and latching of the memory cell data in memory cell array 7 by the sense amplifier. At an elapse of the predetermined time, the pulse signal output from one shot pulse generation circuit 6e is driven to an H level. In response, internal row address strobe signal intZRAS from selector 6j is pulled up to an H level, whereby row related control circuitry 6k renders memory cell array 7 back to the predetermined precharged state.

When row address strobe signal /RAS is held at an L level for a predetermined time (100 μs) under this state, the semiconductor memory device enters the self refresh mode.

At t1 upon an elapse of a predetermined time, refresh control circuit 6d renders refresh request signal φreq active, whereby the data in the memory cells connected to a row (word line) corresponding to the address signal output from refresh address counter 10a in memory cell array 7 is refreshed. Thereafter, refresh control circuit 6d counts oscillation signal φPU from refresh oscillation circuit 6c to drive refresh request signal φreq to an active state at a cycle Tsr of a predetermined time interval (for example 16 μs). In response, memory cell data in memory cell array 7 is refreshed at the refresh cycles.

At time t3, row address strobe signal φRAS is pulled up to an H level, and the self refresh mode is completed. Refresh designating signal φref is pulled down to an L level of an inactive state, and the refresh operation is completed.

Figure 3:
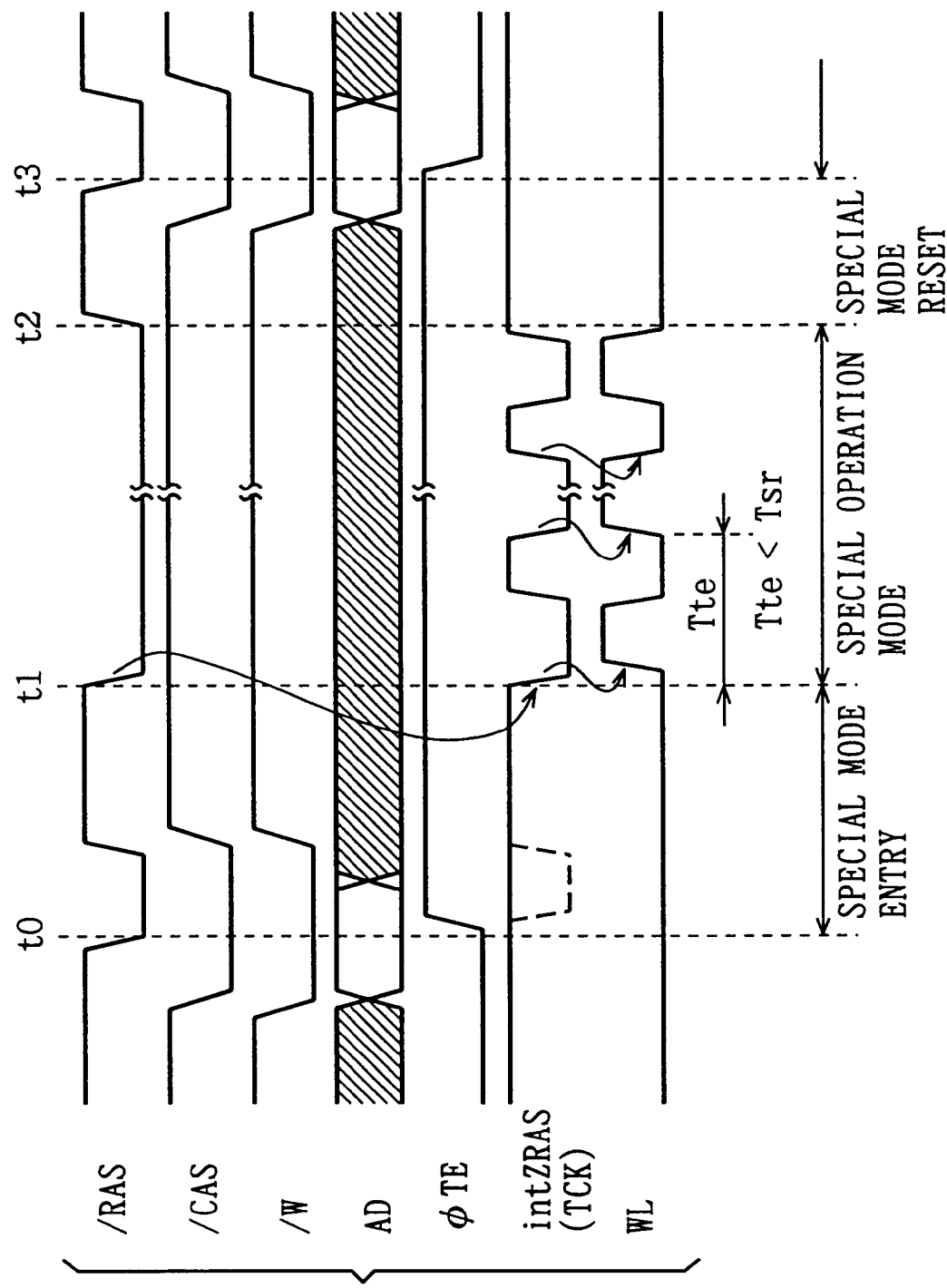
FIG. 3 is a signal waveform diagram representing an operation special operation mode of the semiconductor memory device of FIG. 1.

The operation of a special operation mode will now be described with reference to FIG. 3. Prior to time t0, column address strobe signal /CAS and write enable signal /W are both set at an L level, and a predetermined address signal bit AD is set to a predetermined logic state. At t0 when row address strobe signal /RAS is pulled down to an L level, special operation mode detection signal φTE from special operation mode detection circuit 6b is pulled up to an H level of an active state since the WCBR+address key condition specifying the special operation mode is met. Thus, the special operation mode is set. When the cycle of this special operation mode is completed, row address strobe signal /RAS is pulled up to an H level. Special operation mode detection signal φTE causes select circuit 6h to conduct, whereby external row address strobe signal /RAS is provided to test oscillation circuit 6i. Also, selector 6j is set into a state of selecting the output signal from test oscillation circuit 6i. It may occur that the output signal from internal RAS generation circuit 6g is pulled down from an H level to an active state of an L level by operation of CBR detection circuit 6a (indicated by the broken line in FIG. 3) when the WCBR condition is set. However, selector 6j selects the output signal of test oscillation circuit 6i, so that internal row address strobe signal intZRAS maintains the inactive state of an H level during this special operation mode entry cycle.

In response to special operation mode detection signal φTE, counter activation signal φreft is rendered active. Refresh address counter 10a becomes active. Also, switching signal φMX is rendered active, whereby multiplexer 11 selects the count value from refresh address counter 10a.

When row address strobe signal /RAS is pulled down to an L level at time t1, test oscillation circuit 6i is activated, and oscillation signal TCK is oscillated. Internal row address strobe signal intZRAS is rendered active at a predetermined cycle Tte. Accordingly, a row select operation is carried out with the count value from refresh address counter 10a as the refresh address (the address specifying the row to be refreshed) according to oscillation signal TCK from test oscillation circuit 6i. The word line select cycle Tte in this special operation mode is set sufficiently shorter than self refresh cycle Tsr. Therefore, word lines can be sequentially selected internally at high speed according to refresh addresses from refresh address counter 10a. With word line selected internally at high speed, disturb testing is performed even when the transition of row address strobe signal /RAS is slow.

At time t2, row address strobe signal /RAS is pulled up to an H level. The special operation mode which is a disturb test mode, for example, is completed. Then, a special operation mode reset cycle for resetting this special operation mode is carried out. More specifically, prior to time t3, column address strobe signal /CAS and write enable signal /W are set to an L level and address signal bit AD is set to a predetermined logic state. By pulling down row address strobe signal /RAS to an L level at time t3, the special operation mode reset condition is satisfied. Special operation mode detection signal φTE from special operation mode detection circuit 6b attains an inactive state of an L level, whereby select circuit 6h is rendered nonconductive. Also, test oscillation circuit 6i ceases its oscillation operation. Selector 6j is set to the state of selecting the output signal of internal RAS generation circuit 6g.

Figure 4:
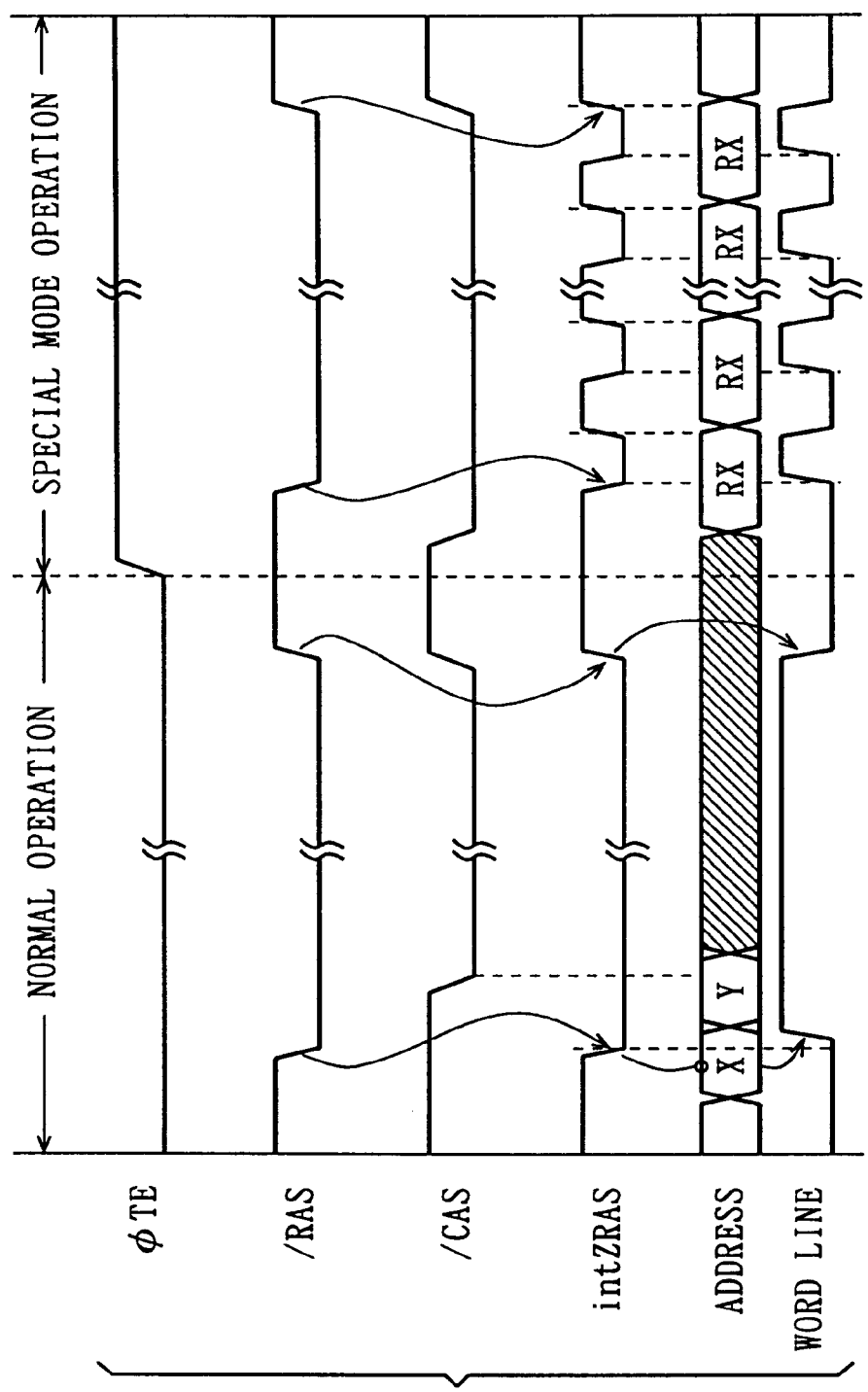
FIG. 4 is a signal waveform diagram representing an operation of the semiconductor memory device of FIG. 1.

In a normal operation cycle, row address strobe signal /RAS is pulled down to an L level when column address strobe signal /CAS is at an H level as shown in FIG. 4. In this state, CBR detection signal φCBR from CBR detection circuit 6a and special operation mode detection signal φTE from special operation mode detection circuit 6b both hold an inactive state of an L level. Therefore, refresh designating signal φref is at an inactive state of an L level. Inhibit circuit 6f passes an externally applied row address strobe signal /RAS. One shot pulse generation circuit 6e provides an output signal of an H level.

Internal RAS generation circuit 6g generates an internal row address strobe signal according to an output signal from inhibit circuit 6f. Selector 6j selects and provides to row related control circuitry 6k the output signal from internal RAS generation circuit 6g. Therefore, internal row address strobe signal intZRAS is pulled down to an L level according to the fall of external row address strobe signal /RAS. The currently applied address signal X is taken as the row address and a word line select operation is performed.

When row address strobe signal /RAS is pulled up to an H level, one memory cycle is completed. Internal row address strobe signal intZRAS is pulled up to an H level. In response, the word line is driven to a nonselected state.

It is to be noted that when column address strobe signal /CAS is pulled down to an L level, the address signal is incorporated as a column address signal Y through a path not shown and a column select operation is performed. Data writing/reading is specified by a write enable signal not shown.

In the special operation mode, special operation mode detection signal φTE attains an H level. According to activation of external row address strobe signal /RAS, internal row address strobe signal intZRAS is driven to an active state according to signal TCK from oscillation signal. A word line is selected according to a refresh address from the internally provided refresh address counter 10a.

Figure 5:
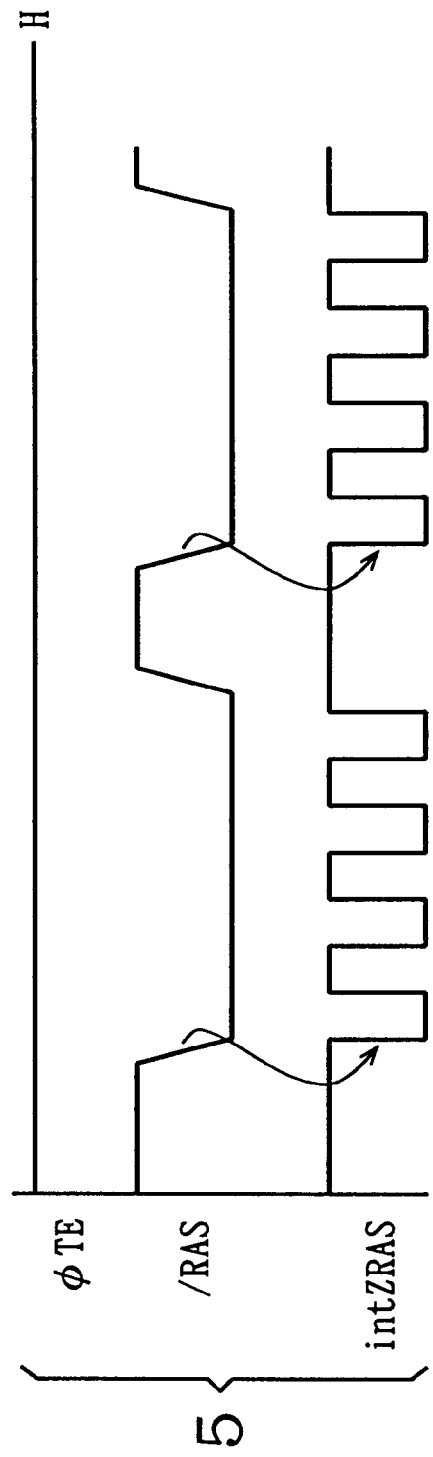
FIG. 5 shows the relationship between an external row address strobe signal and an internal row address strobe signal in a special operation mode.

Therefore, a word line select operation can be carried out internally at high speed even when the transition rate of the signal from an external tester is slow, as shown in FIG. 5. By changing row address strobe signal /RAS at several times (4 times in FIG. 5) the cycle of the test oscillation circuit, a word line can be selected internally at the rate of this multiple (4 times in FIG. 5). Therefore, word line selection can be carried out at high speed even when a conventional tester is employed. Disturb testing can be carried out at high speed. Word lines are sequentially selected according to the count value output from the internal refresh address counter, resulting in a greater number of times of word line selection (number of times of disturbs). Therefore, the number of times of disturbs can be set to an optimum value with respect to the semiconductor memory device to be tested. Thus, disturb testing can be carried out correctly.

Increase in the number of times of disturbs is equivalent to acceleration of the disturb. Therefore, acceleration of the disturb test can be effected. When a word line is selected a greater number of times, the number of times of occurrence of capacitive coupling between the word line and a nonselected word line increases to allow acceleration of the disturb. The period of time where oscillation signal TCK output from the test oscillation circuit is held at an L level should have a time width corresponding to a period from word line selection to completion of sensing and amplification of memory cell data in the memory cell array by the sense amplifier. The period of time of oscillation signal TCK being at an H level should be at least the time required for the circuitry related to word line selection to be precharged to a predetermined potential level, i.e. at least the RAS precharge time tRP. The structure of each element will now be described.

Figure 6:
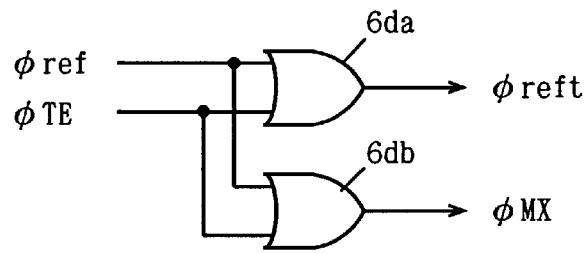
FIG. 6 schematically shows a structure of a refresh address counter and a multiplexer control signal generation unit of FIG. 1.

FIG. 6 shows a structure of the portion generating a counter activation signal and a switching signal φMX. This control signal generation section is included in refresh control circuit 6j of FIG. 1. Counter activation signal φreft is output from an OR circuit 6da receiving refresh designating signal φref and special operation mode detection signal φTE. Switching signal φMX is output from an OR circuit 6db receiving refresh designating signal φref and special operation mode designating signal φTE. When refresh address counter 10a is activated during a refresh operation mode and a special operation mode, multiplexer 11 selects the count value output from this refresh address counter 10a.

Figure 7:
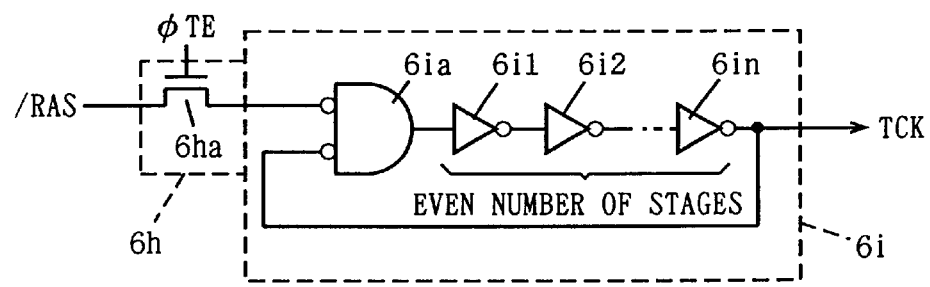
FIG. 7 shows an example of a structure of the test oscillation circuit of FIG. 1.

FIG. 7 shows an example of a structure of test oscillation circuit 6i of FIG. 1. Referring to FIG. 7, test oscillation circuit 6i includes a NOR circuit 6ia receiving row address strobe signal /RAS from select circuit 6 and oscillation signal TCK, and n stages of cascaded inverter circuits 6il–6in receiving an output signal of NOR circuit 6ia. Inverters 6il–6in are even in number. Oscillation signal TCK is output from inverter 6in at the final stage.

Select circuit 6 includes a transfer gate 6ha formed of an N channel MOS transistor rendered conductive when special operation mode detection signal φTE is active. When select circuit 6 conducts and row address strobe signal /RAS is pulled down to an L level, NOR circuit 6ia functions as an inverter. Test oscillation circuit 6i functions as a ring oscillator formed of an odd number of stages of cascaded inverters to carry out an oscillation operation to output the oscillation signal TCK of a predetermined cycle.

In test oscillation circuit 6i shown in FIG. 7, the output signal of NOR circuit 6ia attains an L level when row address strobe signal /RAS attains an H level, whereby oscillation signal TCK output from inverter 6in is pulled down to an L level. In order to fix oscillation signal TCK at an H level when row address strobe signal /RAS attains an H level, the output signal of inverter 6in may be received by an additional inverter to provide oscillation signal TCK.

[Modification of Test Oscillation Circuit]

Figure 8:
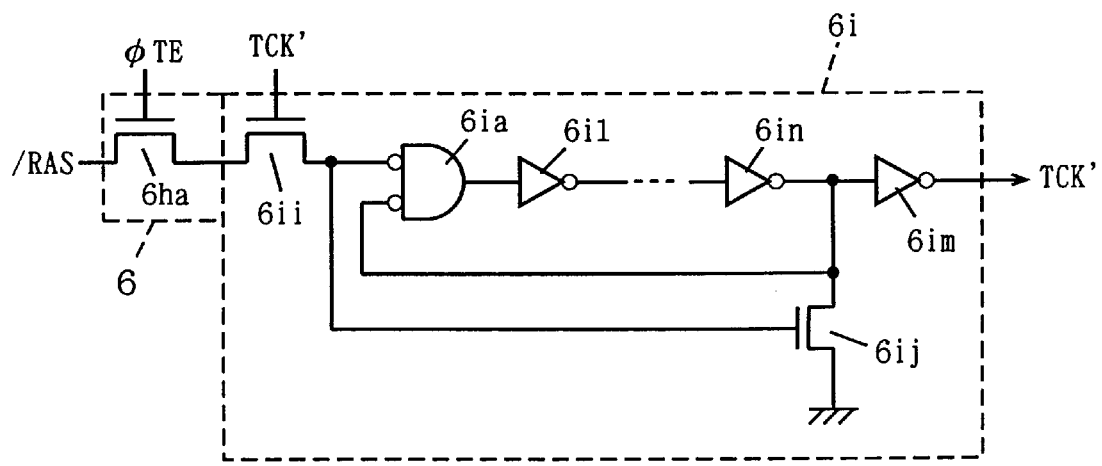
FIG. 8 schematically shows a structure of a modification of the test oscillation circuit of FIG. 1.

FIG. 8 shows a structure of a modification of the test oscillation circuit of FIG. 1. Referring to FIG. 8, test oscillation circuit 6i includes a transfer gate 6ii formed of an n channel MOS transistor responsive to an oscillation signal TCK' for selectively passing and providing to one input of NOR circuit 6ia the output signal of select circuit 6, a reset transistor 6ij formed of an N channel MOS transistor rendered conductive, when the output signal of transfer gate 6ii attains an H level, for discharging the output of inverter 6in to the level of the ground potential, and an inverter 6im receiving an output signal of inverter 6in to output oscillation signal TCK'. The remaining structure is identical to that of test oscillation circuit 6i shown in FIG. 7.

According to the structure shown in FIG. 8, internal row address strobe signal intZRAS is pulled down to an L level when oscillation signal TCK' attains an L level. Therefore, when oscillation signal TCK' attains an H level and internal row address strobe signal intZRAS attains an H level, transfer gate 6ii is rendered conductive to pass row address strobe signal /RAS applied via select circuit 6.

Figure 9:
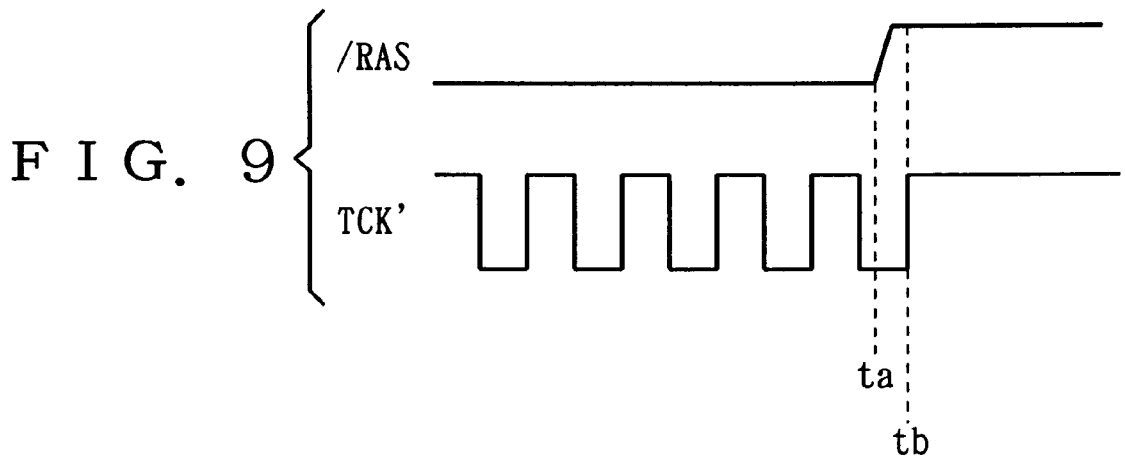
FIG. 9 is a signal waveform diagram representing an operation of the test oscillation circuit of FIG. 8.

Referring to the waveform diagram of FIG. 9, when oscillation signal TCK' attains an H level and row selection is internally carried out at time ta, transfer gate 6ii attains a nonconductive state even when row address strobe signal /RAS is pulled up to an H level. Therefore, oscillation circuit 6i carries out an oscillation operation internally. At time tb, oscillation signal TCK' is pulled up to an H level and the internal row select operation is completed. Responsively, transfer gate 6ii conducts to pass externally applied row address strobe signal /RAS at H level. Therefore, the oscillation operation is ceased. In response, reset transistor 6ij conducts to reliably maintain oscillation signal TCK' at an H level. Thus, the oscillation operation can be reliably ceased at the completion of a word line select operation even when inactivation of row address strobe signal /RAS in an external tester is not synchronous with the internal row select operation. Without taking timing offset into account, a word line select operation can be reliably stopped with margin.

Since a row select operation is carried out using an internal oscillation circuit which is triggered by transition in an external control signal in the first embodiment of the present invention, an internal row select operation can be carried out speedily even when the rising and falling times of the control signal output from the tester is increased.

Also, since an internal row address strobe signal which is an internal row select designating signal defining a row select period is generated using an internal oscillation signal, an internal row address strobe signal can be speedily generated, imperviously to any external effect during operation of testing to carry out a row select operation. Thus, testing such as disturb can be carried out at high speed.

Second Embodiment

Figure 10:
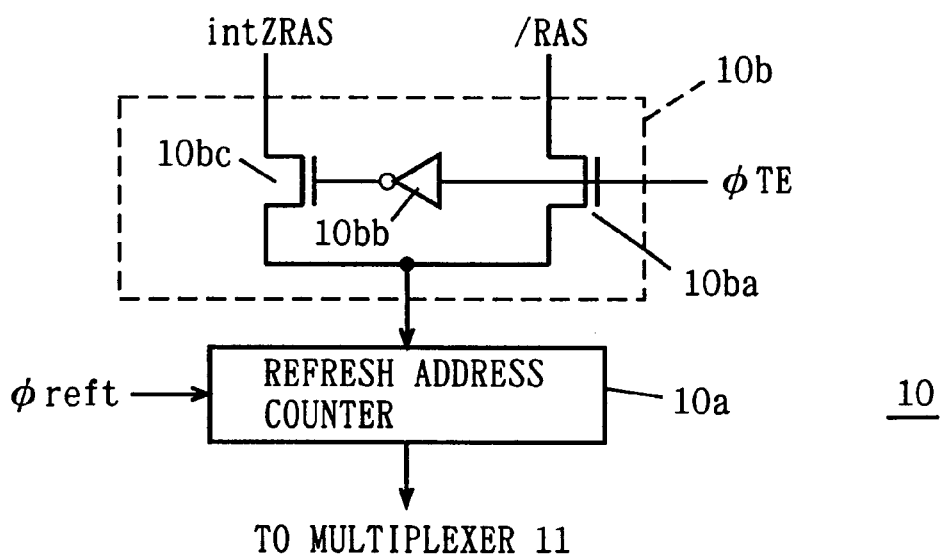
FIG. 10 schematically shows a structure of main components of a semiconductor memory device according to a second embodiment of the present invention.

FIG. 10 shows a structure of the main portion of a semiconductor memory device according to a second embodiment of the present invention. FIG. 10 shows a structure of an internal address generation circuit 10 for generating a refresh address. The remaining structure is similar to that of the semiconductor memory device according to the first embodiment shown in FIG. 1.

Referring to FIG. 10, internal address generation circuit 10 includes a select circuit 10b for selectively passing to refresh address counter 10a either an internal row address strobe signal intZRAS or an external row address strobe signal /RAS according to special operation mode detection signal φTE. Refresh address counter 10a responds to a rise of the signal from select circuit 10b to increment or decrement the count value by 1. Refresh address counter 10a is enabled to carry out a count operation when counter activation signal φreft is active, likewise to the first embodiment.

Select circuit 10b includes a transfer gate 10ba formed of an n channel MOS transistor rendered conductive when special operation mode detection signal φTE is active, to pass externally applied row address strobe signal /RAS, and a transfer gate 10bc rendered conductive when the output signal of inverter 10bb receiving special operation mode detection signal φTE attains an H level, to pass internal row address strobe signal intZRAS.

When a special operation mode is specified, external row address strobe signal /RAS is selected to be provided to refresh address counter 10a. In a normal operation mode and a refresh operation mode, internal row address strobe signal intZRAS is selected to be provided to refresh address counter 10a.

Figure 11:
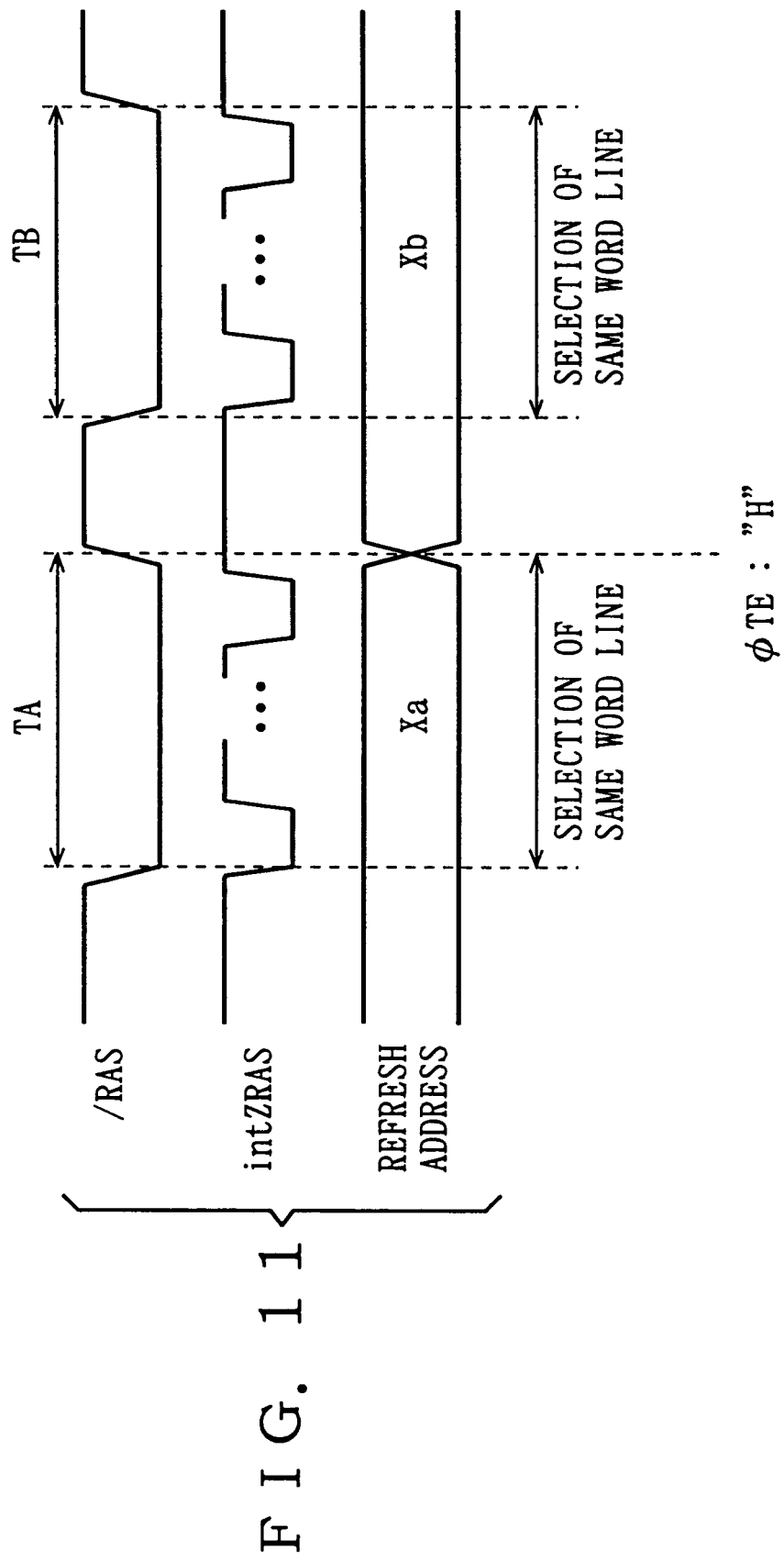
FIG. 11 shows an address generation manner of the internal address generation circuit shown in FIG. 10.

The operation of the internal address generation circuit of FIG. 10 will be described with reference to the signal waveform diagram of FIG. 11. When special operation mode detection signal φTE attains an H level, external row address strobe signal /RAS is selected and provided to refresh address counter 10a. When external row address strobe signal /RAS is driven to an L level during period TA, internal row address strobe signal intZRAS is driven to an active state, according to oscillation signal TCK (or TCK') from the test oscillation circuit (refer to FIG. 1). Since external row address strobe signal /RAS is provided to refresh address counter 10a in this case, the count value Xa from refresh address counter 10a is kept unchanged. Therefore, the word line selected by address Xa is repeatedly selected during period TA.

When period TE ends and external row address strobe signal /RAS is pulled up to an H level, refresh address counter 10a operates to increment or decrement the address by 1 to output an address Xb. When external row address strobe signal /RAS is driven again to an active state of an L level during period TB, the test oscillation circuit (refer to FIG. 1) is activated, whereby internal row address strobe signal intZRAS is driven to an active state, according to the oscillation signal. During period TB, the word line specified by address Xb is repeatedly selected.

By using internal address generation circuit 10 shown in FIG. 10, the refresh address can be controlled according to an external signal. The same word line can be repeatedly driven to a selected state for the required number of times.

Since the oscillation cycle of the test oscillation circuit is predetermined, the same word line can be driven to a selected state for an arbitrary number of times by setting the activation period of external row address strobe signal /RAS based on the oscillation cycle. In this case, a great capacitive coupling is repeated between adjacent word lines. The rise of the potential of adjacent nonselected word lines occurs repeatedly. Therefore, the charge flow-out of the memory cell capacitor can be accelerated. Since the location of a selected word line sequentially becomes farther away when the internal address is sequentially changed, the magnitude of the capacitive coupling sequentially becomes smaller to result in a smaller flow-out charge amount. By controlling the internal refresh address by this external signal, disturb can be accelerated. Thus, the time required for disturb testing can be reduced.

A word line can be driven to a selected state at high speed even when the external tester cannot drive a signal at high speed. This is because an internal row address strobe signal /RAS is generated by a built-in oscillation circuit, similar to the first embodiment.

According to the second embodiment of the present invention, the internal address generated by an internal address generation circuit is controlled by an external control signal. The same word line can be driven repeatedly to a selected state for a desired number of times. The disturb can be accelerated to shorten the time required for the disturb testing.

Third Embodiment

Figure 12:
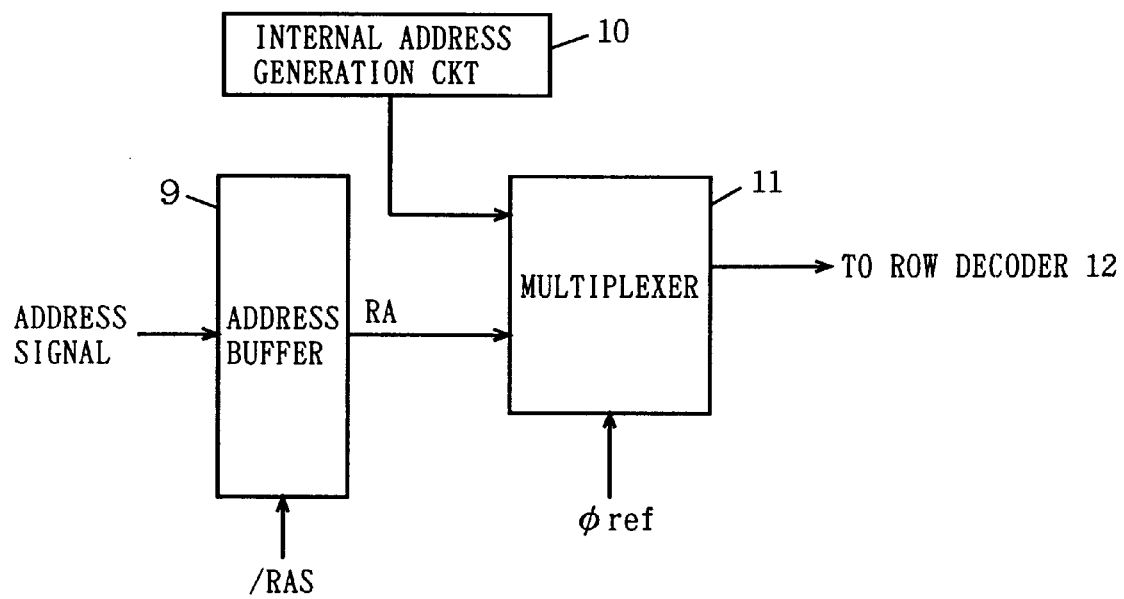
FIG. 12 schematically shows a structure of main components of a semiconductor memory device according to a third embodiment of the present invention.

FIG. 12 shows an arrangement of the main components of a semiconductor memory device according to a third embodiment of the present invention. Referring to FIG. 12, multiplexer 11 selects and provides to row decoder 12 either internal address signal RA from address buffer 9 or a refresh address output from internal address generation circuit 10, according to refresh mode designating signal φref. Multiplexer 11 selects and provides to row decoder 12 the internal address from internal address generation circuit 10 when refresh mode designating signal φref is active and instructs a refresh mode. In contrast, when refresh mode designating signal φref is inactive, address signal RA from address buffer 9 is selected and provided to row decoder 12. Address buffer 9 takes in an external address signal to generate an internal address signal RA, according to external row address strobe signal /RAS. The remaining structure is similar to that shown in FIG. 1.

When a special operation mode is specified in the structure shown in FIG. 12, multiplexer 11 selects internal address signal RA from address buffer 9 since refresh mode designating signal φref is inactive. The operation of the circuit shown in FIG. 12 will now be described with reference to the waveform diagram of FIG. 13.

Figure 13:
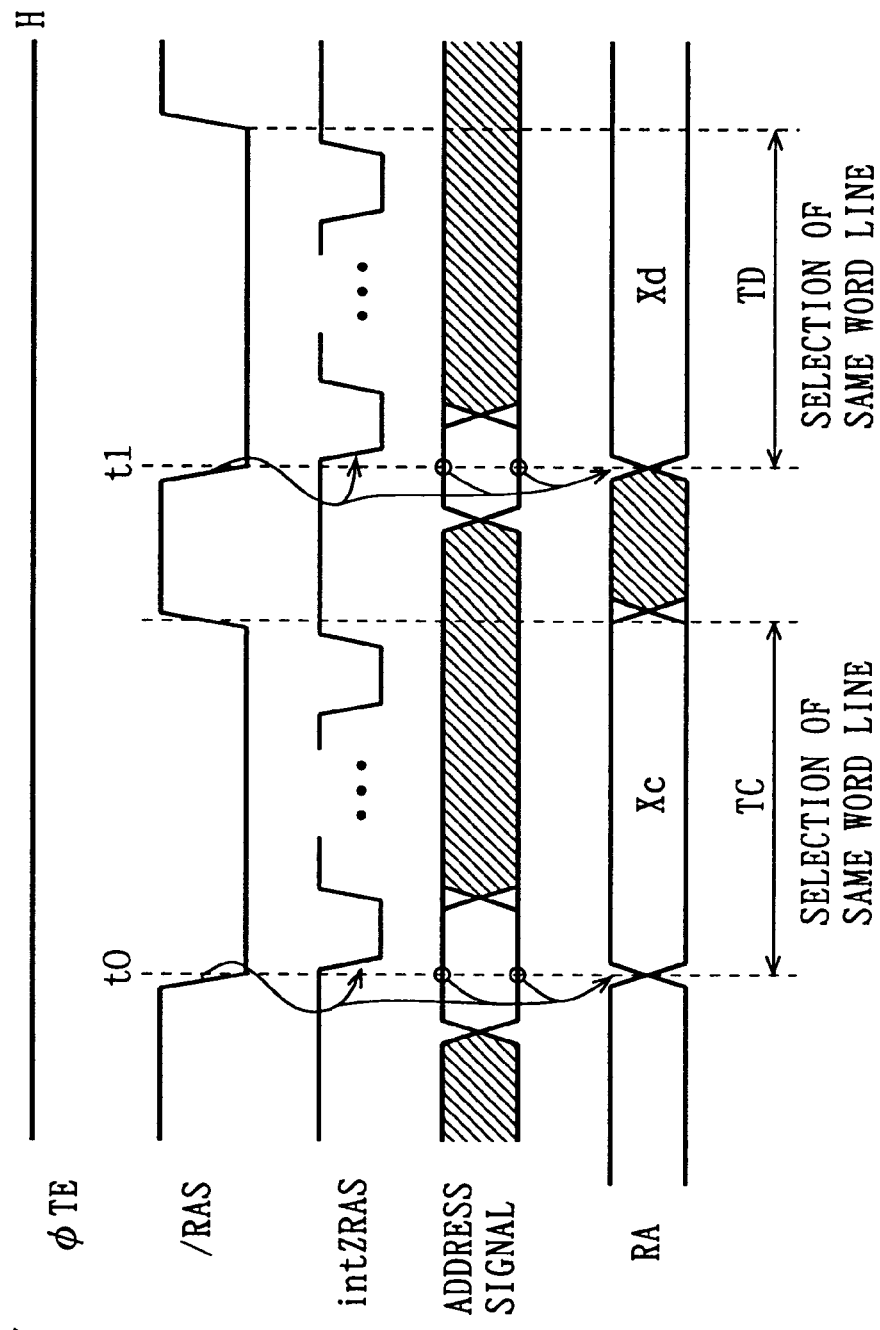
FIG. 13 is a signal waveform diagram representing an operation of the address generation unit of FIG. 12.

In FIG. 13, the special operation mode is specified with special operation mode detection signal φTE attaining an H level. In this state, external row address strobe signal /RAS is pulled down to an L level at time t0. In response to this fall of row address strobe signal /RAS, address buffer 9 takes in the external address signal to generate an internal address signal RA (Xc), which is provided to multiplexer 11. Multiplexer 11 selects this address signal Xc and provides the same to row decoder 12. Address buffer 9 attains a latch state to continuously output the entered address RA (Xc) while row address strobe signal /RAS is at an L level. When internal row address strobe signal intZRAS attains an active state according to output signal TCK (or TCK') of the test oscillation circuit shown in FIG. 1 during the period of TC starting at time t0, the word line specified by address signal Xc is repeatedly selected. When this period TC elapses, row address strobe signal /RAS attains an inactive state of an H level, whereby internal row address strobe signal intZRAS is no longer active.

At time t1, the address signal is altered, and row address strobe signal /RAS is driven to an L level. Address buffer 9 takes the applied address signal to generate a new address signal Xd. This address signal Xd is provided to row decoder 12 via multiplexer 11. During period TD starting at time t1, the word line specified by address signal Xd is repeatedly selected.

According to the structure of FIG. 12, the word line to be selected can be externally specified in execution of the special operation mode. The progress status of the test can be externally monitored. Therefore, identification of whether all the word lines are driven to a selected state for a predetermined number of times can easily be made. Determination can be made that all the word lines have been driven to a selected state for a predetermined number of times after one cycle from the initial value to the final value of the testing address generation circuit in the tester.

Even in the case where an external address signal is provided, the transition of the address signal does not have to be effected at high speed. The cycle merely needs to be identical to that of external row address strobe signal /RAS. Therefore, the same word line can be repeatedly driven to a selected state even if the address signal and the row address strobe signal /RAS are not driven at high speed. The word line select cycle can be speeded up.

According to the third embodiment of the present invention, a word line to be selected is specified according to an externally applied address signal in a special operation mode. The test progress status can be easily identified. The testing operation can be carried out properly by driving each word line to a selected state reliably for the required number of times.

Fourth Embodiment

Figure 14:
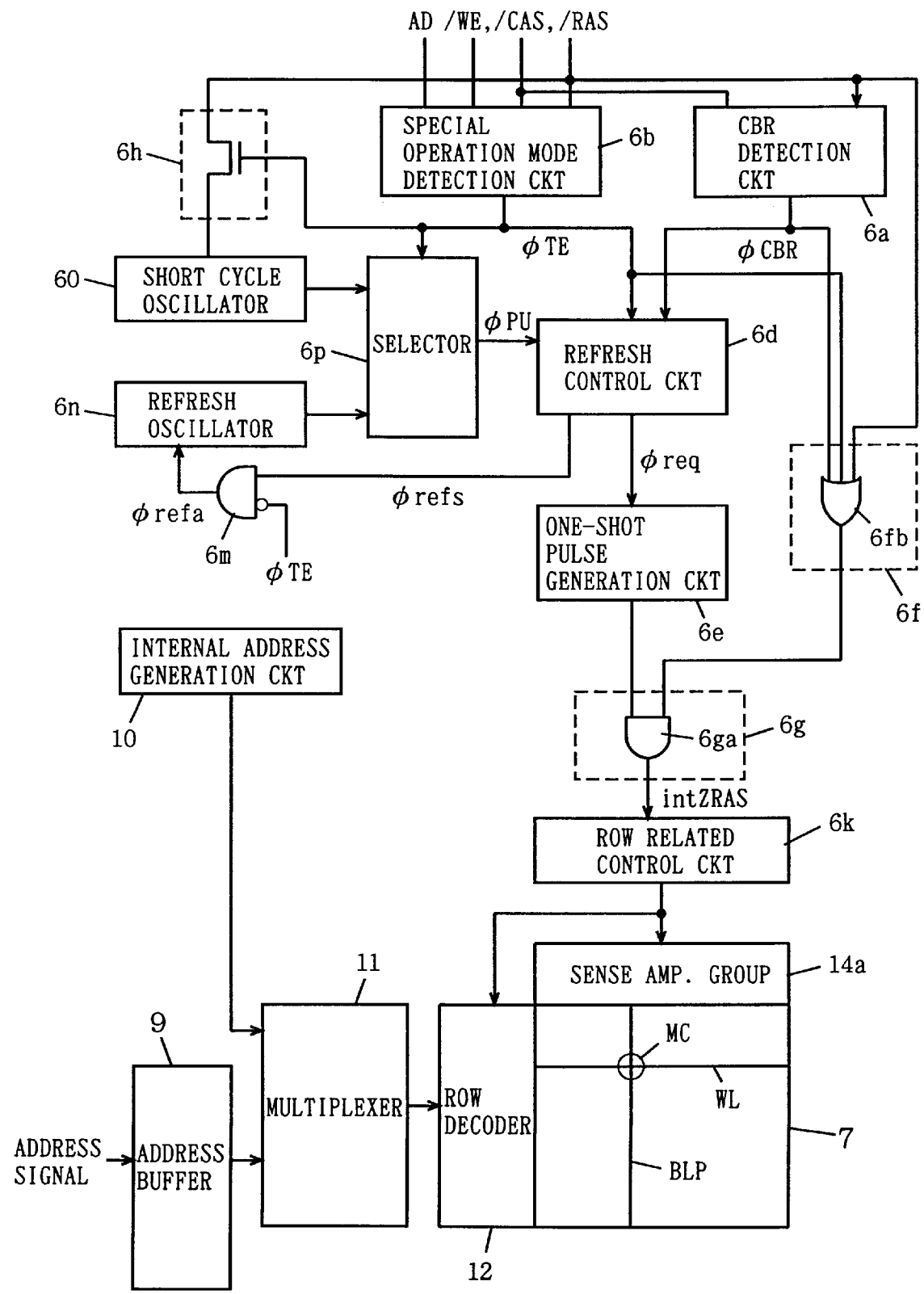
FIG. 14 schematically shows an entire structure of a semiconductor memory device according to a fourth embodiment of the present invention.

FIG. 14 schematically shows a structure of an entire semiconductor memory device according to a fourth embodiment of the present invention.

Referring to FIG. 14, th semiconductor memory device includes a CBR detection circuit 6a receiving external row address strobe signal /RAS and column address strobe signal /CAS to detect that the CBR condition is met, a special operation mode detection circuit 6b receiving external signals /RAS, /CAS, /W and AD for detecting that the special operation mode is specified, a refresh control circuit 6d for providing controls required for a refresh operation according to special operation mode detection signal φTE and CBR detection signal φCBR, a gate circuit 6m receiving self refresh designating signal φrefs from refresh control circuit 6d and special operation mode detection signal φTE, a refresh oscillator 6n activated in response to activation of an output signal φrefa of gate circuit 6m, for carrying out an oscillation operation at a predetermined cycle, a select circuit 6h rendered conductive when special operation mode detection signal φTE from special operation mode detection circuit 6b is active, to pass external row address strobe signal /RAS, a short cycle oscillator 6o for carrying out an oscillation operation at a predetermined short cycle, according to row address strobe signal /RAS from select circuit 6h, and a selector 6p for selecting the output signal of either short cycle oscillator 6o or refresh oscillator 6n, according to special operation mode detection signal φTE. Output signal φPU from selector 6p is provided to refresh control circuit 6d. Short cycle oscillator 6o has an oscillation cycle sufficiently shorter than the oscillation cycle of refresh oscillator 6n.

The semiconductor memory device of the fourth embodiment further includes a one shot pulse generation circuit 6e for generating a one shot pulse signal according to refresh request signal φreq from refresh control circuit 6d, an inhibit circuit 6f for inhibiting transmission of external row address strobe signal /RAS when CBR detection signal φCBR from CBR detection circuit 6a or special operation mode detection signal φTE is active, and an internal RAS generation circuit 6g for providing an internal row address strobe signal intZRAS, according to an output signal of one shot pulse generation circuit 6e and an output signal of inhibit circuit 6f. One shot pulse generation circuit 6e provides a pulse signal having a time width for an active state of the period of time required for the data of the selected memory cell to be sensed, amplified, and latched by the sense amplifier.

Inhibit circuit 6f includes an OR circuit 6fb receiving CBR detection signal φCBR, special operation mode detection signal φTE, and row address strobe signal /RAS. Internal RAS generation circuit 6g includes an AND circuit 6a receiving an output signal of one shot pulse generation circuit 6e and an output signal of inhibit circuit 6f.

The semiconductor memory device further includes an address buffer 9 receiving an external address signal for generating an internal address signal, an internal address generation circuit 10 with a refresh address counter for generating an internal address signal, a multiplexer 11 for selecting and providing to row decoder 12 the output signal of either address buffer 9 or internal address generation circuit 10, and a sense amplifier group 14a provided corresponding to each bit line pair BLP of memory cell array 7 for sensing, amplifying, and latching data of the memory cells of corresponding bit line pairs. This structure is identical to that of the first embodiment.

Internal row address strobe signal intZRAS from internal RAS generation circuit 6g is provided to row related control circuitry 6k.

According to the structure shown in FIG. 14, the oscillator is switched between one in the special operation mode and another in the self refresh mode. Selector 6p selects the output signal of short cycle oscillator 6o in a special operation mode and the output signal of refresh oscillator 6n in a refresh operation mode. Short cycle oscillator 6o and refresh oscillator 6n have different oscillation cycles.

Refresh control circuit 6d counts pulse signal φPU provided via selector 6p in the self refresh operation mode to output refresh request signal φreq every time a predetermined count value is reached. Therefore, the output cycle of refresh request signal φreq differs between the special operation mode and the self refresh operation mode. In the special operation mode, refresh request signal φreq is output at a cycle shorter than that of the self refresh mode to render internal row address strobe signal intZRAS active. Therefore, the word lines can sequentially be selected at high speed internally according to the structure shown in FIG. 14.

Short cycle oscillator 6o is supplied with external row address strobe signal /RAS via select circuit 6h. The active period of short cycle oscillator 6o can be controlled by row address strobe signal /RAS. Therefore, word lines can be sequentially driven to a selected state using a conventional tester, as in the previous first embodiment.

Figure 15:
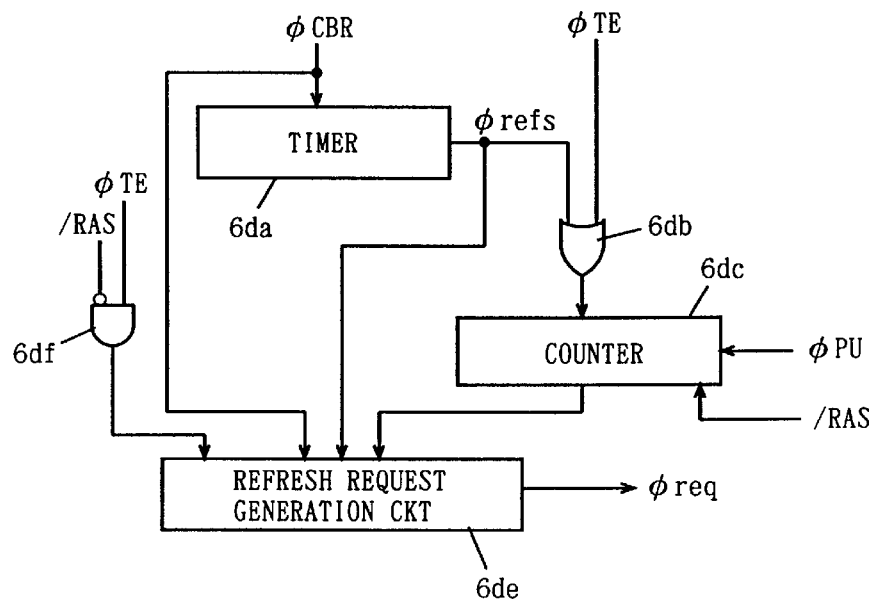
FIG. 15 schematically shows a structure of the refresh control circuit of FIG. 14.

FIG. 15 schematically shows a structure of refresh control circuit 6d of FIG. 14. Referring to FIG. 15, refresh control circuit 6d includes a timer 6da activated during activation of CBR detection signal φCBR to count a predetermined time and output a self refresh designating signal φrefs at an elapse of the predetermined time, an OR circuit 6db receiving self refresh designating signal φrefs output from timer 6da and special operation mode detection signal φTE, a counter 6dc activated when the output signal of OR circuit 6db is active to count pulse signal φPU provided from selector 6p shown in FIG. 14 to output a count up signal every time a predetermined count value is reached, a gate circuit 6df receiving signals φTE and /RAS, and a refresh request generation circuit 6de responsive to the respective rises of CBR detection signal φCBR, self refresh designating signal φrefs, the count up signal from counter 6dc, and the output signal of gate circuit 6df for providing a refresh request signal φreq in a one shot pulse form.

Timer 6da counts the time from when the CBR condition is met until entry of a self refresh mode. OR circuit 6db renders counter 6dc active when either self refresh mode designating signal φrefs or special operation mode detection signal φTE is active. Therefore, counter 6dc carries out a count operation both in the special operation mode and in the self refresh operation mode. Gate circuit 6df provides a signal of a high level in response to a fall of row address strobe signal /RAS when signal φTE is at a high level. The operation of the semiconductor memory device shown in FIGS. 14 and 15 will now be described with reference to FIGS. 16 and 17.

Figure 16:
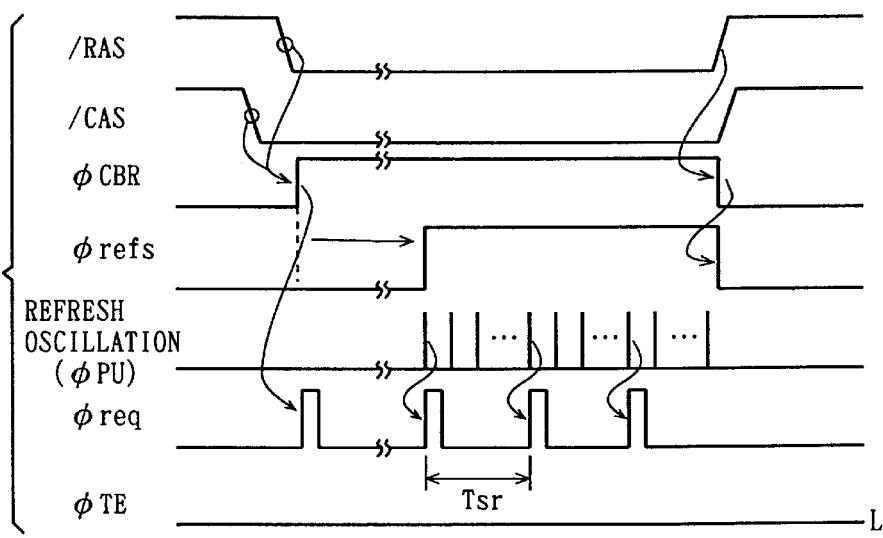
FIG. 16 is a signal waveform diagram representing an operation of the semiconductor memory device of FIG. 14.

First, the operation of a refresh mode will be described with reference to FIG. 16. When row address strobe signal /RAS is pulled down to an L level after the fall of column address strobe signal /CAS, the CBR condition is met. CBR detection signal φCBR from CBR detection circuit 6a is pulled up to an active state of a high level. CBR detection signal φCBR maintains the active state of an H level during the L level period of row address strobe signal /RAS. When CBR detection signal φCBR is pulled up to an active state of an H level, refresh request signal φreq from refresh request generation circuit 6de shown in FIG. 15 is activated. Responsively, a one shot pulse signal is output from one shot pulse generation circuit 6e. A refresh operation is executed according to refresh request signal φreq. Multiplexer 11 selects and provides to row decoder 12 the internal address from internal address generation circuit 10.

Timer 6da is started in response to activation of CBR detection signal φCBR, to count the predetermined time. At an elapse of the predetermined time, self refresh designating signal φrefs from timer 6da is rendered active to activate counter 6dc. In response to activation of self refresh designating signal φrefs, refresh request generation circuit 6de drives refresh request signal φreq to an active state to request a refresh operation.

In response to activation of self refresh designating signal φrefs, gate circuit 6m activates refresh oscillator 6n with output signal φrefa of an active state of an H level since special operation mode detection signal φTE is at an inactive state of an L level. Selector 6p selects the output signal of refresh oscillator 6n, according to inactivation of special operation mode detection signal φTE. The selected output signal of refresh oscillator 6n is provided to counter 6dc in refresh control circuit 6d. Counter 6dc is started in response to activation of self refresh designating signal φrefs, to count pulse signal PU provided via selector 6p. Refresh request generation circuit 6de activates refresh request signal φreq every time the count value of counter 6dc arrives at the predetermined value. Therefore, refresh request generation circuit 6de activates refresh request signal φreq at a predetermined interval Tsr when self refresh designating signal φrefs is active. By pulling up row address strobe signal /RAS to an H level, CBR detection signal φCBR is pulled down to an inactive state of an L level. Thus, a self refresh operation is completed.

Figure 17:
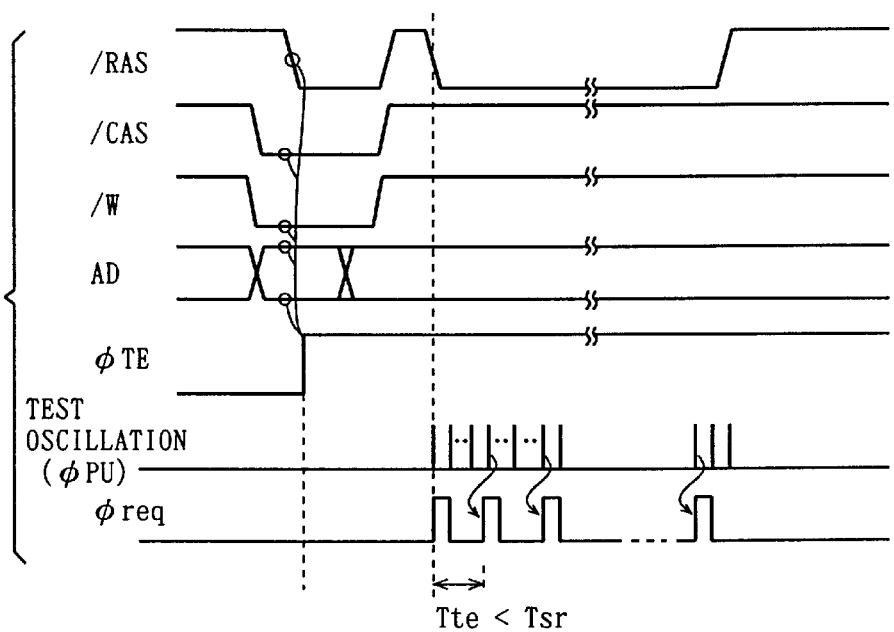
FIG. 17 is a signal waveform diagram representing an operation in a special operation mode of the semiconductor memory device of FIG. 14.

The operation of a special operation mode will now be described with reference to FIG. 17. When row address strobe signal /RAS is pulled down to an L level after column address strobe signal /CAS and write enable signal /W are set to an active state of an L level and address signal bit AD is set to a predetermined logic state, special operation mode detection circuit 6b determines that the special operation mode is specified to drive special operation mode detection signal φTE to an active state. In response to activation of special operation mode detection signal φTE, select circuit 6h provides external row address strobe signal /RAS to short cycle oscillator 6o. Output signal φrefa of gate circuit 6n is driven to an L level according to activation of special operation mode detection signal φTE. As a result, refresh oscillator 6n has its oscillation operation ceased.

Selector 6p selects and provides to refresh control circuit 6d the output signal of short cycle oscillator 6o, according to special operation mode detection signal φTE. It may be considered that short cycle oscillator 6o carries out an oscillation operation in response to activation of row address strobe signal /RAS provided via select circuit 6h in setting of this special operation mode. However, in refresh control circuit 6d, special operation mode detection signal φTE is provided to counter 6dc via OR circuit 6db. Therefore, a refresh request signal will not be output if the count-up of counter 6dc is set longer than the period where row address strobe signal /RAS is kept at an L level when this special operation mode is set.

Counter 6dc is activated according to activation of special operation mode detection signal φTE. Short cycle oscillator 6o stops its oscillation operation when row address strobe signal /RAS attains an inactive state of an H level.

After special operation mode detection signal φTE is set to an active state of an H level, row address strobe signal /RAS is pulled down to an L level to activate short cycle oscillator 6o. The output signal of short cycle oscillator 6o is provided to counter 6dc in refresh control circuit 6d via selector 6p. Counter 6dc responds to a fall of row address strobe signal /RAS to have the count value reset to the initial value. Counter 6dc counts pulse signal φPU provided via selector 6p to output a count up signal every time the predetermined count value is reached.

Refresh request generation circuit 6de generates the refresh request signal φreq in response to the rise of the output signal of gate circuit 6df receiving row address strobe signal /RAS and special operation mode detection signal φTE. In the special operation mode, refresh request signal φreq is output each time row address strobe signal /RAS falls. Then, refresh request signal φreq is driven to an active state according to an output signal of counter 6dc at predetermined time interval. This cycle Tte is sufficiently shorter than the cycle Tsr where refresh request signal φreq is output in a self refresh operation. Thus, word lines can sequentially be selected at high speed in a special operation mode.

Short cycle oscillator 6o and refresh oscillator 6n has a structure of the ring oscillator shown in FIG. 7 or 8, for example.

The internal address generated by internal address generation circuit 10 can be controlled by row address strobe signal /RAS as shown in FIG. 10. In other words, a structure in which the same word line is successively driven to a selected state can be employed. Also, a structure in which word line selection is carried out according to an external address signal in a special operation mode by controlling multiplexer 11 and address buffer 9 as shown in FIG. 9 can be employed. In this case, CBR detection signal φCBR is provided to multiplexer 11 as a select control signal. Any of these structures can be employed.

According to the fourth embodiment of the present invention, a short cycle oscillator having an oscillation cycle shorter than an oscillator for self refresh is used instead and has the output signal provided to the refresh control circuit which in turn outputs a refresh request signal every time the count value reaches a predetermined value, to render the internal row address strobe signal active. Thus, word lines can sequentially be driven to a selected state internally at high speed even in the case where the external control signal is not driven at high speed.

By controlling the count operation in internal address generation circuit 10 according to row address strobe signal /RAS which is an external control signal, the word line of the same address value can be successively selected repeatedly for a predetermined number of times.

Also, by providing a structure in which an external address signal is taken by controlling multiplexer 11 in a special operation mode, a word line can be specified according to an external address signal even in the special operation mode. An advantage similar to that of the third embodiment can be achieved.

Fifth Embodiment

Figure 18:
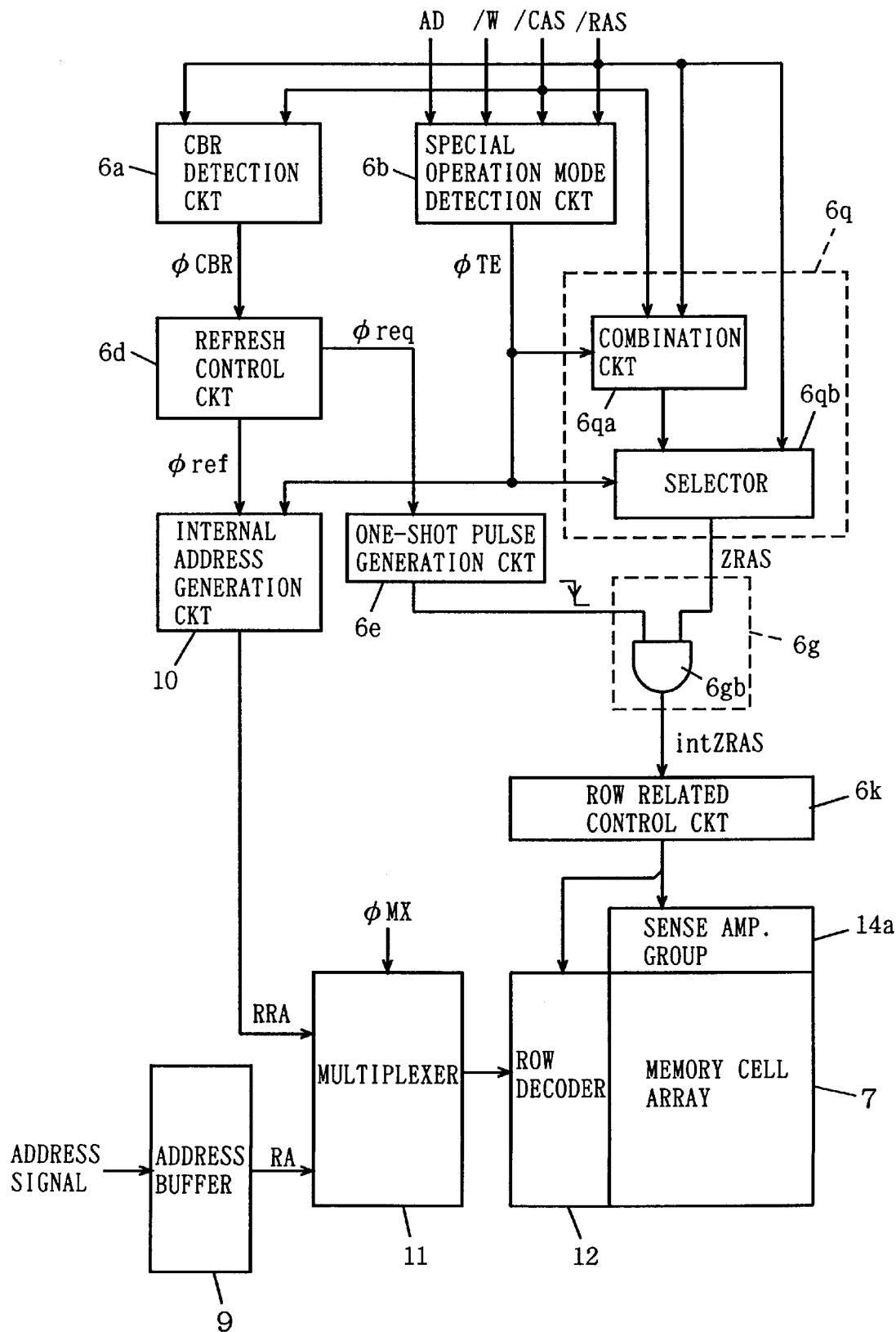
FIG. 18 schematically shows an entire structure of a semiconductor memory device according to a fifth embodiment of the present invention.

FIG. 18 schematically shows an entire structure of a semiconductor memory device according to a fifth embodiment of the present invention. The semiconductor memory device of FIG. 18 includes an external control RAS generation circuit 6q for generating an internal row address strobe signal according to the transition of external control signals /RAS and /CAS in the special operation mode. External control RAS generation circuit 6q includes a combination circuit 6qa activated when special operation mode detection signal φTE from special operation mode detection circuit 6b is active, to generate an internal row address strobe signal according to transition of external row address strobe signal /RAS and column address strobe signal /CAS, and a selector 6qb for selecting either the output signal of combination circuit 6qa or external row address strobe signal /RAS, according to special operation mode detection signal φTE.

Combination circuit 6qa is triggered by the change in state of external row address strobe signal /RAS and column address strobe signal /CAS to alter the state of an internal row address strobe signal when active. Selector 6qb selects the output signal of combination circuit 6qa when special operation mode detection signal φTE is active and selects external row address strobe signal /RAS when special operation mode detection signal φTE is inactive, to generate a signal ZRAS. For the sake of simplifying the illustration, the gate circuit for rendering external row address strobe signal /RAS invalid when CBR detection signal φCBR from CBR detection circuit 6a is active is not shown. The remaining structure is similar to that shown in FIG. 1. Corresponding elements have the same reference characters allotted, and detailed description thereof will not be repeated.

Internal address generation circuit 10 is rendered active, when refresh designating signal φref (or CBR detection signal φCBR) from refresh control circuit 6d or special operation mode detection signal φTE is active, to increment or decrement the internal address signal to be generated by one when internal row address strobe signal intZRAS is made inactive (refer to FIGS. 1 and 6). Multiplexer 11 selects and provides to row decoder 12 address signal RA from internal address generation circuit 10 according to switching signal φMX in the special operation mode and the refresh operation mode.

According to the structure shown in FIG. 18, the state of internal row address strobe signal intZRAS is altered according to the transition of externally applied signals /RAS and /CAS. Therefore, the transition cycle of a combination of a plurality of external signals can be set faster than the cycle implementable by one external signal even in the case where the transition of each external signal is slow in the special operation mode. Thus, the cycle of internal row address strobe signal intZRAS can be shortened.

Figure 19:
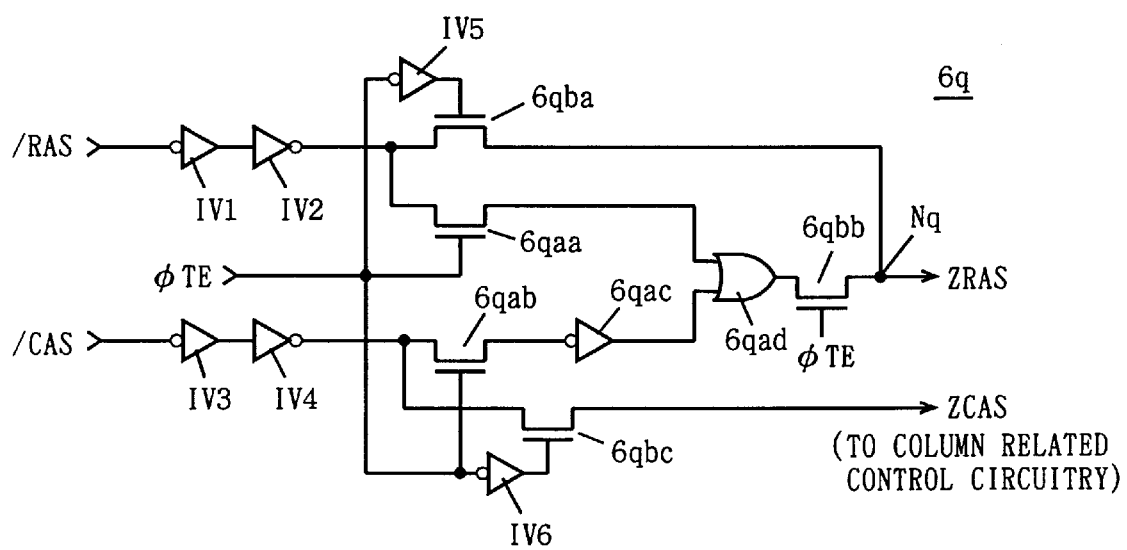
FIG. 19 shows an example of a structure of an external control RAS generation circuit of FIG. 18.

FIG. 19 shows an example of a structure of external control RAS generation circuit 6q shown in FIG. 18. In FIG. 19, external control RAS generation circuit 6q receives external row address strobe signal /RAS via two stages of cascaded inverters IV1 and IV2, and receives external column address strobe signal /CAS via two stages of cascaded inverters IV3 and IV4. These inverters IV1–IV4 correspond to the input buffer of the semiconductor memory device.

External control RAS generation circuit 6q includes a transfer gate 6qaa formed of an n channel MOS transistor rendered conductive when special operation mode detection signal φTE is active to pass row address strobe signal /RAS provided from inverter IV2, a transfer gate 6qab formed of an n channel MOS transistor rendered conductive when special operation mode detection signal φTE is active, to pass column address strobe signal /CAS provided from inverter IN4, an inverter 6qac receiving the signal transmitted from transfer gate 6qab, an OR circuit 6qad receiving the row address strobe signal provided via transfer gate 6qaa and the output signal of inverter 6qac, and a transfer gate 6qbb formed of an n channel MOS transistor rendered conductive when special operation mode detection signal φTE is active, to transmit the output signal of OR circuit 6qad as an output signal ZRAS.

Transfer gates 6qaa and 6qab inverter 6qac and OR circuit 6qad correspond to combination circuit 6qa of FIG. 18.

External control RAS generation circuit 6q further includes inverters IV5 and IV6 receiving special operation mode detection signal φTE, a transfer gate 6qba formed of an n channel MOS transistor rendered conductive when the output signal of inverter IV5 attains an H level, to transmit the row address strobe signal provided via inverter IV2 to an output node Nq, and a transfer gate 6qbc formed of an n channel MOS transistor rendered conductive when the output signal of inverter IV6 attains an H level, to transmit the column address strobe signal from inverter IV4 to form an internal column address strobe signal ZCAS. Transfer gates 6qba, 6qbb and 6qbc correspond to selector 6qb shown in FIG. 18. Transfer gate 6qbc is provided to prevent the circuitry related to column selection from being operated according to the column address strobe signal when the internal row address strobe signal is activated in the special operation mode. The operation of external control RAS generation circuit 6q shown in FIG. 19 will now be described with reference to the waveform diagram of FIG. 20.

In a normal operation mode, CBR detection signal φCBR and special operation mode detection signal φTE are at an inactive state of an L level. In this state, multiplexer 11 shown in FIG. 18 selects and provides to row decoder 12 address signal RA from address buffer 9. Special operation mode detection signal φTE is at an L level, and transfer gates 6qaa and 6qab shown in FIG. 19 are off, while transfer gates 6qba and 6qbc are both on. Therefore, an external row address strobe signal /RAS is provided via transfer gate 6qba to output node Nq to generate signal ZRAS. External column address strobe signal /CAS is provided as an internal column address strobe signal ZCAS to column related control circuitry (not shown) via transfer gate 6qbc.

When external row address strobe signal /RAS is pulled down to an L level, signal ZRAS is driven to an L level. In response, internal row address strobe signal intZRAS from internal RAS generation circuit 6g of FIG. 18 is pulled down to an L level. In response to the fall of internal row address strobe signal intZRAS, row decoder 12 is activated. A row select operation is carried out according to address signal RA provided via multiplexer 11. When column address strobe signal /CAS is pulled down to an L level of an active state, the column address signal is taken via a path not shown, and a column select operation is performed. When one memory cycle is completed, row address strobe signal /RAS is driven to an inactive state of an H level, and column address strobe signal /CAS is driven to an inactive state of an H level. In response to inactivation of row address strobe signal /RAS, internal row address strobe signal intZRAS is driven to an inactive state of an H level, whereby memory cell array 7 is driven to a precharged state. Therefore, internal row address strobe signal intZRAS makes a transition according to external row address strobe signal /RAS in a normal operation mode.

In the special operation mode, special operation mode detection signal φTE is pulled up to an H level of an active state. In this state, internal address generation circuit 10 shown in FIG. 18 is activated to output internal address signal RRA. Multiplexer 11 selects and provides to row decoder 12 address signal RRA from internal address generation circuit 10.

In external control RAS generation circuit 6q, transfer gates 6qba and 6qbc are turned off, and transfer gates 6qaa, 6qab, and 6qbb are turned on. External row address strobe signal /RAS is provided to one input of OR circuit 6qad via transfer gate 6qaa. External column address strobe signal /CAS is applied to the other input of OR circuit 6ad via transfer gate 6qab and inverter 6qac.

When external row address strobe signal /RAS is pulled down to an L level when external column address strobe signal /CAS is at an H level, OR circuit 6qad has both the inputs receiving signals of an L level and thus outputs a signal of an L level. Therefore, signal ZRAS applied to output node Nq via transfer gate 6qbb is pulled down to an L level. In internal RAS generation circuit 6g of FIG. 18, AND circuit 6gb receives at one input a signal of an H level from one shot pulse generation circuit 6e to operate as a buffer. Therefore, internal row address strobe signal intZRAS is pulled down to an L level in synchronization with the fall of signal ZRAS. In response to the fall of internal row address strobe signal intZRAS, row selection is carried out according to address RRA1 provided from internal address generation circuit 10 via multiplexer 11.

When column address strobe signal /CAS is driven to an L level when row address strobe signal /RAS is at an L level, the output signal of inverter 6qac is pulled up to an H level. In response, the output signal of OR circuit 6qad is driven to an H level, signal ZRAS of output node Nq is pulled up to an H level, and internal row address strobe signal intZRAS attains an inactive state of an H level. In other words, the selected word line is driven to an inactive state in memory cell array 7. In response to the rise of internal row address strobe signal intZRAS, internal address generation circuit 10 increments or decrements the address by 1.

Figure 20:
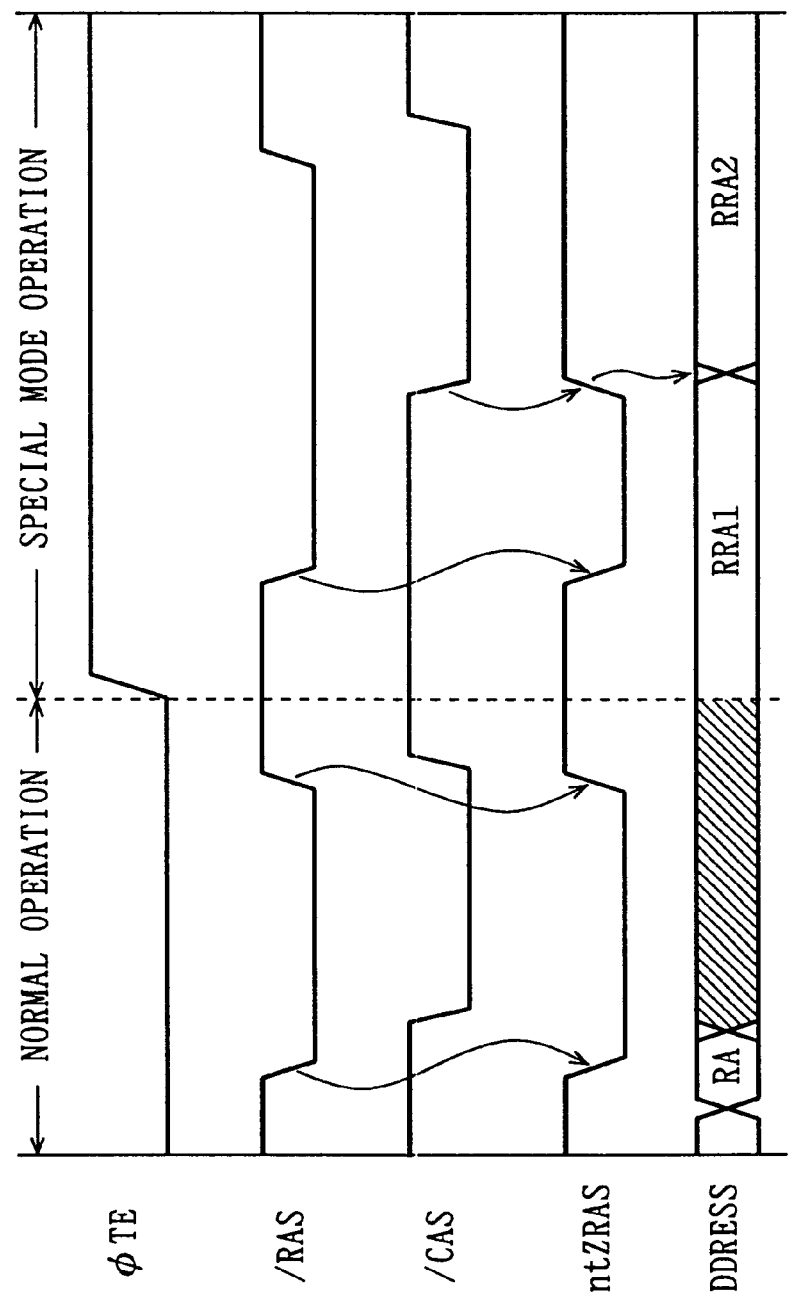
FIG. 20 is a signal waveform diagram representing an operation of the semiconductor memory device of FIG. 18.

It is appreciated from the waveform diagram of FIG. 20 that internal row address strobe signal intZRAS can be rendered active/inactive using both the two signals of /RAS and /CAS even in the case where the transition of external row address strobe signal /RAS cannot be speeded. Therefore, internal row address strobe signal intZRAS can be altered at a cycle shorter than the transition cycle of row address strobe signal /RAS. Word lines can sequentially be driven to a selected state at high speed using a general tester.

According to the fifth embodiment of the present invention, the internal row address strobe signal has its logic state altered according to the transition of a plurality of external control signals. Therefore, the internal row address strobe signal can be altered at a short cycle even in the case where each external control signal cannot be driven at high speed. Accordingly, word lines can be successively selected at high speed.

Sixth Embodiment

Figure 21:
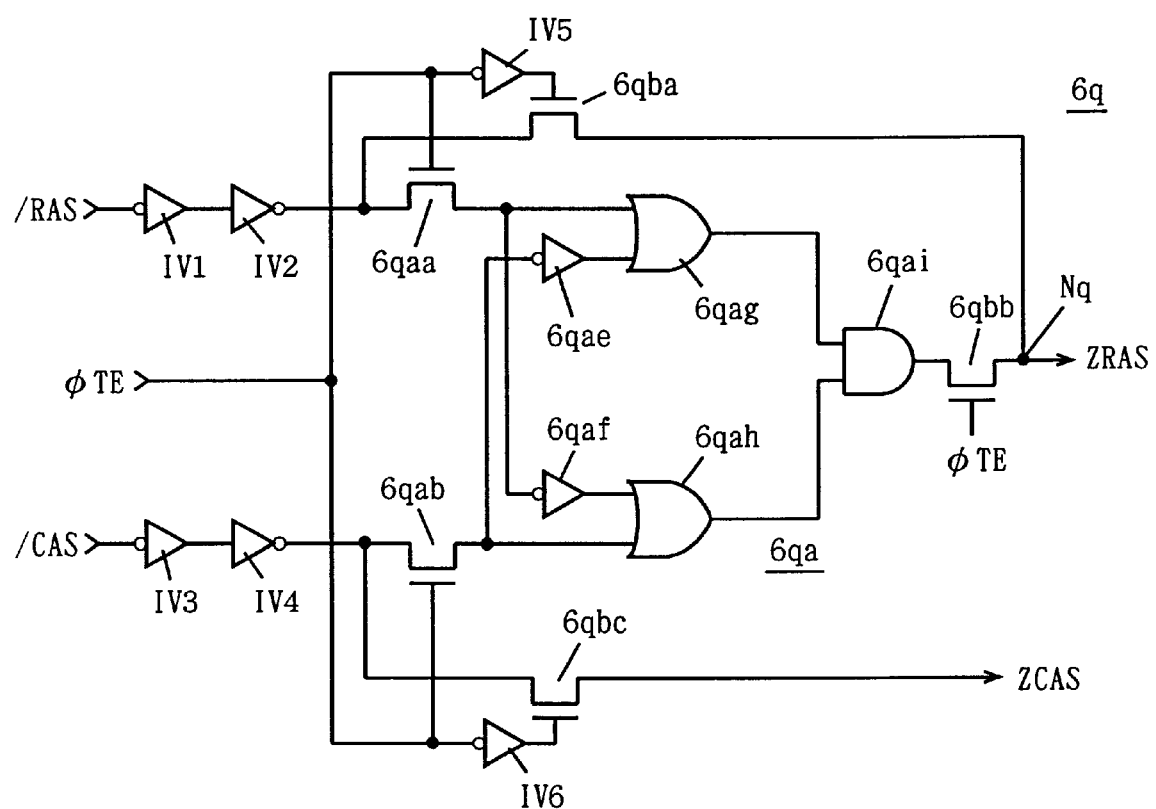
FIG. 21 shows a structure of a sixth embodiment of the present invention.

FIG. 21 shows a structure of the main portion of a semiconductor memory device according to a sixth embodiment of the present invention. In FIG. 21, the structure of external control RAS generation circuit 6q of FIG. 18 is shown. The remaining structure is similar to that of FIG. 18.

Figure 22:
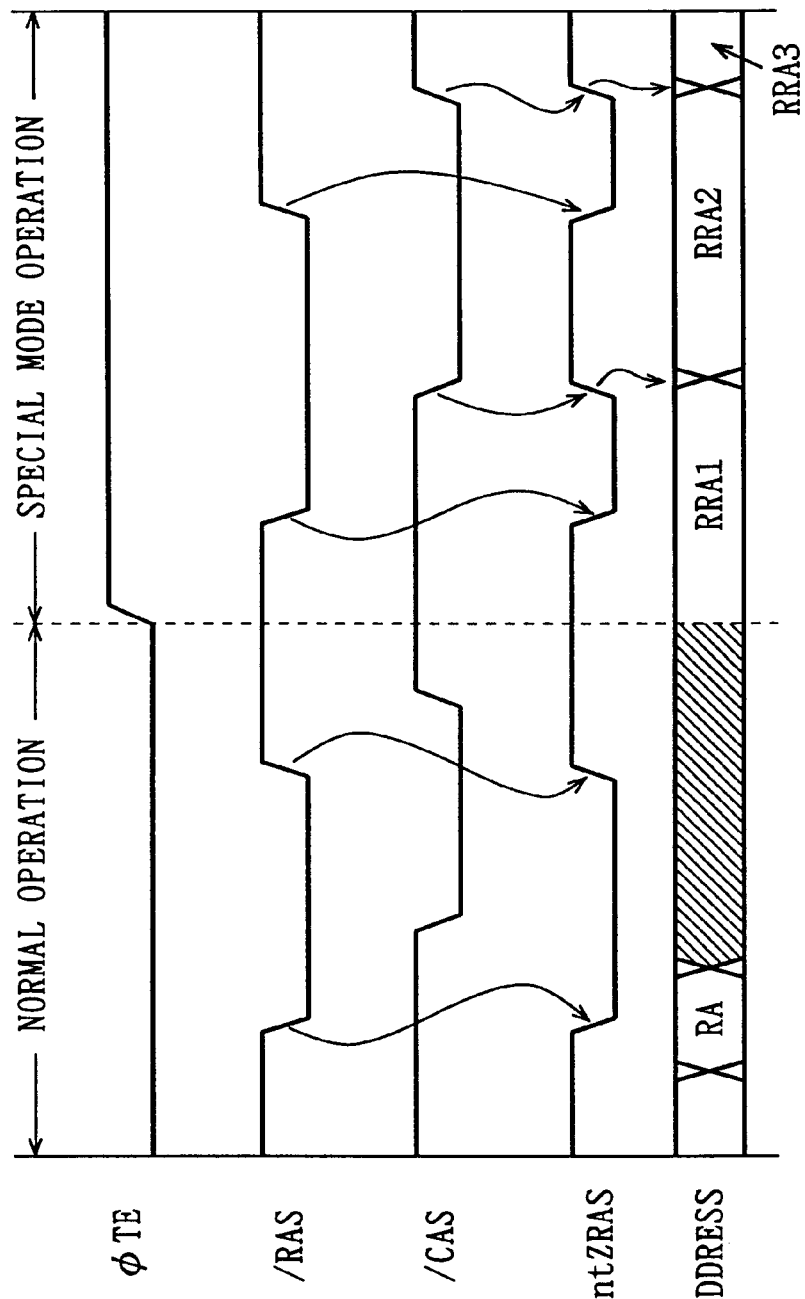
FIG. 22 is a signal waveform diagram representing an operation of a semiconductor memory device when the circuitry of FIG. 21 is employed.

Referring to FIG. 21, external control RAS generation circuit 6q includes, as combination circuit 6qa, an inverter 6qae for inverting the signal applied via transfer gate 6qab, an inverter 6qaf for inverting the signal applied via transfer gate 6qaa, an OR circuit 6qab receiving a signal applied via transfer gate 6qaa and a signal applied via inverter 6qae, an OR circuit 6qah for receiving the output signal of inverter 6qaf and the signal applied via transfer gate 6qab, and an AND circuit 6qai receiving the output signals of OR circuits 6qag an 6qah. The remaining structure is similar to that of the external control RAS generation circuit of FIG. 19. Corresponding components have same reference characters allotted, and description thereof will not be repeated. The operation of external control RAS generation circuit 6q shown in FIG. 21 will now be described with reference to FIGS. 18 and 22.

In a normal operation mode, special operation mode detection signal φTE is kept at an inactive state of an L level. Multiplexer 11 of FIG. 18 selects and provides to row decoder 12 address signal RA provided via address buffer 9. In external control RAS generation circuit 6q, transfer gates 6qaa, 6qab and 6qbb are all at an OFF state. In contrast, transfer gates 6qba and 6qbc are both ON. Therefore, internal signals ZRAS and ZCAS are altered according to external signals /RAS and /CAS.

When row address strobe signal /RAS is pulled down to an L level, signal ZRAS at output node Nq is pulled down to an L level. In response, internal row address strobe signal intZRAS from internal RAS generation circuit 6g shown in FIG. 18 is driven to an L level. Thus, row decoder 12 carries out row selection according to address signal RA provided via multiplexer 11 from address buffer 9. Then, column address strobe signal /CAS is pulled down to an L level to effect a column select operation. Data writing or reading is carried out with respect to the memory cell on the selected column.

When row address strobe signal /RAS is pulled up to an H level, signal ZRAS is pulled up to an H level. Therefore, internal row address strobe signal intZRAS also rises to an H level. Thus, one memory cycle is completed.

In a special operation mode, special operation mode detection signal φTE attains an H level. Transfer gates 6qaa, 6qab and 6qbb all attain an ON state. Transfer gates 6qba and 6qbc are both turned off. Internal address generation circuit 10 of FIG. 18 is activated to generate and provide to multiplexer 11 an internal address RRA. Multiplexer 11 selects and provides to row decoder 12 address signal RRA from internal address generation circuit 10, according to switching signal φMX.

When row address strobe signal /RAS and column address strobe signal /CAS both attain an H level, OR circuits 6qag and 6qah provide an output signal of an H level. Signal ZRAS output from AND circuit 6qai also attains an H level. In response, internal row address strobe signal intZRAS also attains an H level.

When row address strobe signal /RAS is pulled down to an L level, OR circuit 6qag has the signals at both inputs pulled down to an L level to output a signal of an L level. In response, signal ZRAS from AND circuit 6qai is driven to an L level, whereby internal row address strobe signal intZRAS is pulled down to an L level. In response to this fall of internal row address strobe signal intZRAS, row decoder 12 is activated. A row select operation is carried out according to address signal RRA1 provided from internal address generation circuit 10 via multiplexer 11.

At an elapse of a predetermined time (at least the time required till completion of a sense amplifier operation), column address strobe signal /CAS is pulled down to an L level. In response, inverters 6qae and 6qaf provide an output signal of an H level, and OR circuits 6qag and 6qh each output a signal of an H level. Therefore, signal ZRAS output from AND circuit 6qai is pulled up to an H level, and responsively internal row address strobe signal intZRAS is pulled up to an H level. Thus a row select operation is completed. Internal address generation circuit 10 has the output address signal incremented or decremented by 1 to alter the output address signal into address signal RRA2 in response to inactivation of internal row address strobe signal intZRAS.

Then, row address strobe signal /RAS is pulled up to an H level when column address strobe signal /CAS is at an L level. OR circuit 6qah has the signals at both the inputs attain an L level to output a signal of an L level. In response, signal ZRAS from AND circuit 6qai is pulled down to an L level whereby internal row address strobe signal intZRAS is driven to an L level. As a result, a row select operation is carried out again according to address signal RRA2 from internal address generation circuit 10.

When column address strobe signal /CAS is pulled up to an H level, OR circuits 6qag and 6qah both provide an output signal of an H level. In response, signal ZRAS output from AND circuit 6qai attains an H level, and internal row address strobe signal intZRAS is driven to an H level. Thus, a row select operation is completed. When this row select operation is completed, the address signal from internal address generation circuit 10 is altered to RRA3.

By using the external control RAS generation circuit shown in FIG. 21, internal row address strobe signal intZRAS is activated by transition of row address strobe signal /RAS. Internal row address strobe signal intZRAS is triggered by the transition of external column address strobe signal /CAS to be driven to an inactive state. Therefore, a row (word line) can be selected at a short cycle by reducing the cycle of internal row address strobe signal intZRAS even when one cycle of each of external signals /RAS and /CAS is long.

Seventh Embodiment

Figure 23:
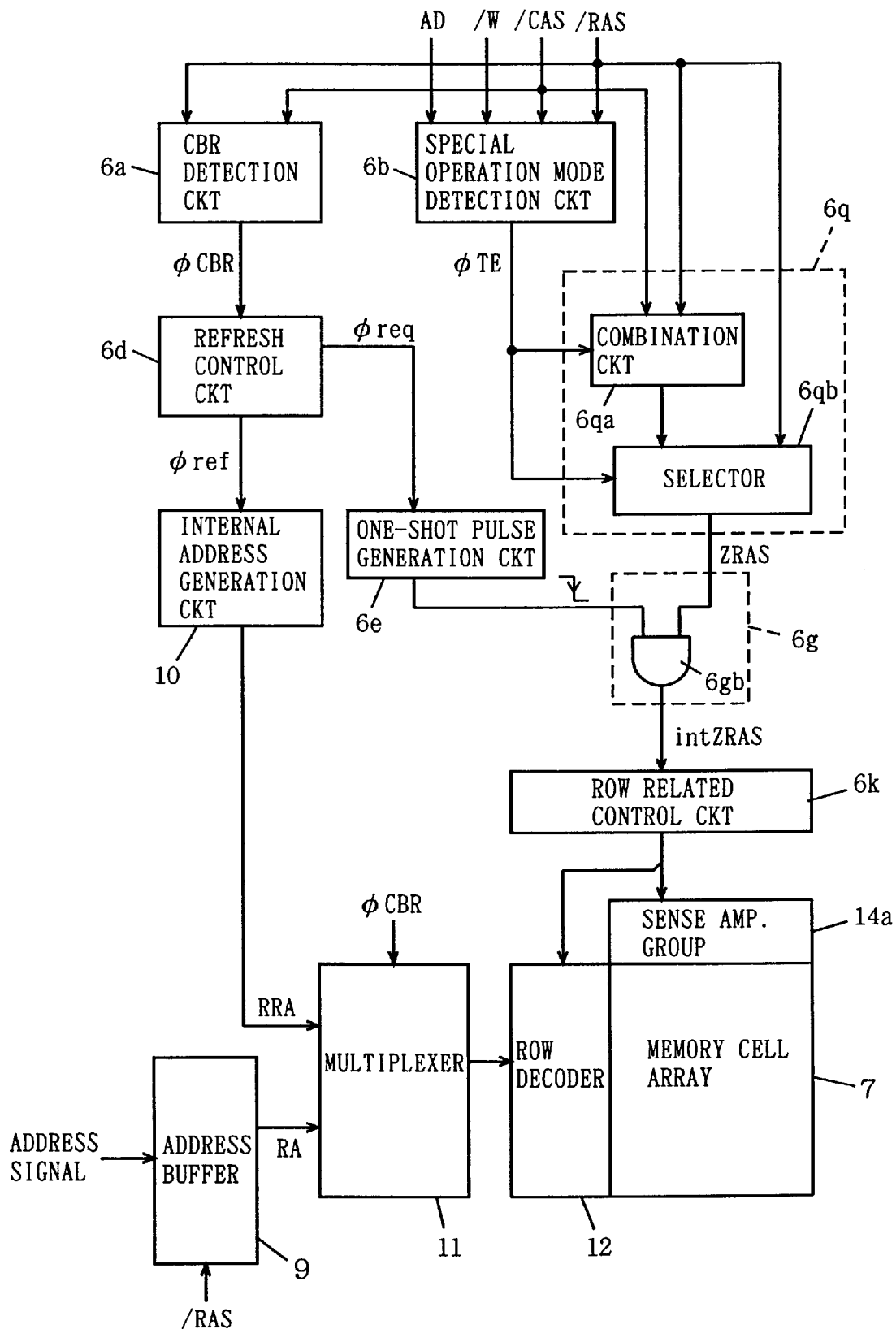
FIG. 23 schematically shows an entire structure of a semiconductor memory device according to a seventh embodiment of the present invention.

FIG. 23 schematically shows an entire structure of a semiconductor memory device according to a seventh embodiment of the present invention. In the semiconductor memory device shown in FIG. 23, multiplexer 11 selects and provides to row decoder 12 the address signal provided from address buffer 9 in a normal operation mode and in a special operation mode. Therefore, multiplexer 11 selects address signal RRA from internal address generation circuit 10 only when CBR detection signal (refresh designating signal) φCBR from CBR detection circuit 6a instructs a refresh mode. Also, internal address generation circuit 10 activates the internal refresh address counter to perform a count operation only when refresh designating signals φref from refresh control circuit 6d is active. The remaining structure is similar to that shown in FIG. 18. Corresponding elements have the same reference characters allotted, and detailed description thereof will not be repeated.

Figure 24:
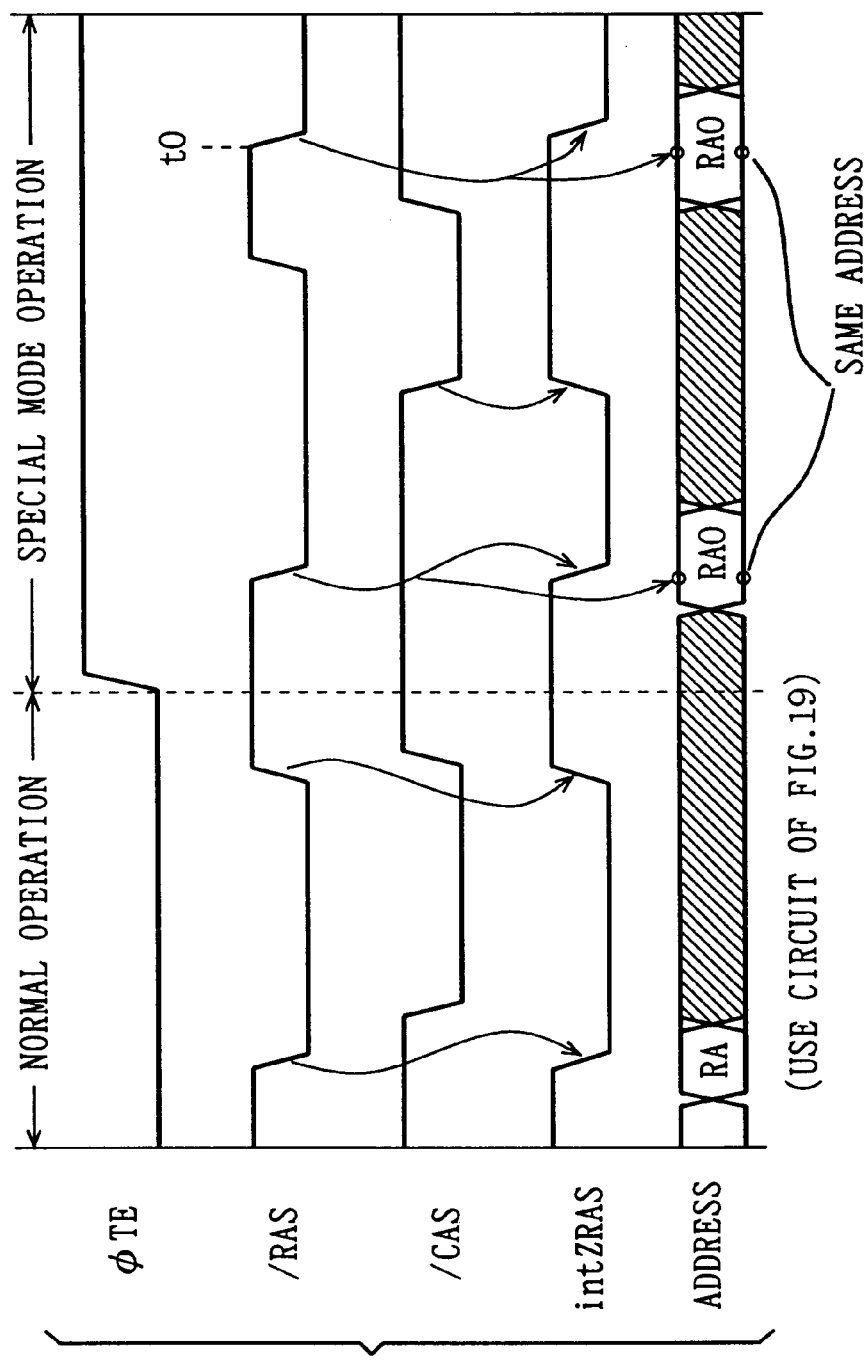
FIG. 24 is a signal waveform diagram representing an operation of the semiconductor memory device of FIG. 23.

The structure of the semiconductor memory device shown in FIG. 23 will now be described briefly. First, the operation in the case where the circuitry shown in FIG. 19 is employed as external control RAS generation circuit 6q will be described with reference to FIG. 24.

In a normal operation mode, external control RAS generation circuit 6q selects and provides to internal RAS generation circuit 6g externally applied row address strobe signal /RAS. External column address strobe signal /CAS is applied to column related control circuitry not shown. Therefore, an internal row address strobe signal intZRAS is generated according to external row address strobe signal /RAS. A row select operation is carried out according to address RA provided from address buffer 9 via multiplexer 11. Following this row select operation, a column select operation is carried out according to activation of column address strobe signal /CAS to write/read data to/from a selected memory cell. When one memory cycle is completed, row address strobe signal /RAS is pulled up to an H level. In response, internal row address strobe signal intZRAS is pulled up to an H level of an inactive state.

In a special operation mode, special operation mode detection signal φTE attains an active state of an H level. External control RAS generation circuit 6q generates a signal ZRAS according to transition of external row address strobe signal /RAS and column address strobe signal /CAS. Address buffer 9 selects the external address signal and provides the selected signal to row decoder 12 via multiplexer 11. Therefore, when row address strobe signal /RAS is pulled down to an L level, internal row address strobe signal intZRAS is driven to an L level. A row (word line) is driven to a selected state according to external address signal RA0. Then, when column address strobe signal /CAS is pulled down to an L level, internal row address strobe signal intZRAS is pulled up to an H level. Thus, a word line select operation is completed.

Then, row address strobe signal /RAS is pulled up to an H level. Internal row address strobe signal intZRAS maintains the state of an H level (refer to the circuit of FIG. 19) even when row address strobe signal /RAS is pulled up to an H level. Then, column address strobe signal /CAS is pulled up again to an H level.

Then, when external row address strobe signal /RAS is pulled down again to an L level at time t0, internal row address strobe signal intZRAS is driven to an active state of an L level again. Here, by providing the same address signal RA0 to address buffer 9, the same word line is driven to a selected state again. By repeating this operation, a word line to be selected can be specified according to the external address signal. Therefore, by driving the word line of the same address to a selected state repeatedly for a plurality of times, the degree of capacitive coupling between adjacent word lines can be increased to accelerate the disturb.

Figure 25:
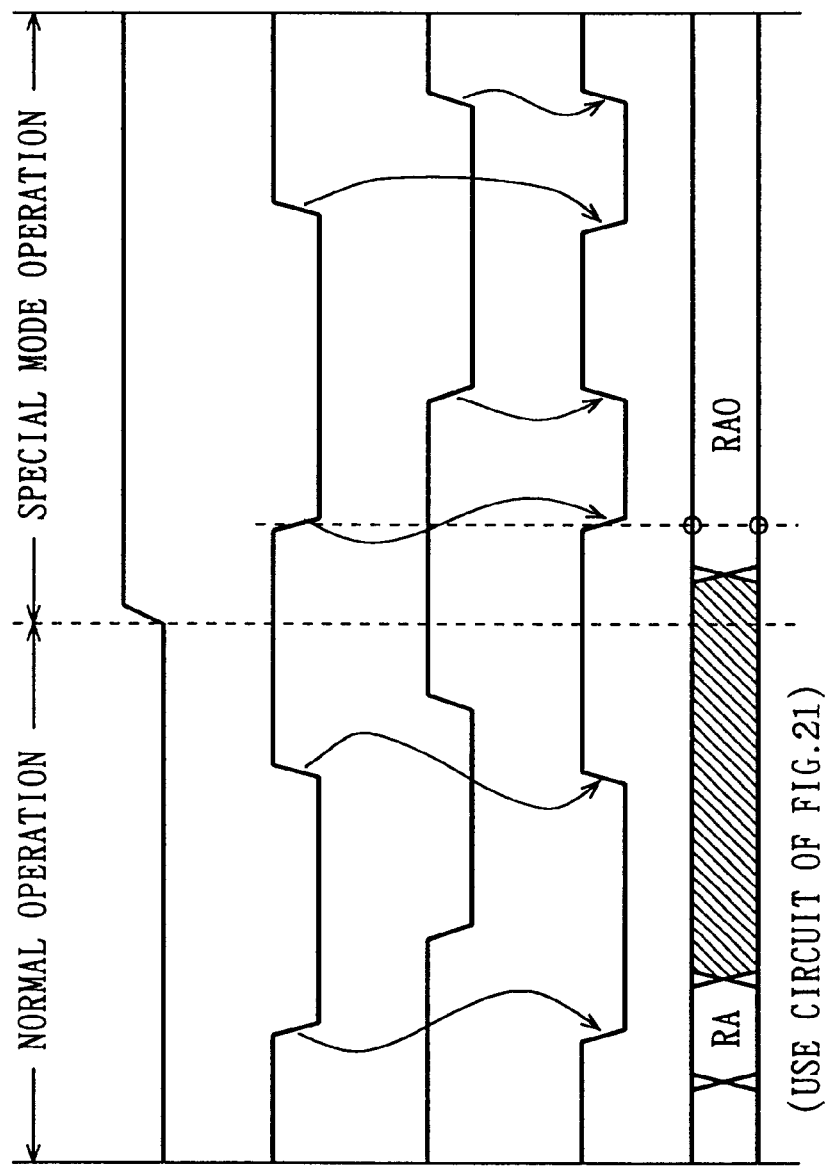
FIG. 25 is a waveform diagram representing an operation of a edification of the semiconductor memory device of FIG. 23.

FIG. 25 shows the operation when the circuit shown in FIG. 21 is employed as external control RAS generation circuit 6q of FIG. 23.

In a normal operation mode, special operation mode detection signal φTE attains an L level. Internal row address strobe signal intZRAS is generated according to external row address strobe signal /RAS. Also, address signal RA is taken according to external row address strobe signal /RAS and a row select operation is performed.

In a special operation mode, special operation mode detection signal φTE attains an active state of an H level. Multiplexer 11 selects address signal RA from address buffer 9 even in this state. When row address strobe signal /RAS is pulled down to an L level, address buffer 9 takes in an external address signal to generate an internal address signal RA0, which in turn is provided to row decoder 12 via multiplexer 11. Row decoder 12 carries out a row select operation under control of row related control circuitry 6k. Then, when column address strobe signal /CAS is pulled down to an L level, internal row address strobe signal intZRAS attains an inactive state of an H level.

In this state, address buffer 9 latches the previously applied address signal RA0 in response to row address strobe signal /RAS attaining an L level.

When row address strobe signal /RAS attains an H level, internal row address strobe signal intZRAS is pulled down to an L level. A row select operation (word line select operation) is carried out. Here, address buffer 9 continuously outputs address signal RA0 applied at the fall of row address strobe signal /RAS even when external row address strobe signal /RAS is pulled up to an H level. As a result, the word line of the same address is selected. Then, by repeating this operation for a required number of times, the same word line can be driven to a selected state repeatedly to accelerate the disturb.

According to the seventh embodiment of the present invention, an internal row address signal is generated to carry out a row select operation by incorporating an external address signal according to external row address strobe signal /RAS in a special operation mode. Therefore, the same word line can be repeatedly selected in a special operation mode to allow acceleration of the disturb. By applying an external address signal, identification of which word line attains a selected state can be made easily to ensure that the word line is driven to a selected state for a required number of times (the word lines of the first address to the final address each can be driven to a selected state by the same number of times).

Figure 26:
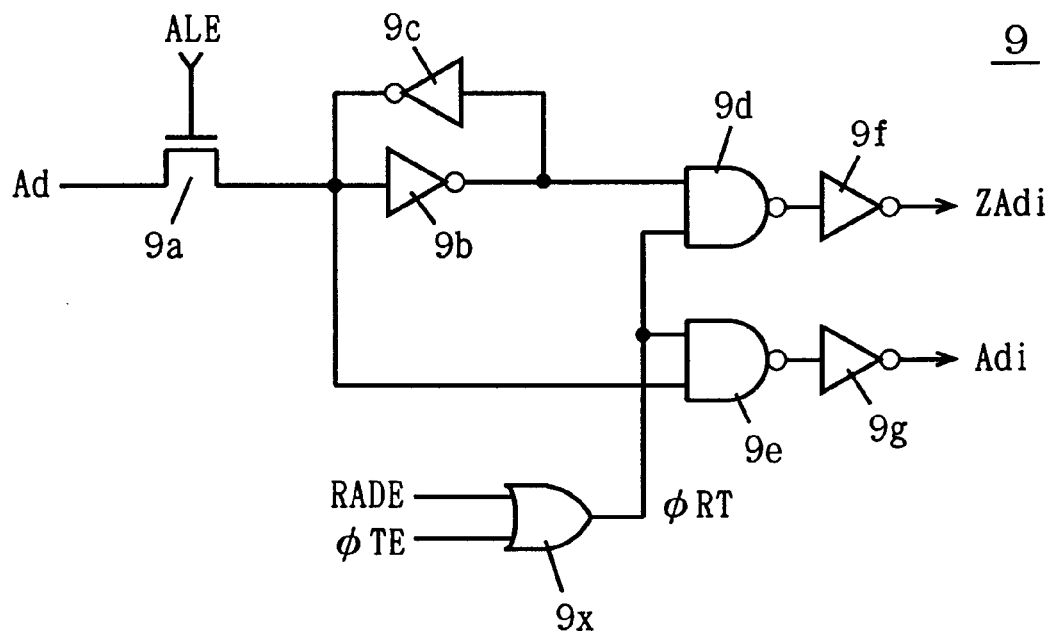
FIG. 26 shows an example of a structure of an address buffer used to realize the operation of FIG. 25.

FIG. 26 shows an example of a structure of a 1-bit address buffer circuit of address buffer 9 employed in the seventh embodiment of the present invention. Referring to FIG. 26, address buffer 9 includes a transfer gate 9a rendered conductive when an address latch enable signal ALE is active, for passing externally applied address signal bit Ad, inverters 9b and 9c for latching a signal applied via transfer gate 9a, an NAND circuit 9d receiving the output signal of inverter 9b at one input, a NAND circuit 9e for receiving the output signal of inverter 9c at one input, an inverter 9f for inverting the output signal of NAND circuit 9d to provide an internal address signal bit ZAdi, and an inverter 9g for inverting the output signal of NAND circuit 9e to output internal address signal bit Adi.

The output signal of OR circuit 9x receiving row address enable signal RADE and special operation mode detection signal φTE is provided to the respective other inputs of NAND circuits 9d and 9e. The operation of the address buffer circuit of FIG. 26 will now be described with reference to the waveform diagram of FIG. 27.

In a normal operation mode, special operation mode detection signal φTE is at an inactive state of an L level, and OR circuit 9x operates as a buffer circuit.

When row address strobe signal /RAS is at an inactive state of an H level, address latch enable signal ALE and row address enable signal RADE are both at an inactive state of an L level. When row address strobe signal /RAS is pulled down to an L level, address latch enable signal ALE is driven to an H level for a predetermined time. Transfer gate 9a conducts to take in external address Ad, which in turn is latched by the inverter latch of inverters 9b and 9c. Then, when the address signal latched by inverters 9b and 9c is ascertained, row address enable signal RADE is pulled up to an H level. Responsively, OR circuit 9x provides an output signal of an H level, and NAND circuits 9d and 9e function as inverters. Internal address signal bits Adi and ZAdi precharged to the L level are each driven to a logic level corresponding to external address signal bit Ad.

Row address enable signal RADE is at an active state of an H level while row address strobe signal /RAS is at an active state of an L level. Row address latch enable signal ALE is kept at an active state for a predetermined time when row address strobe signal /RAS is pulled down. Therefore, address buffer 9 attains a latch state at an elapse of a predetermined time from the fall of row address strobe signal /RAS to an L level. Then, internal row address strobe signal intZRAS is rendered active, whereby a row select operation is carried out according to the latched internal address signal RA.

When row address strobe signal /RAS attains an H level, row address enable signal RADE is pulled down to an L level of an inactive state. In response, output signal φRT of OR circuit 9x attains an L level. NAND circuits 9d and 9e each provide an output signal of an H level, and internal address signal bits Adi and ZAdi are precharged to an L level.

In a special operation mode, special operation mode detection signal φTE is set to an H level. In this state, output signal φRT of OR circuit 9x is maintained at an H level, so that NAND circuits 9d and 9e operate as inverters.

When external row address strobe signal /RAS is pulled down to an L level, address latch enable signal ALE is kept at an H level for a predetermined time, similar to a normal operation. Also, row address enable signal RADE is driven to an H level according to this external row address strobe signal /RAS. Therefore, external address signal Ad is latched when row address strobe signal /RAS is pulled down, whereby internal address signal RA1 is output. In a special operation mode, internal row address strobe signal intZRAS is driven to an L level in response to the fall of row address strobe signal /RAS. Then, internal row address strobe signal intZRAS is driven to an H level according to the transition of column address strobe signal /CAS not shown.

When row address strobe signal /RAS is pulled up to an H level again, internal row address strobe signal intZRAS is driven to an active state of an L level according to this transition. In this state, address buffer 9 maintains a state of latching internal address signal bits ZAdi and Adi. Address signal RA1 latched when row address strobe signal /RAS was pulled down at the previous cycle is continuously latched and output. Therefore, even when internal row address strobe signal intZRAS is driven to an L level in response to a rise of row address strobe signal /RAS, a row select operation can be carried out reliably according to an external address signal (latched address signal).

When row address strobe signal /RAS is pulled down to an L level after internal row address strobe signal intZRAS is pulled up to an H level, address latch enable signal ALE is driven to an H level. Then, row address enable signal RADE is driven to an active state of an H level. In this state, external address signal Ad (RA2) is taken into address buffer 9 by address latch enable signal ALE, whereby internal address signal RA2 is output. Thus, an external address signal is taken at every fall of row address strobe signal /RAS to carry out a row select operation according to internal row address strobe signal intZRAS rendered active at a cycle shorter than the cycle of row address strobe signal /RAS.

Address latch enable signal ALE and row address enable signal RADE can be provided using a one shot pulse generation circuit and an inversion buffer circuit respectively.

According to the seventh embodiment of the present invention, an external address signal is incorporated to generate an internal address signal, according to external row address strobe signal /RAS. An internal row address strobe signal intZRAS is generated according to a combination of the states of the external signals. The same word line can be driven to a selected state repeatedly to accelerate the disturb.

Eighth Embodiment

Figure 28:
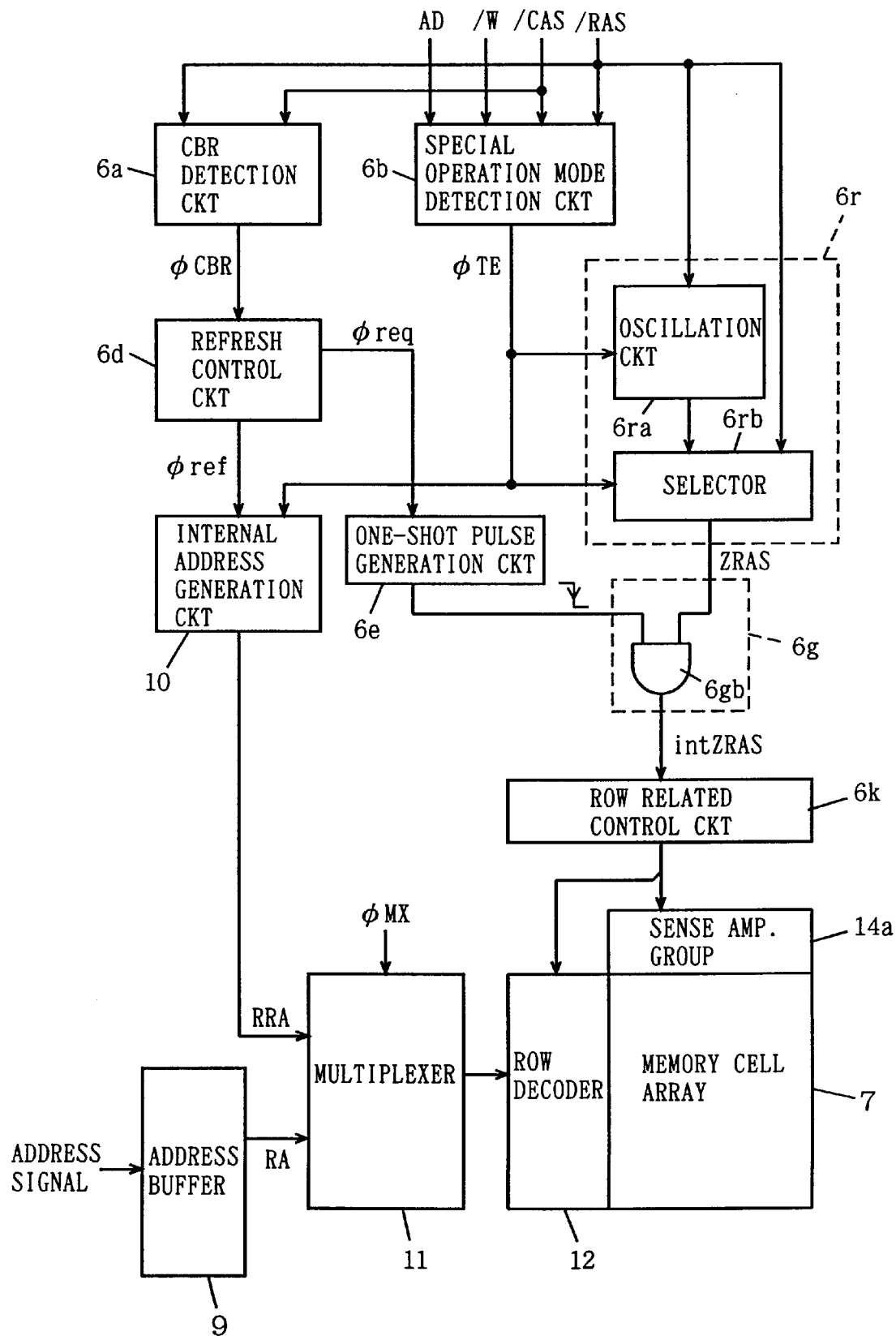
FIG. 28 schematically shows an entire structure of a semiconductor memory device according to an eighth embodiment of the present invention.

FIG. 28 schematically shows an entire structure of a semiconductor memory device according to an eighth embodiment of the present invention. The semiconductor memory device of FIG. 28 differs from the semiconductor memory device of FIG. 18 in the following point. More specifically, the semiconductor memory device of the eighth embodiment includes a RAS switching circuit 6r carrying out an oscillation operation according to an external row address strobe signal /RAS when special operation mode detection signal φTE is active, to output the oscillation signal as a signal ZRAS determining an internal row address strobe signal.

RAS switching circuit 6r includes an oscillation circuit 6ra started when special operation mode detection signal φTE attains an active state, to carry out an oscillation operation while external row address strobe signal /RAS is active, and a selector 6rb for selecting either the output signal of oscillation circuit 6ra or external row address strobe signal /RAS, according to special operation mode detection signal φTE, to output internal signal ZRAS. Selector 6rb selects the output signal of oscillation circuit 6ra when special operation mode detection signal φTE is active and selects external row address strobe signal /RAS when special operation mode detection signal φTE is inactive.

Although a gate circuit for invalidating external row address strobe signal /RAS when CBR detection signal φCBR is active is provided at a preceding stage of selector 6rb, this gate circuit is not illustrated for the sake of simplifying the drawing.

In the special operation mode of the semiconductor memory device of FIG. 28, internal row address strobe signal intZRAS is output according to an oscillation signal from oscillation circuit 6ra. Therefore, the word line select cycle can be reduced.

Figure 29:
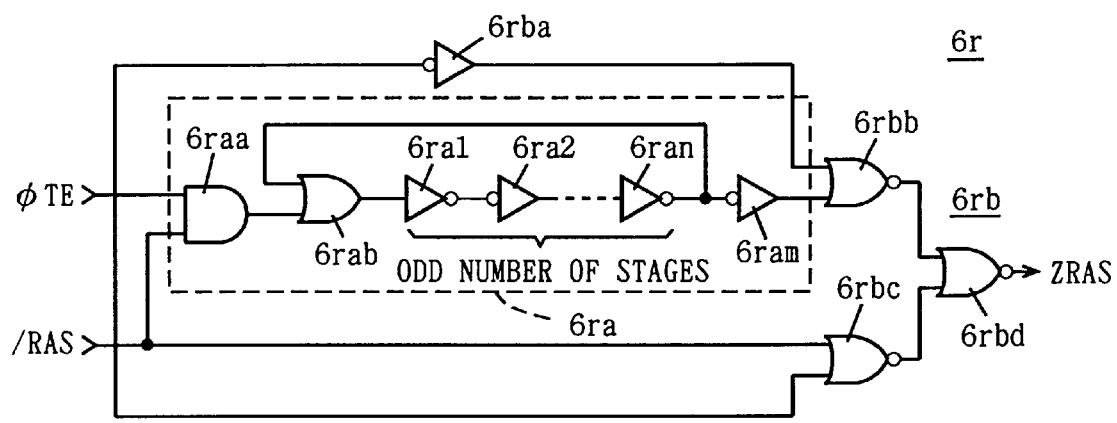
FIG. 29 shows an example of a structure of the RAS switching circuit of FIG. 28.

FIG. 29 shows an example of a structure of RAS switching circuit 6r of FIG. 28. Referring to FIG. 29, oscillation circuit 6ra includes an AND circuit 6raa for receiving special operation mode detection signal φTE and external row address strobe signal /RAS, an OR circuit 6rab for receiving the output signal of AND circuit 6raa at one input, an odd number of cascaded inverters 6ra 1–6ran receiving the output signal of OR circuit 6rab, and an inverter 6ram receiving the output signal of inverter 6ran. The output signal of inverter 6ran is provided to the other input of OR circuit 6rab.

Selector 6rb includes an inverter 6rba receiving special operation mode detection signal φTE, a NOR circuit 6rbb receiving an output signal of inverter 6rba and an output signal of inverter 6ram, a NOR circuit 6rbc receiving special operation mode detection signal φTE and external row address strobe signal /RAS, and a NOR circuit 6rbd receiving the output signals of NOR circuits 6rbb and 6rbc. Internal signal ZRAS output from NOR circuit 6rbd is provided to internal RAS generation circuit 6e shown in FIG. 28. The operation of RAS switching circuit 6r of FIG. 29 will now be described with reference to the waveform diagram of FIG. 30A.

In a normal operation mode, special operation mode detection signal φTE attains an inactive state of an L level, and inverter 6rba provides an output signal of an H level. Accordingly, the output signal of NOR circuit 6rbb is fixed to an L level, and NOR circuit 6rbd functions as an inverter. Also, NOR circuit 6rbc receives special operation mode detection signal φTE of an L level at one input to operate as an inverter. Therefore, internal signal ZRAS makes a transition according to external row address strobe signal /RAS. In response to internal signal ZRAS, internal row address strobe signal intZRAS makes a transition. In this state, the address signal is provided to row decoder 12 via address buffer 9 and multiplexer 11 (refer to FIG. 28).

When a special operation mode is specified, special operation mode detection signal φTE attains an active state of an H level. Since the output signal of NOR circuit 6*rbc* is fixed to an L level, and the output signal of inverter 6*rba* attains an L level, NOR circuit 6*rbb* functions as an inverter and NOR circuit 6*rbd* functions as an inverter for inverting the output signal of NOR circuit 6*rbb*.

In oscillation circuit 6*ra*, AND circuit 6*raa* functions as a buffer circuit when special operation mode detection signal φTE attains an H level. External row address strobe signal /RAS is passed through AND circuit 6*raa* to be provided to OR circuit 6*rab*.

When row address strobe signal /RAS attains an H level, AND circuit 6*raa* provides an output signal of an H level. In response, the output signal of OR circuit 6*ab* is fixed to an H level, whereby the oscillation operation of oscillation circuit 6*ra* is ceased. In this state, when the output signal of inverter 6*ran* attains an L level (an odd number of inverters 6*ra* 1–6*ran* are provided), responsively internal signal ZRAS is pulled up to an H level and internal row address strobe signal intZRAS attains an inactive state of an H level.

In response to activation of special operation mode detection signal φTE, internal address generation circuit 10 is activated to generate and provide to multiplexer 11 an internal address signal RRA as shown in FIG. 28. Multiplexer 11 selects and provides to row decoder 12 an internal address signal RAA from internal address generation circuit 10. When row address strobe signal /RAS is pulled down to an L level, AND circuit 6*raa* provides an output signal of an L level. OR circuit 6*rab* functions as a buffer. Therefore, a ring oscillator is formed of inverters 6*ra* 1–6*ran*, whereby oscillation circuit 6*ra* carries out an oscillation operation.

The output signal of OR circuit 6*rab* is pulled down to an L level in response to the fall of row address strobe signal /RAS. At an elapse of a predetermined time, the output signal of inverter 6*ram* is pulled down to an L level, and signal ZRAS is driven to an L level. In response, internal row address strobe signal intZRAS is pulled down to an L level. Thereafter, internal row address strobe signal intZRAS is driven to an L level at an oscillation cycle of oscillation circuit 6*ra*. A row select operation is carried out according to an address signal from internal address generation circuit 10. Thus, word lines can be driven to a selected state internally at a short cycle.

When row address strobe signal /RAS is driven to an H level, the output signal of AND circuit 6*raa* is pulled up to an H level. In response, the output signal of OR circuit 6*ab* is fixed at an H level. The oscillation operation of oscillation circuit 6*ra* is stopped. Therefore, a plurality of word lines can be sequentially driven to a selected state within one cycle of external row address strobe signal /RAS.

[Modification 1]

FIG. 30B shows the operational sequence of a modification 1 according to the eighth embodiment of the present invention.

Referring to FIG. 30B, in a special operation mode, address update of internal address generation circuit 10 is carried out according to external row address strobe signal /RAS. Therefore, the row of the same address is driven to a selected state while a row select operation is carried out according to internal row address strobe signal intZRAS in a special operation mode to accelerate the disturb. In this case, the structure shown in FIG. 10 can be employed as internal address generation circuit 10. The precharge of address buffer 9 does not have to be taken into consideration. A row (word line) of the same address can be selected reliably in 1 cycle of row address strobe signal /RAS.

[Modification 2]

Figure 31:
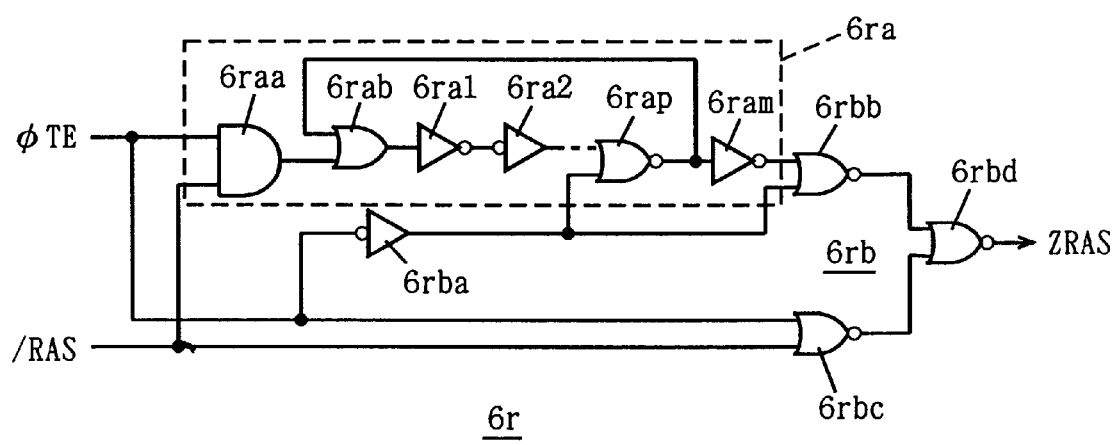
FIG. 31 shows a structure of a modification of the eighth embodiment of the present invention.

FIG. 31 shows a structure of another modification 2 of the eighth embodiment of the present invention. More specifically, FIG. 31 shows the modified structure of RAS switching circuit 6*r* of FIG. 28. RAS switching circuit 6*r* of FIG. 31 differs from the RAS switching circuit of FIG. 29 in the following point. More specifically, in oscillation circuit 6*ra* of FIG. 31, an NOR circuit 6*rap* is provided instead of inverter 6*ran* shown in FIG. 29. The output signal of NOR circuit 6*rap* is provided to the next inverter 6*ram*. NOR circuit 6*rap* receives the output signal of inverter 6*rba* at one input and the output signal of the inverter of the preceding stage (not shown) at the other input.

When special operation mode detection signal φTE attains an inactive state of an L level, inverter 6*rba* provides an output signal of an H level, and the output signals of NOR circuits 6*rap* and 6*rbb* are fixed to an L level. As a result, the oscillation operation of oscillation circuit 6*ra* is stopped. When special operation mode detection signal φTE attains an active state of an H level, inverter 6*rba* provides an output signal of an L level to operate NOR circuit 6*ap* as an inverter. Oscillation circuit 6*ra* functions as the ring oscillator formed of an odd number of stages of inverters to carry out an oscillation operation.

By using an NOR circuit 6*rap* receiving an inverted version of special operation mode detection signal φTE at one input in oscillation circuit 6*ra* as shown in FIG. 31, the oscillation operation of oscillation circuit 6*ra* can be stopped in a mode other than the special operation mode. Therefore, power consumption can be reduced. The remaining structure and operation are similar to those of the RAS switching circuit of FIG. 29. An operation similar to that of the RAS switching circuit of FIG. 29 is carried out in a normal operation mode and a special operation mode.

According to the eighth embodiment of the present invention, an incorporated oscillation circuit carrying out an oscillation operation when a special operation mode is specified has the oscillation signal thereof used as an internal row address strobe signal. Therefore, word lines can be sequentially driven to a selected state speedily at a short cycle even when the external signal cannot be altered in a short cycle. Although the output signal of the incorporated refresh address counter is used as the address signal, the same word line can be repeatedly driven to a selected state by controlling the count value by external row address strobe signal /RAS of the incorporated refresh address counter. Therefore, the disturb can be accelerated.

Ninth Embodiment

FIG. 32 is a waveform diagram representing an operation of the semiconductor memory device according to the ninth embodiment of the present invention. According to the semiconductor memory device of the ninth embodiment, in the special operation mode, an external address signal is taken in according to an external row address strobe signal /RAS to generate an internal row address signal and a row select operation is carried out according to the output signal of the oscillation circuit. Therefore, the word line corresponding to the row specified by the external address is repeatedly selected during activation of row address strobe signal /RAS. The address buffer attains a latching state when row address strobe signal /RAS attains an active state of an L level. The same word line can be repeatedly selected according to an external address signal at each activation of internal row address strobe signal intZRAS.

Figure 33:
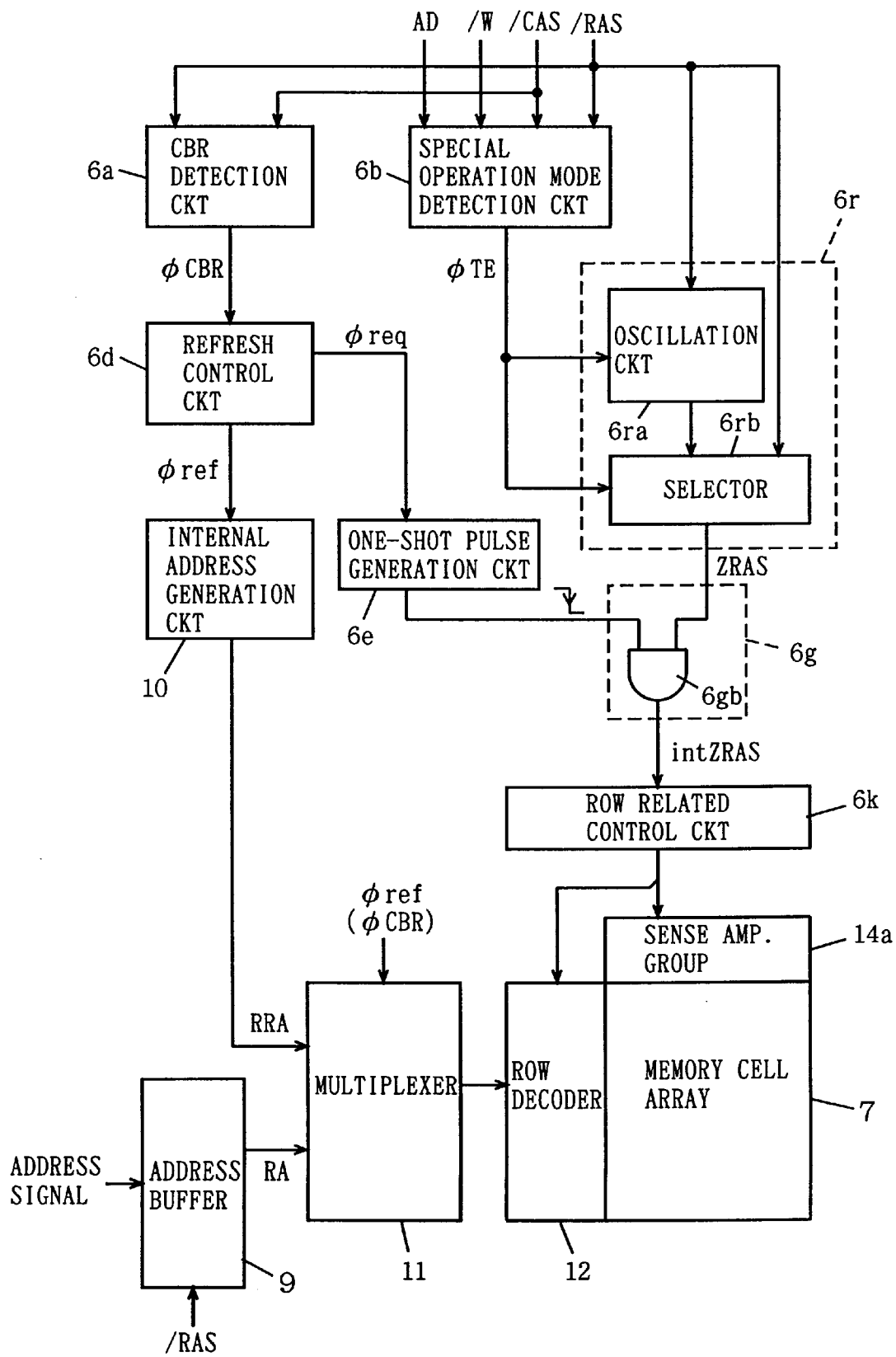
FIGS. 33 and 34 schematically show an entire structure of a semiconductor memory device according to ninth and tenth embodiments, respectively, of the present invention.

FIG. 33 schematically shows an entire structure of a semiconductor memory device according to the ninth embodiment of the present invention. In the semiconductor memory device of FIG. 33, internal address generation circuit 10 updates the address before or after each refresh operation when refresh designating signal φref from refresh control circuit 6d is active. Multiplexer 11 selects the address signal of either internal address generation circuit 10 or address buffer 9, according to refresh designating signal φref from refresh control circuit 6d or CBR detection signal (φCBR) from CBR detection circuit 6a. Address buffer 9 takes in an external address signal to generate an internal address signal RA, according to external row address strobe signal /RAS. The remaining structure is similar to that of the semiconductor memory device of FIG. 28.

By employing the semiconductor memory device of FIG. 33, internal row address strobe signal intZRAS is activated according to an oscillation signal output from oscillation circuit 6ra in RAS switching circuit 6r when a special operation mode is specified. In the special operation mode, multiplexer 11 selects and provides to row decoder 12 the address signal RA from address buffer 9. Thus, the word line of the same address can be repeatedly selected for a plurality of times in the special operation mode.

According to the ninth embodiment of the present invention, an external address signal is taken in according to an external address strobe signal and an internal row address strobe signal is generated according to an output signal of an internal oscillation circuit for carrying out a row select operation in the special operation mode. Therefore, the same word line can be driven to a selected state repeatedly for a plurality of times, to accelerate the disturb. Since the word line driven to a selected state can easily be detected externally, all the word lines can be driven to a selected state for a predetermined number of times reliably. By selecting each of the word lines from the first address to the last address once, all the word lines can reliably be selected for a predetermined number of times. Since the oscillation cycle of the internal oscillation circuit can be identified in advance in this case, the number of times for which the same word line is driven to a selected state can be modified during one-time activation of row address strobe signal /RAS by adjusting the activation period of row address strobe signal /RAS.

Tenth Embodiment

Figure 34:
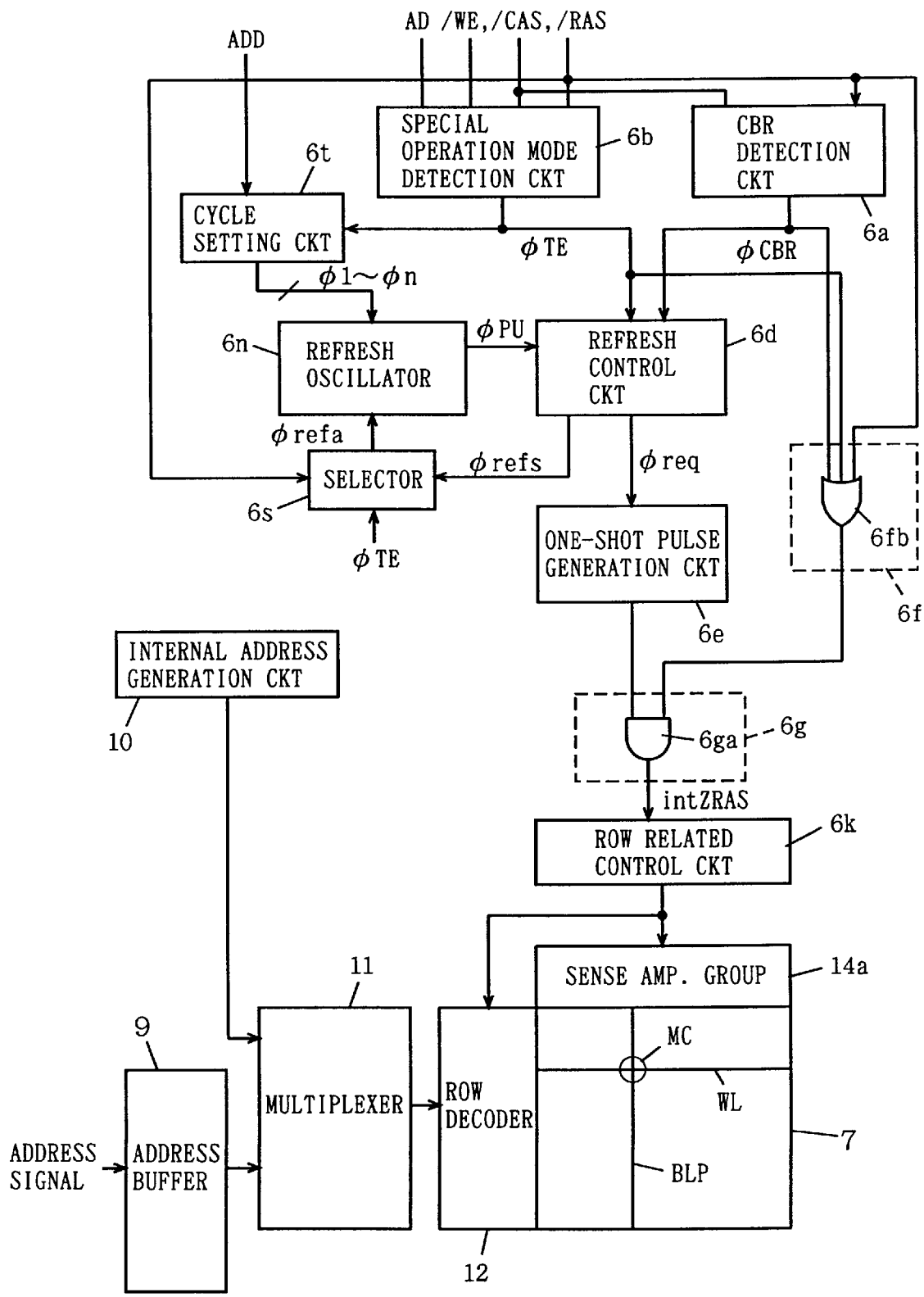

FIG. 34 schematically shows a structure of a semiconductor memory device according to a tenth embodiment of the present invention. The semiconductor memory device shown in FIG. 34 includes a refresh oscillator 6n for oscillating at a predetermined cycle, a selector 6s selecting either external row address strobe signal /RAS or self refresh designating signal φrefs from refresh control circuit 6d, according to special operation mode detection signal φTE from special operation mode detection circuit 6b, to provide the selected signal to refresh oscillator 6n, and a cycle setting circuit 6t activated when special operation mode detection signal φTE from special operation mode detection circuit 6b is activated, to decode externally applied particular address bit signal ADD to output cycle setting signals φ1–φn for setting the oscillation cycle of refresh oscillator 6n. The remaining structure is similar to that shown in FIG. 14. With corresponding components of the same reference characters allotted, detailed description thereof will not be repeated. The internal structure of refresh control circuit 6d of FIG. 34 is similar to that of FIG. 15.

According to the structure shown in FIG. 34, the oscillation cycle of pulse signal φPU from refresh oscillator 6n determining the refresh cycle in a self refresh mode can be modified in the special operation mode. Therefore, the word lines can be driven to a selected state in the special operation mode at a cycle shorter than the self refresh cycle.

As to the control of internal address generation circuit 10, address buffer 9, and multiplexer 11, the generation of the internal address signal can be controlled by external row address strobe signal /RAS in the special operation mode. Similarly to a normal self refresh operation, the internal address can be updated according to internal row address strobe signal intZRAS.

Figure 35:
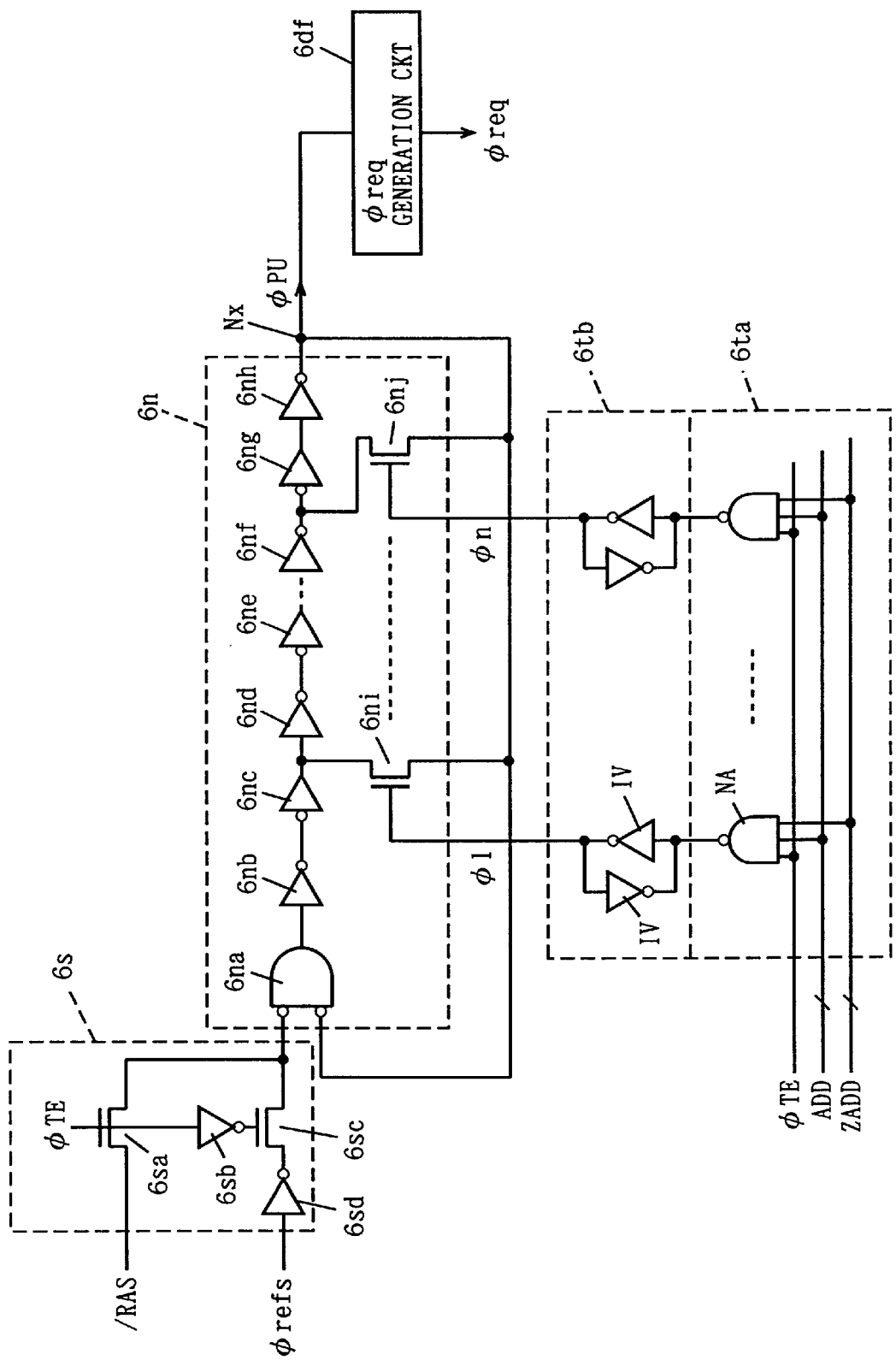
FIG. 35 shows an example of a structure of the refresh oscillator, the selector, and the cycle setting circuit of FIG. 34.

FIG. 35 shows an example of a structure of refresh oscillator 6n, selector 6s and cycle setting circuit 6t of FIG. 34. Referring to FIG. 35, selector 6s includes a transfer gate 6sa formed of an n channel MOS transistor rendered conductive when special mode detection signal φTE is active, to pass external row address strobe signal /RAS, and a transfer gate 6sc formed of an n channel MOS transistor rendered conductive when special operation mode detection signal φTE applied via inverter 6sb attains an H level (active state), to pass self refresh designating signal φrefs provided via inverter 6sd. The output node of transfer gates 6sa and 6sc is coupled to one input of NOR circuit 6na in refresh oscillator 6n.

Refresh oscillator 6n includes an even number of stages of cascaded inverters 6nb–6nh receiving the output signal of NOR circuit 6na, and transfer gates 6ni–6nj formed of n channel MOS transistors provided corresponding to each of cycle setting signals φ1–φn to select and connect to the other input of NOR circuit 6na the output signal of the even-numbered inverters 6nc, . . . , 6nf of a series of inverter 6nb–6nh. Output node Nx of refresh oscillator 6n is connected to the other input of NOR circuit 6na.

Cycle setting circuit 6t includes a decode circuit 6ta rendered active when special operation mode detection signal φTE is active, to decode a predetermined address signal bit ADD and an inverted predetermined address signal bit ZADD, and a latch circuit 6tb for latching the output signal of decode circuit 6te. Decode circuit 6ta includes a NAND circuit NA receiving address signal bits ADD and ZADD of a combination predetermined for each cycle select signal. Latch circuit 6tb includes an inverter latch provided corresponding to NAND circuit NA of decode circuit 6ta. The inverter latch includes inverters IV having the inputs and the outputs cross-connected. Cycle setting signals φ1–φn are provided from each inverter latch.

Decode circuit 6ta has all the output signals fixed to an H level when special operation mode detection signal φTE is inactive. Therefore, all cycle setting signals φ1–φn from latch circuit 6tb attain an L level, and transfer gates 6ni–6nj are all turned off in refresh oscillator 6n.

When self refresh designating signal φrefs attains an active state of an H level to instruct a self refresh mode in a normal refresh operation mode, a signal of an L level is provide to NOR circuit 6na via inverter 6sd and transfer gate 6s. This NOR circuit 6na functions as an inverter in this state, so that refresh oscillator 6n functions as a ring oscillator to oscillate at a predetermined cycle. φreq generation circuit 6df counts oscillation signal φPU output from refresh oscillator 6n to provide refresh request signal φreq every time the count arrives at a predetermined value. Therefore, a self refresh operation is carried out at a predetermined cycle.

When the special operation mode is specified, transfer gate 6sa conducts in selector 6s, whereby row address strobe signal /RAS is provided to one input of NOR circuit 6na. In the special operation mode, decode circuit 6ta is enabled to carry out a decode operation. When any output signal of NAND circuits NA is pulled down to an L level, any one of output signals φ1–φn of latch circuit 6tb rises to an H level. This causes any one of transfer gates 6ni–6nj to be turned on. The output signal of the inverter provided corresponding to the any one of transfer gates 6ni–6nj is selected to be provided to the other input of NOR circuit 6na.

When any one of cycle setting signals φ1–φn is driven to a selected state, refresh oscillator 6n carries out an oscillation operation at a cycle shorter than that of a self refresh mode. Therefore, refresh request signal φreq from φreq generation circuit 6df is driven to an active state at a cycle shorter than the self refresh cycle, and an internal row select operation is carried out.

When row address strobe signal /RAS is pulled up to an H level in the special operation mode, the output signal of NOR circuit 6na is fixed to an L level. The oscillation operation of oscillator 6n is stopped. Therefore, the oscillation operation of refresh oscillator 6n can be controlled by an external row address strobe signal /RAS. An internal row select operation can be triggered by transition of an external control signal and carried out, similar to the previous first to ninth embodiments.

φreq generation circuit 6df of FIG. 35 corresponds to counter 6dc and refresh request generation circuit 6de of FIG. 15.

Figure 36:
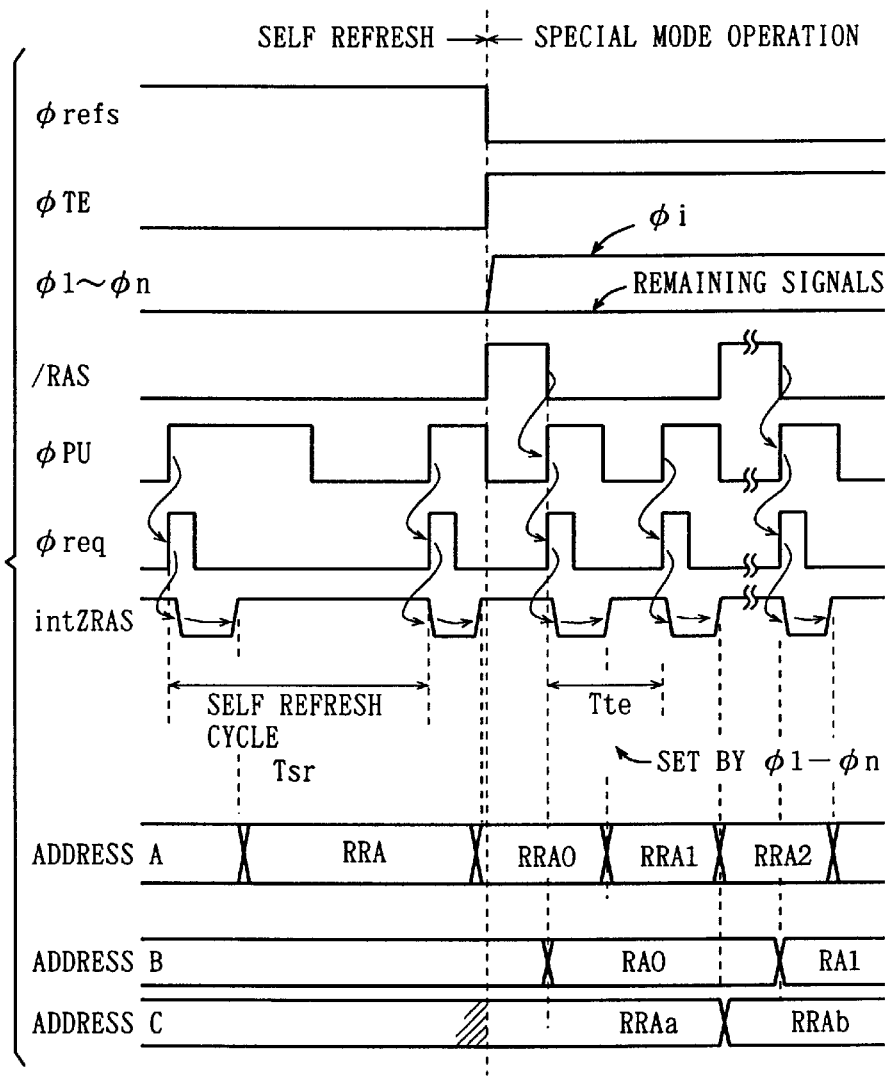
FIG. 36 is a signal waveform diagram representing an operation of the semiconductor memory device according to the tenth embodiment of the present invention.

FIG. 36 is a waveform diagram showing an operation of a semiconductor memory device according to the tenth embodiment of the present invention. The operation of the semiconductor memory device of the tenth embodiment will now be described.

In a self refresh mode, self refresh designating signal φrefs attains an active state of an H level, while special operation mode designating signal φTE is at an inactive state of an L level. In response, cycle setting signals φ1–φn are all at an L level. In this state, refresh oscillator 6n oscillates at a constant cycle by the ring oscillator of NOR circuit 6na and inverters 6nb–6nh. According to oscillation signal φPU, φreq generation circuit 6ef provides a refresh request signal φreq.

A case where φreq generation circuit 6ef provides a refresh request signal φreq in response to a rise of oscillation signal φPU is now considered (when pulse count value is 1). First, internal row address strobe signal intZRAS is at an active state of an L level for a predetermined time in response to a rise of oscillation signal φPU. The data of a memory cell is refreshed internally. In this case, address signal RRA generated by the internal address generation circuit is used as a refresh address signal. Refresh request signal φreq is generated at each rise of oscillation signal φPU. Thus, a self refresh operation is carried out with the constant cycle Tsr as a self refresh cycle.

In the special operation mode, self refresh designating signal φrefs attains an L level, and special operation mode detection signal φTE attains an H level. An external row address strobe signal /RAS is provided to refresh control circuit 6n via selector 6s. When the special operation mode is specified, any one of cycle setting signals φ1–φn is pulled up to an H level by decode circuit 6ta and latch circuit 6tb. The remaining cycle setting signals are kept at an L level.

Accordingly, the oscillation cycle of refresh oscillator 6n is set shorter than that for self refresh. (Cycle setting is carried out in the mode entry cycle for setting the special operation mode).

By pulling down row address strobe signal /RAS to an L level, refresh oscillator 6n is activated to carry out an oscillation operation. The cycle of oscillation signal φPU output from oscillator 6n is set shorter than that of self refresh. Cycle Tte in which refresh request signal φreq output from φreq generation circuit 6df is driven to an active state in response to a rise of oscillation signal φPU is set shorter than the self refresh cycle. In response to activation of refresh request signal φreq, internal row address strobe signal intZRAS is driven to an active state of an L level for a predetermined time, whereby a word line select operation is carried out.

By setting the cycle at which refresh request signal φreq is output with cycle setting signals φ1–φn, the number of times a word line select operation is to be carried out in one RAS cycle (when signal /RAS is at an L level) can be set to a desired number of times.

In the special operation mode, any of the aforementioned methods can be used to provide the address for word line selection. In other words, address signal RRA from an internal address generation circuit can be used as shown by address A to sequentially alter the selected word line for each word line selection. In this case, the cycle of each word line selection can be reduced. Accordingly, each word line can be driven to a selected state for a plurality of times within the same testing time.

Also, as shown by address B, an external address can be taken according to row address strobe signal /RAS to generate an internal row address signal RA, to carry out word line selection. In this case, the external address signal is taken by row address strobe signal /RAS, so that the same word line is driven to a selected state for a plurality of times within one RAS cycle.

Furthermore, as shown by address C, the address update timing of the internal address generation circuit can be controlled by external row address strobe signal /RAS. In this case, word line selection is carried out according to address RRA from the internal address generation circuit in one RAS cycle.

Any one of addresses A, B and C can be appropriately used for word line selection in the special operation mode. The structure of generating addresses A–C can be implemented by any of the structures of the aforementioned embodiments.

According to the tenth embodiment of the present invention, the oscillation cycle of an oscillator for self refresh used for defining a self refresh cycle in a self refresh operation can be modified in a special operation mode. By controlling the activation/inactivation of the oscillator for self refresh with an external row address strobe signal /RAS in the special operation mode, a row select operation can be repeated at a short cycle internally, triggered by an external control signal. Thus, an advantage similar to that of the previous first to ninth embodiments can be achieved. Only the oscillation cycle of the oscillator for self refresh is altered. Therefore, a circuit structure with any extra oscillator and the like is not required. Thus, the circuit configuration is simplified.

Other Applications

In the above description, the special operation mode is set by the condition of WCBR+ address key. The super Vcc condition in which a particular signal input terminal is set to a voltage level extremely higher than that used for a normal operation can further be combinedly employed.

For a memory device having an internal row address strobe signal generated under a combination of the status of a plurality of external control signals, the semiconductor memory device may not support a self refresh mode, but allow operation of the CBR refresh mode.

According to the present invention, an internal row select designating signal is altered, triggered by transition of at least one external signal. Since a signal differing from the corresponding external control signal is used for inactivating the row select designating signal, the row select designating signal can be rendered active/inactive at a cycle shorter than the cycle for the external access designating signal. A row select operation can be carried out internally at a short cycle.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of memory cells arranged in a matrix of rows and columns, comprising:

activation circuitry for generating an internal row select designating signal according to an external control signal when an applied special operation mode designating signal is active; and row related circuitry activated in response to activation of said row select designating signal, for carrying out an operation related at least to selection of a row of said plurality of memory cells;

said activation circuitry comprising a combination circuit responsive to said special operation mode designating signal being active, for receiving a plurality of external control signals as said external control signal, and for generating the internal row select designating signal in accordance with a combination of logic states of received external control signals, to control activation and deactivation of said row related circuitry.

2. The semiconductor memory device according to claim 1, wherein said combination circuit comprises means for altering the logic state of said internal row select designating signal according to a change in the combination of the logic states of said received control signals.

3. The semiconductor memory device according to claim 1, wherein said combination circuit comprises means for activating said internal row select designating signal in response to a first combination of the logic states of said received control signals, and inactivating said internal row select designating signal in response to a second combination differing from said first combination of the logic states of said received control signals.

4. The semiconductor memory device according to claim 1, wherein said combination circuit comprises means for activating said internal row select designating signal in response to transition from a first combination to a second combination of logic states of said received control signals, for inactivating said internal row select designating signal in response to a transition from said second combination to a third combination of the logic states of said received control signals, for activating said internal row select designating signal in response to transition from said third combination to a fourth combination of the logic states of said received control signals, and for inactivating said internal row select designating signal in response to transition from said fourth combination of said logic states to said first combination.

5. The semiconductor memory device according to claim 1, wherein said external control signals include a first access designation signal and a second access designation signal, and wherein said combination circuit includes means for activating said internal row select designation signal in response to activation of said first access designation signal and for inactivating said internal row select designation signal in response to activation of said second access designation signal.

6. The semiconductor memory device according to claim 1, wherein said external control signals include a first access designation signal and a second access designation signal, and wherein said combination circuit includes means for activating said internal row select designation signal in response to transition of said first access designation signal and for inactivating said internal row select designation signal in response to transition of said second access designation signal.

7. The semiconductor memory device according to claim 1, wherein said row related circuitry comprises circuitry responsive to said internal row select designating signal for generating an internal address signal used in the row selection when said special operation mode designating signal is active.

8. The semiconductor memory device according to claim 1, wherein said row related circuitry comprises circuitry responsive to activation of an access designating signal included in the external control signals for taking an external address signal to generate an internal address signal used in the row selection when said special operation mode designating signal is active.

9. The semiconductor memory device according to claim 1, wherein said row related circuitry comprises circuitry for generating an address signal in accordance with an access designating signal included in the external control signals when said special operation mode designating signal is active.

10. A semiconductor memory device having a plurality of memory cells arranged in a matrix of rows and columns, comprising:

activation circuitry for generating an internal row select designating signal according to an external control signal when an applied special operation mode designating signal is active; and row related circuitry activated in response to activation of said row select designating signal, for carrying out an operation related at least to selection of a row of said plurality of memory cells;

wherein said activation circuitry includes a first gate enabled in response to activation of said special operation mode designating signal, for buffering and transmitting the external control signal, an oscillator activated in response to activation of the control signal received from said first gate, for performing an oscillation, a second gate enabled in response to activation of said special operation mode designating signal, for transferring an output signal of said oscillator, a third gate enabled in response to inactivation of said special operation mode designating signal, for transferring said external control signal, and a fourth gate receiving output signals of the second and third gates and responsive thereto for generating the internal row select designating signal.

11. The semiconductor memory device according to claim 10, wherein said oscillator includes an inhibition gate for stopping the oscillation in response to inactivation of said special operation mode designating signal.

12. A semiconductor memory device having a plurality of memory cells arranged in a matrix of rows and columns, comprising:

activation circuitry for generating an internal row select designating signal according to an external control signal when an applied special operation mode designating signal is active; and row related circuitry activated in response to activation of said row select designating signal, for carrying out an operation related at least to selection of a row of said plurality of memory cells;

wherein said activation circuitry comprises an oscillator for providing a signal for defining a refresh cycle at which data of said plurality of memory cells are refreshed, a cycle setting circuit coupled to said oscillator for setting an oscillation cycle of said oscillator, according to a cycle specifying signal, an activating circuit responsive to activation of both said special operation mode designating signal and external control signal for activating said oscillator, and a providing circuit for providing the internal row select designating signal, according to an output signal of said oscillator when said special operation mode designating signal is active.

13. The semiconductor memory device according to claim 12, wherein said activating circuit includes a selector receiving said external control signal and a refresh mode designating signal designating an operation mode for refreshing the data of the memory cells, for selecting said external control signal for application to said oscillator in response to activation of said special operation mode designating signal.

14. The semiconductor memory device according to claim 12, wherein said cycle setting circuit includes a decoder enabled in response to activation of said special operation mode designating signal, for decoding a predetermined external signal as said cycle specifying signal to generate the cycle designating signal in accordance with the result of decoding, and said oscillator includes a ring oscillator including a plurality of cascaded inverters, and gate circuitry for establishing the number of cascaded inverters of said ring oscillator in accordance with said cycle designating signal.

15. The semiconductor memory device according to claim 12, wherein said providing circuit comprises internal row selection activation circuit responsive to an output signal of said oscillator for activating the internal row select designating signal at predetermined counts of said output signal of said oscillator when said special operation mode designating signal is active.

* * * * *